US012622049B2

(12) United States Patent
Hwang et al.

(10) Patent No.: US 12,622,049 B2
(45) Date of Patent: May 5, 2026

(54) SEMICONDUCTOR DEVICE

(71) Applicant: Samsung Electronics Co., Ltd.,
Suwon-si (KR)

(72) Inventors: Kyu Man Hwang, Suwon-si (KR);
Sung Il Park, Suwon-si (KR); **Jin
Chan Yun, Suwon-si (KR); Dong Kyu
Lee**, Suwon-si (KR)

(73) Assignee: Samsung Electronics Co., Ltd.,
Suwon-Si (KR)

( * ) Notice: Subject to any disclaimer, the term of this
patent is extended or adjusted under 35
U.S.C. 154(b) by 370 days.

(21) Appl. No.: 18/298,678

(22) Filed: Apr. 11, 2023

(65) Prior Publication Data

US 2024/0096879 A1     Mar. 21, 2024

(30) Foreign Application Priority Data

Sep. 16, 2022     (KR) ........................ 10-2022-0117258

(51) Int. Cl.
| | |
|---|---|
| *H10D 84/83* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |

(Continued)

(52) U.S. Cl.
CPC ........... *H10D 84/83* (2025.01); *H10D 30/014*
(2025.01); *H10D 30/43* (2025.01); *H10D
30/6735* (2025.01); *H10D 30/6739* (2025.01);
*H10D 62/121* (2025.01); *H10D 64/017*

(2025.01); *H10D 84/0128* (2025.01); *H10D
84/013* (2025.01); *H10D 84/014* (2025.01);
*H10D 84/0151* (2025.01); *H10D 84/038*
(2025.01); *H10D 88/01* (2025.01)

(58) Field of Classification Search
CPC ...... H10D 84/83; H10D 30/014; H10D 30/43;
H10D 30/6735; H10D 30/6739; H10D
62/121; H10D 64/017; H10D 84/0128;
H10D 84/013; H10D 84/014; H10D
84/0151; H10D 84/038; H10D 88/01
See application file for complete search history.

(56) References Cited

U.S. PATENT DOCUMENTS

| | | | |
|---|---|---|---|
| 11,164,792 B2 | 11/2021 | Xie et al. | |
| 11,177,258 B2 | 11/2021 | Xie et al. | |

(Continued)

*Primary Examiner* — Jay C Kim
*Assistant Examiner* — Woo K Lee
(74) *Attorney, Agent, or Firm* — Fish & Richardson P.C.

(57) ABSTRACT

A semiconductor device is provided. The semiconductor
device includes an active pattern extending in a first hori-
zontal direction, a plurality of lower nanosheets stacked on
the active pattern and spaced apart from one another in a
vertical direction, a separation layer on the plurality of lower
nanosheets, a plurality of upper nanosheets stacked on the
separation layer and spaced apart from one another in the
vertical direction, a gate electrode extending on the active
pattern in a second horizontal direction, the gate electrode
surrounding each of the plurality of lower nanosheets, the
separation layer and the plurality of upper nano sheets, and
a first conductive layer between the gate electrode and each
of a top surface and a bottom surface of the plurality of upper
nanosheets. The first conductive layer is not between the
gate electrode and sidewalls of the plurality of upper
nanosheets.

20 Claims, 53 Drawing Sheets

(51) Int. Cl.
  *H10D 84/03*       (2025.01)
  *H10D 88/00*       (2025.01)

(56)          References Cited

U.S. PATENT DOCUMENTS

2021/0320035  A1    10/2021  Xie et al.
2021/0408257  A1    12/2021  Thomas et al.
2022/0013652  A1     1/2022  Yang et al.
2022/0044973  A1     2/2022  Cheng et al.
2022/0093593  A1     3/2022  Yang
2022/0102362  A1     3/2022  Chanemougame et al.
2022/0108981  A1     4/2022  Hwang et al.

GT
DNW
USD
40
UNW
110
BSD
BNW
101
100

DNW

UNW
122

131
110

40

50

60

BNW

101

105

100

B                                                    B'

DR3
DR1
DR2

122 — 121 — 140 — 131 — 140 —

GT — DNW — USD — 40 — UNW — 110 — BSD — BNW — 101 — 100

A A'

DR3
↑
⊗ → DR1
DR2

DNW

70

UNW
122

131
110

40

BNW

101

105

100

B                    B'

DR3
DR2
DR1

DNW

70

UNW
122

131
110
40

BNW

V 160
150
123
CB
122
G
121
140
DNW

732
USD
131
733
UNW 140
110

BSD

BNW 101
100

V 160
150
123 — CB
R5
DNW
122 — G
733
131 — UNW
732
110
BNW
101
105
100

UNW

110

BNW

101

105

100

B                                              B'

DR3

DR1    DR2

SEMICONDUCTOR DEVICE

CROSS-REFERENCE TO RELATED APPLICATION

This application claims priority from Korean Patent Application No. 10-2022-0117258 filed on Sep. 16, 2022 in the Korean Intellectual Property Office, and all the benefits accruing therefrom under 35 U.S.C. 119, the contents of which in its entirety are herein incorporated by reference.

BACKGROUND

1.

Various example embodiments relate to a semiconductor device, and particularly, to a semiconductor device including a Multi-Bridge Channel Field Effect Transistor (MBCFET™).

2.

As a scaling technique for increasing the density of an integrated circuit (IC) device, a multi-gate transistor has been suggested in which a fin- or nanowire-type silicon body is formed on a substrate and a gate is formed on the surface of the silicon body.

Since the multi-gate transistor uses a three-dimensional (3D) channel, scaling may be facilitated or more easily managed. Alternatively or additionally, current control capability may be improved without increasing the length of the gate of the multi-gate transistor. Alternatively or additionally, a short channel effect (SCE), i.e., the phenomenon of the potential of a channel region being affected by a drain voltage, may be improved, e.g. may be reduced or effectively suppressed.

SUMMARY

Various example embodiments provide a device capable of controlling a threshold voltage in various manners by having or forming conductive films on the surface of a plurality of upper nanosheets, but not on the surface of a plurality of lower nanosheets, in a structure where the plurality of upper nano sheets are stacked on the plurality of lower nano sheets.

However, features of example are not restricted to those set forth herein. The above and other aspects will become more apparent to one of ordinary skill in the art to which example embodiments pertains by referencing the detailed description of the present disclosure given below.

According to various example embodiments, there is provided a semiconductor device, comprising an active pattern on a substrate and extending in a first horizontal direction, a plurality of lower nanosheets stacked on the active pattern to be spaced apart from one another in a vertical direction, a separation layer on the plurality of lower nanosheets, a plurality of upper nanosheets stacked on the separation layer to be spaced apart from one another in the vertical direction, a gate electrode extending on the active pattern in a second horizontal direction, which is different from the first horizontal direction. The gate electrode surrounds each of the plurality of lower nanosheets, the separation layer, and the plurality of upper nanosheets. The semiconductor device further comprises a first conductive layer between the gate electrode and each of a top surface and a bottom surface of the plurality of upper nanosheets, and the first conductive layer is not disposed between the gate electrode and sidewalls, in the second horizontal direction, of the plurality of upper nanosheets.

According to various example embodiments, there is provided a semiconductor device, comprising an active pattern extending in a first horizontal direction on a substrate, a plurality of lower nanosheets stacked on the active pattern to be spaced apart from one another in a vertical direction, a separation layer on the plurality of lower nanosheets, a plurality of upper nanosheets stacked on the separation layer to be spaced apart from one another in the vertical direction, and a dummy nanosheet spaced apart from the plurality of upper nanosheets in the vertical direction. The dummy nanosheet includes an insulating material, a gate electrode extending on the active pattern in a second horizontal direction, which is different from the first horizontal direction, and the gate electrode surrounds each of the plurality of lower nanosheets, the separation layer, the plurality of upper nanosheets, and the dummy nanosheet. The semiconductor device comprises a first conductive layer between the gate electrode and each of a top surface and a bottom surface of the plurality of upper nanosheets, the first conductive layer is not disposed between the gate electrode and the plurality of lower nanosheets.

According to various example embodiments, there is provided a semiconductor device, comprising an active pattern extending in a first horizontal direction on a substrate, a plurality of lower nanosheets stacked on the active pattern to be spaced apart from one another in a vertical direction, a separation layer on the plurality of lower nanosheets, a plurality of upper nanosheets stacked on the separation layer to be spaced apart from one another in the vertical direction, and a dummy nanosheet spaced apart from the plurality of upper nanosheets in the vertical direction. The dummy nanosheet includes an insulating material, a gate insulating layer along surfaces of the plurality of lower nanosheets, the separation layer, the plurality of upper nanosheets and the dummy nanosheet, a gate electrode extending on the active pattern in a second horizontal direction, which is different from the first horizontal direction, and the gate electrode surrounds the plurality of lower nanosheets, the separation layer, the plurality of upper nanosheets and the dummy nanosheet. The semiconductor device further includes a conductive layer disposed between the gate electrode and the gate insulating layer, wherein the conductive layer is between the gate electrode and a top surface of the separation layer, between the gate electrode and each of a top surface and a bottom surface of the plurality of upper nanosheets, and between the gate electrode and a bottom surface of the dummy nanosheet. The conductive layer is not between the gate electrode and sidewalls, in the second horizontal direction, of the separation layer, not between the gate electrode and sidewalls, in the second horizontal direction, of the plurality of upper nanosheets, not between the gate electrode and each of a top surface and sidewalls, in the second direction, of the dummy nanosheet, not between the gate electrode and a bottom surface of the separation layer, and not between the gate electrode and the plurality of lower nanosheets. A width, in the second horizontal direction, of the conductive layer is less than a width, in the second horizontal direction, of the plurality of upper nanosheets.

It should be noted that the effects are not limited to those described above, and other effects will be apparent from the following description.

BRIEF DESCRIPTION OF THE DRAWINGS

The above and other aspects and features of the present disclosure will become more apparent by describing in detail some example embodiments thereof with reference to the attached drawings, in which:

FIGS. 5 through 35 are cross-sectional views illustrating intermediate steps of a method of fabricating a semiconductor device according to various example embodiments;

FIGS. 36 and 37 are cross-sectional views of a semiconductor device according to various example embodiments;

FIGS. 38 and 39 are cross-sectional views of a semiconductor device according to various example embodiments;

FIGS. 40 and 41 are cross-sectional views of a semiconductor device according to various example embodiments;

FIGS. 49 and 50 are cross-sectional views of a semiconductor device according to various example embodiments;

FIGS. 52 and 53 are cross-sectional views of a semiconductor device according to various example embodiments.

DETAILED DESCRIPTION

A semiconductor device according to various example embodiments will hereinafter be described with reference to FIGS. 1 through 4.

Figure 1:
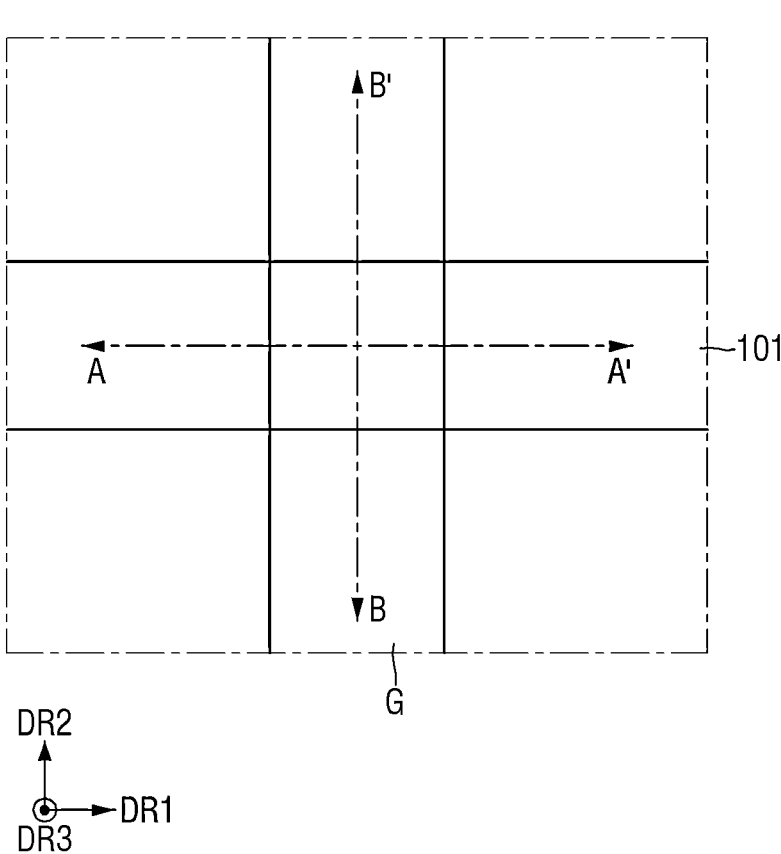
FIG. 1 is a layout view of a semiconductor device according to various example embodiments.
Figure 2:
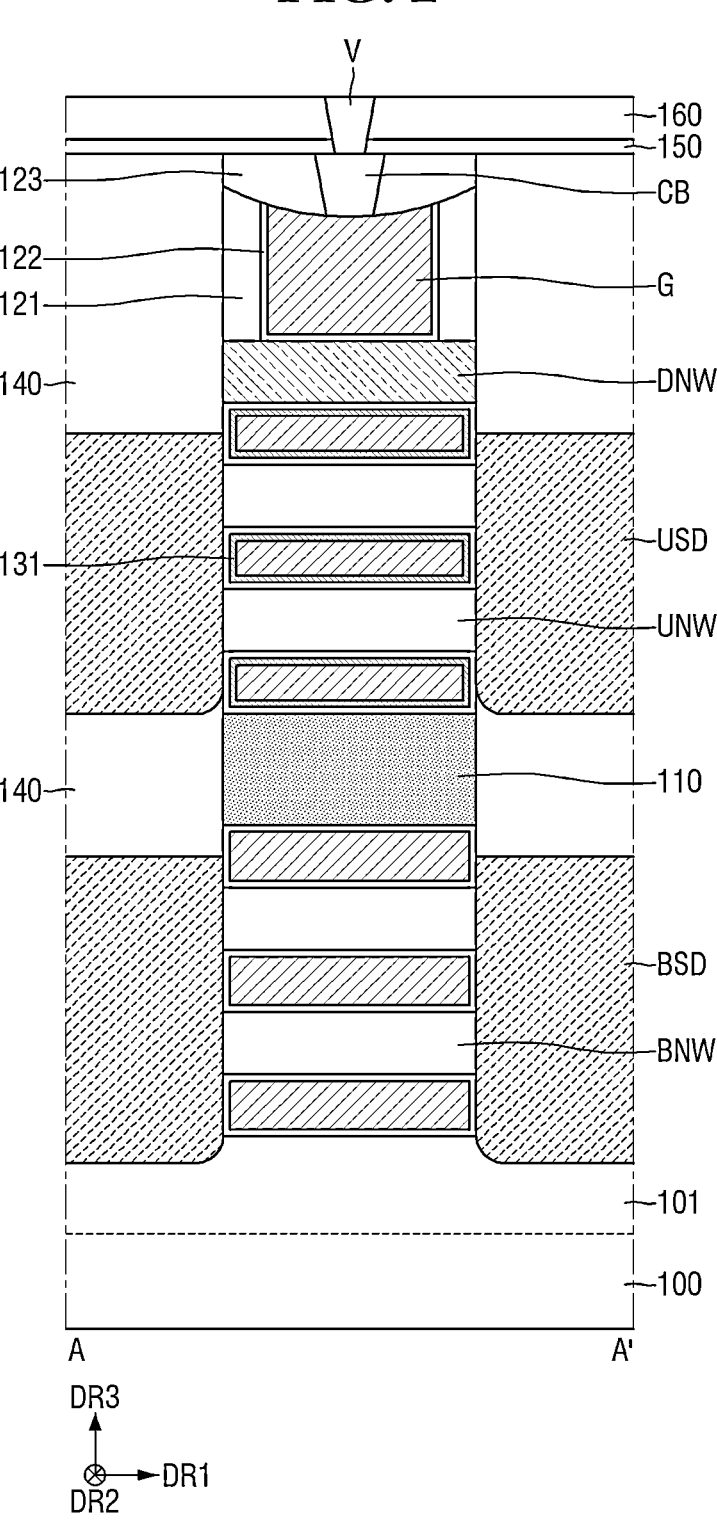
FIG. 2 is a cross-sectional view taken along line A-A' of FIG. 1.
Figure 3:
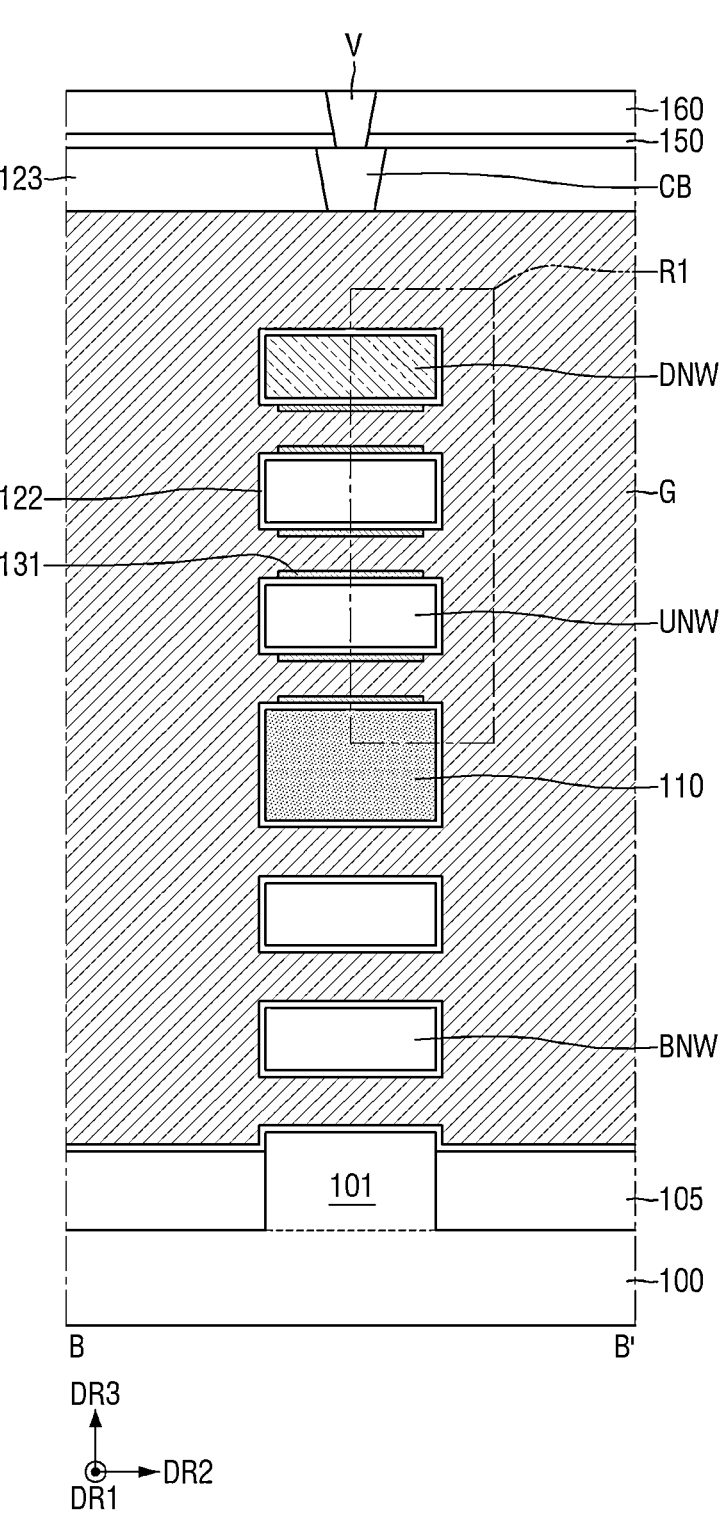
FIG. 3 is a cross-sectional view taken along line B-B' of FIG. 1.
Figure 4:
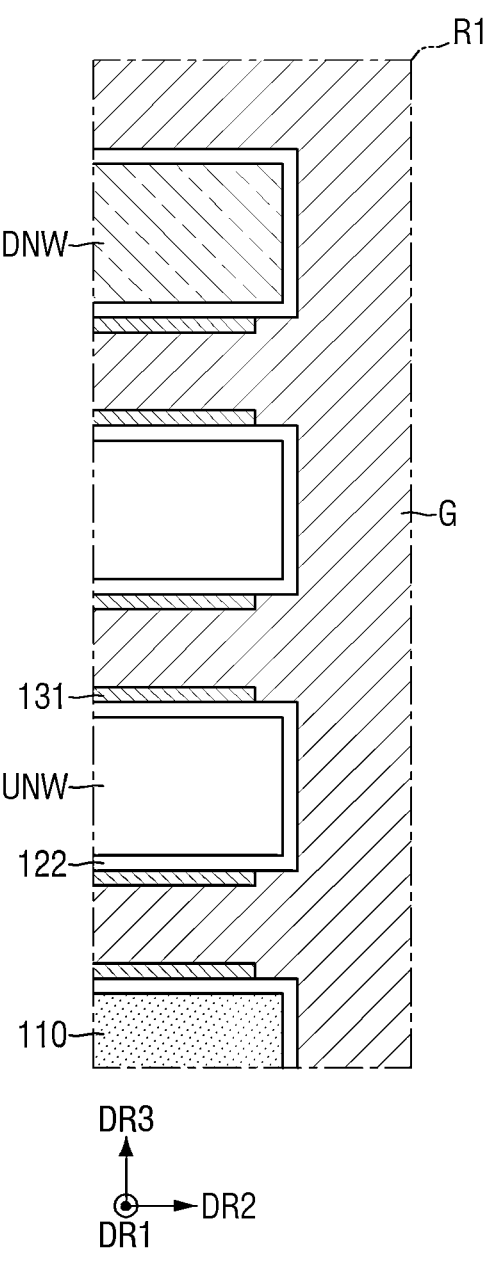
FIG. 4 is an enlarged cross-sectional view of a region R1 of FIG. 3.

FIG. 1 is a layout view of a semiconductor device according to various example embodiments. FIG. 2 is a cross-sectional view taken along line A-A' of FIG. 1. FIG. 3 is a cross-sectional view taken along line B-B' of FIG. 1. FIG. 4 is an enlarged cross-sectional view of a region R1 of FIG. 3.

Referring to FIGS. 1 through 4, the semiconductor device may include a substrate 100, an active pattern 101, a field insulating layer 105, a plurality of lower nanosheets BNW, a separation layer 110, a plurality of upper nanosheets UNW, dummy nanosheets DNW, a gate electrode G, gate spacers 121, a gate insulating layer 122, a capping pattern 123, a first conductive layer 131, lower source/drain regions BSD, upper source/drain regions USD, a first interlayer insulating layer 140, a gate contact CB, an etch stopper layer 150, a second interlayer insulating layer 160, and a via V.

The substrate 100 may be or may include a silicon (Si) substrate or a silicon-on-insulator (all) substrate. Alternatively or additionally, the substrate 100 may include silicon-germanium (SiGe), silicon-germanium-on insulator (SGOI), indium antimonide, lead tellurium compound, indium arsenide, indium phosphide, gallium arsenide, or gallium antimonide, but example embodiments are not limited thereto. The substrate 100 may be doped, e.g. lightly doped, or may be undoped.

First and second horizontal directions DR1 and DR2 may be defined as directions parallel to the top surface of the substrate 100. The second horizontal direction DR2 may be defined as a different direction from the first horizontal direction DR1, e.g. a direction perpendicular to the first horizontal direction DR1. A vertical direction DR3 may be defined as a direction perpendicular to the first and second horizontal directions DR1 and DR2.

The active pattern 101 may protrude from the substrate 100 in the vertical direction DR3. The active pattern 101 may extend in the first horizontal direction DR1 on the substrate 100. The active pattern 101 may be part of the substrate 100 and may include an epitaxial layer, e.g. a layer grown from the substrate 100.

The field insulating layer 105 may be disposed on the substrate 100. The field insulating layer 105 may surround the sidewalls of the active pattern 101. For example, the top surface of the active pattern 101 may protrude beyond the top surface of the field insulating layer 105 in the vertical direction DR3, but example embodiments are not limited thereto. Alternatively, in some example embodiments, the top surface of the active pattern 101 may be coplanar with, e.g. may be formed on the same plane as the top surface of the field insulating layer 105. The field insulating layer 105 may include, for example, an oxide film, a nitride film, an oxynitride film, or a combination thereof.

The plurality of lower nanosheets BNW may be disposed on the active pattern 101. The plurality of lower nanosheets BNW may be spaced apart from the active pattern 101 in the vertical direction DR3. The plurality of lower nanosheets BNW may include a plurality of nanosheets that are stacked on the active pattern 101 to be spaced apart from one another in the vertical direction DR3. The plurality of lower nanosheets BNW may be disposed at the intersection between the active pattern 101 and the gate electrode G FIGS. 2 and 3 illustrate that the plurality of lower nanosheets BNW include two nanosheets that are stacked in the vertical direction DR3, but example embodiments are not limited thereto. Alternatively, in some example embodiments, the plurality of lower nanosheets BNW may include three or more nanosheets that are stacked in the vertical direction DR3. A spacing, e.g. a vertical spacing, of neighboring ones of each of the plurality of lower nanosheets BNW may be the same as others of neighboring ones of each of the plurality of lower nanosheets BNW, or may be different from one another. All or at least one of the plurality of lower nanosheets BNW may include, for example, Si, but example embodiments are not limited thereto. Alternatively or additionally, in some example embodiments, all or at least one of the plurality of lower nanosheets BNW may include SiGe.

The separation layer 110 may be disposed on the plurality of lower nanosheets BNW. In some example embodiments, the separation layer 110 may be disposed on the uppermost lower nanosheet BNW. For example, the separation layer 110 may be spaced apart from the uppermost lower nanosheet BNW in the vertical direction DR3, but example embodiments are not limited thereto. Alternatively or additionally, in some example embodiments, the separation layer 110 may be in contact with the upper lower nanosheet BNW.

For example, both sidewalls, in the second horizontal direction DR2, of the separation layer 110 may be aligned with both sidewalls, in the second horizontal direction DR2, of each of the plurality of lower nanosheets BNW in the vertical direction DR3, but example embodiments are not limited thereto. The separation layer 110 may include at least one of, for example, silicon nitride (SiN), silicon oxycarbonitride (SiOCN), silicon boron carbonitride (SiBCN), silicon carbonitride (SiCN), silicon oxynitride (SiON), and a combination thereof, but example embodiments are not limited thereto.

The plurality of upper nanosheets UNW may be disposed on the separation layer 110. For example, the plurality of upper nanosheets UNW may be spaced apart from the separation layer 110 in the vertical direction DR3, but example embodiments are not limited thereto. Alternatively, in some example embodiments, the lowermost upper nanosheet UNW may be in contact with the separation layer 110. The plurality of upper nanosheets UNW may include a plurality of nanosheets that are stacked to be spaced apart from one another in the vertical direction DR3, on the separation layer 110. The plurality of upper nanosheets UNW may be disposed at the intersection between the active pattern 101 and the gate electrode G. A number of the plurality of upper nansheets UNW may be the same, or may be different, than a number of the plurality of lower nanosheets BNW. A thickness, e.g. a thickness in the vertical direction D3, of each of the plurality of upper nanosheets UNW may be the same as each other, or at least one thickness of at least one of the plurality of upper nanosheets UNW may be different than at least one other of the plurality of upper nanosheets UNW. A thickness of each of the plurality of upper nanosheets UNW may be the same, or different, than a thickness of each of the plurality of lower nanosheets BNW.

FIGS. 2 and 3 illustrate that the plurality of upper nanosheets UNW include two nanosheets that are stacked in the vertical direction DR3, but example embodiments are not limited thereto. Alternatively or additionally, in some example embodiments, the plurality of upper nanosheets UNW may include three or more nanosheets that are stacked in the vertical direction DR3. The plurality of upper nanosheets UNW may include, for example, Si, but example embodiments are not limited thereto. Alternatively or additionally, in some example embodiments, the plurality of upper nanosheets UNW may include SiGe.

The dummy nanosheets DNW may be disposed on the plurality of upper nanosheets UNW. In some example embodiments, the dummy nanosheets DNW may be disposed on the uppermost upper nanosheet UNW. For example, the dummy nanosheets DNW may be spaced apart from the uppermost upper nanosheet UNW in the vertical direction DR3.

For example, both sidewalls, in the second horizontal direction DR2, of each of the dummy nanosheets DNW may be aligned with or flush with both sidewalls, in the second horizontal direction DR2, of each of the plurality of upper nanosheets UNW, but example embodiments are not limited thereto. The dummy nanosheets DNW may include an insulating material. The dummy nanosheets DNW may include at least one of, for example, SiN, SiOCN, SiBCN, SiCN, SiON, and a combination thereof, but example embodiments are not limited thereto. The dummy nanosheets DNW may not be electrically active during operation of the semiconductor device, e.g. may be floating or disconnected during operation of the semiconductor device, and may not be used to send or receive electrical signals during operation of the semiconductor device.

The gate electrode G may extend in the second horizontal direction DR2 on the active pattern 101 and on the field insulating layer 105. The gate electrode G may surround each of the plurality of lower nanosheets BNW, the separation layer 110, each of the plurality of upper nanosheets UNW, and each of the nanosheets DNW.

The gate electrode G may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), Al, copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

The gate spacers 121 may extend in the second horizontal direction DR2 along both sidewalls, as measured in the horizontal direction DR1, of the gate electrode G, on the dummy nanosheets DNW and the field insulating layer 105. The gate spacers 121 may include at least one of, for example, SiN, SiON, SiCN, SiOCN, silicon boron nitride (SiBN), silicon oxyboron nitride (SiOBN), and silicon oxycarbide (SiOC), and a combination thereof, but example embodiments are not limited thereto.

The lower source/drain regions BSD may be disposed on at least one side of the gate electrode G, on the active pattern 101. For example, the lower source/drain regions BSD may be disposed on both sides of the gate electrode G, on the active pattern 101. The lower source/drain regions BSD may be disposed on both sidewalls, in the first horizontal direction DR1, of each of the plurality of lower nanosheets BNW. The lower source/drain regions BSD may be in contact with both sidewalls, in the first horizontal direction DR1, of each of the plurality of lower nano sheets BNW.

For example, the top surface of the lower source/drain regions BSD may be formed to be higher than the top surface of the uppermost lower nano sheet BNW. For example, the top surface of the lower source/drain regions BSD may be formed to be lower than the bottom surface of the separation layer 110, but example embodiments are not limited thereto. Alternatively, in some example embodiments, the top surface of the lower source/drain regions BSD may be formed to be higher than the bottom surface of the separation layer 110.

The upper source/drain regions USD may be disposed on at least one side of the gate electrode G, on the lower source/drain regions BSD. For example, the upper source/drain regions USD may be disposed on both sides of the gate electrode G, on the lower source/drain regions BSD. The upper source/drain regions USD may be spaced apart from the lower source/drain regions BSD in the vertical direction DR3. The upper source/drain regions USD may be disposed on both sidewalls, in the first horizontal direction DR1, of each of the plurality of upper nanosheets UNW. The upper source/drain regions USD may be in contact with both sidewalls, as measured in the first horizontal direction DR1, of each of the plurality of upper nanosheets UNW. The upper source/drain regions USD may include the same, or different, impurities as impurities included in the lower source/drain regions BSD, at the same, or different, concentrations as that of the lower source/drain regions.

In some example embodiments, the top surface of the upper source/drain regions USD may be formed to be higher than the top surface of the uppermost upper nanosheet UNW. For example, the top surface of the upper source/drain regions USD may be formed to be lower than the bottom surface of the dummy nanosheets DNW, but example embodiments are not limited thereto. Alternatively, in some example embodiments, the top surface of the upper source/drain regions USD may be formed to be higher than the bottom surface of the dummy nanosheets DNW. For example, the bottom surface of the upper source/drain regions USD may be formed to be lower than the bottom surface of the lowermost upper nanosheet UNW.

The gate insulating layer 122 may be disposed along the surfaces of the plurality of lower nanosheets BNW, the separation layer 110, the plurality of upper nanosheets UNW, and the dummy nanosheets DNW. For example, the gate insulating layer 122 may be disposed between the gate electrode G, the plurality of lower nanosheets BNW, the separation layer 110, the plurality of upper nanosheets UNW, and the dummy nanosheets DNW. The gate insulating layer 122 may be disposed between the active pattern 101 and the gate electrode G. The gate insulating layer 122 may be disposed between the field insulating layer 105 and the gate electrode G. The gate insulating layer 122 may be disposed between the gate electrode G, the lower source/drain regions BSD, and the upper source/drain regions USD. The gate insulating layer 122 may be disposed between the gate electrode G and the gate spacers 121.

For example, a gate insulating layer 122 formed along or arranged along the surfaces of the plurality of lower nanosheets BNW may be in contact with the gate electrode G. For example, a gate insulating layer 122 disposed on the bottom surface of the separation layer 110 and on both sidewalls, in the second horizontal direction DR2, of the separation layer 110 may be in contact with the gate electrode G. For example, the gate insulating layer 122 may be in contact with the lower source/drain regions BSD and the upper source/drain regions USD, but example embodiments are not limited thereto. Alternatively or additionally, in some example embodiments, inner spacers may be further disposed between the gate insulating layer 122 and the lower source/drain regions BSD and/or between the gate insulating layer 122 and the upper source/drain regions USD.

The gate insulating layer 122 may include at least one of silicon oxide, silicon oxynitride, silicon nitride, and a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device may or may not include negative capacitance (NC) FETs using negative capacitors. For example, the gate insulating layer 122 may include ferroelectric material films having ferroelectric properties and paraelectric material films having paraelectric properties.

The ferroelectric material films may have a negative capacitance, and the paraelectric material films may have a positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having a negative capacitance and the paraelectric material films having a positive capacitance are connected in series, the total capacitance of the ferroelectric material films and the paraelectric material films may increase. Accordingly, transistors having the ferroelectric material films may have a sub-threshold swing (SS) of less than 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material films.

If the ferroelectric material films include hafnium oxide, the dopant of the ferroelectric material films may include, for example, at least one of Gd, Si, Zr, Al, and Y.

If the dopant of the ferroelectric material films is Al, the ferroelectric material films may include 3 atomic % (at %) to 8 at % of Al. Here, the ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include 2 at % to 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may include, for example, at least one of silicon oxide and a high-k metal oxide. The high-k metal oxide may include, for example, at least one of hafnium oxide, zirconium oxide, and aluminum oxide, but example embodiments are not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, 0.5 nm to 10 nm, but example embodiments are not limited thereto. A critical thickness that may exhibit ferroelectric properties may vary depending on the type of ferroelectric material, and thus, the thickness of the ferroelectric material films may vary depending on the type of ferroelectric material included in the ferroelectric material films.

For example, each of the gate insulating layer 122 may include one ferroelectric material film. Alternatively or additionally, each of the gate insulating layer 122 may include a plurality of ferroelectric material films that are spaced apart from one another. Each of or at least one of the gate insulating layer 122 may have a structure in which a plurality of ferroelectric material films and a plurality of paraelectric material films are alternately stacked.

The first conductive layer 131 may be disposed between the top surface of the separation layer 110 and the gate electrode G. The first conductive layer 131 may be disposed between the gate electrode G and the top surface and the bottom surface of the plurality of upper nanosheets UNW. The first conductive layer 131 may be disposed between gate electrode G and the bottom surface of the dummy nanosheets DNW. The first conductive layer 131 may be disposed on the gate insulating layer 122 formed on the top surface of the separation layer 110, the top surface and the bottom surface of the plurality of upper nanosheets UNW, and the bottom surface of the dummy nanosheets DNW. For example, the first conductive layer 131 may be in contact with the gate insulating layer 122 formed on the top surface of the separation layer 110, the top surface and the bottom surface of the plurality of upper nanosheets UNW, and the bottom surface of the dummy nanosheets DNW.

The first conductive layer 131 may not be disposed between the gate electrode G and sidewalls, e.g. both sidewalls, in the second horizontal direction DR2, of each of the plurality of upper nanosheets UNW. Alternatively or additionally, the first conductive layer 131 may not be disposed between the gate electrode G and the top surface and both sidewalls, in the second horizontal direction DR2, of each of the dummy nanosheets DNW. Alternatively or additionally, the first conductive layer 131 may not be disposed between the gate electrode G and the gate spacers 121. Alternatively or additionally, the first conductive layer 131 may not be disposed between the gate electrode G and the bottom surface and both sidewalls, in the second horizontal direction DR2, of the separation layer 110. Alternatively or additionally, the first conductive layer 131 may not be disposed between the gate electrode G and the plurality of lower nanosheets BNW. The first conductive layer 131 may not be disposed between the field insulating layer 105 and the gate electrode G.

The width, in the second horizontal direction DR2, of the first conductive layer 131 may be less than the width, in the second horizontal direction DR2, of any or each of the plurality of upper nanosheets UNW. For example, both sidewalls, in the second horizontal direction DR2, of each of the first conductive layer 131 may be recessed from both sidewalls, in the second horizontal direction DR2, of each of the plurality of upper nanosheets UNW into the center of each of the plurality of upper nanosheets UNW. For example, the gate insulating layer 122 may be in contact with the gate electrode G, on both sidewalls, in the second horizontal direction DR2, of each of the first conductive layer 131.

The first conductive layer 131 may act or function as a work function layer. The first conductive layer 131 may include at least one of, for example, lanthanum oxide (LaO), aluminum oxide ($Al_2O_3$), and zirconium oxide (ZrO). Alternatively or additionally, the first conductive layer 131 may include at least one of, for example, TiN, titanium oxynitride (TiON), TiAlN, TiAlC, and W.

The capping pattern 123 may extend in the second horizontal direction DR2 on the gate electrode G. For example, the capping pattern 123 may extend in the second horizontal direction DR2 on the uppermost surface of the gate spacers 121, the gate insulating layer 122, and the gate electrode G, but example embodiments are not limited thereto. Alternatively or additionally, in some example embodiments, the capping pattern 123 may be disposed between the gate spacers 121. In this case, the top surface of the capping pattern 123 may be formed on the same plane as the uppermost surface of the gate spacers 121. The capping pattern 123 may include at least one of, for example, SiN, SiON, $SiO_2$, SiCN, SiOCN, and a combination thereof.

The first interlayer insulating layer 140 may cover the lower source/drain regions BSD and the upper source/drain regions USD, on the active pattern 101 and the field insulating layer 105. For example, the first interlayer insulating layer 140 may be disposed between the lower source/drain regions BSD and the upper source/drain regions USD. The first interlayer insulating layer 140 may surround the sidewalls of each of the gate spacers 121 and the sidewalls of the capping pattern 123.

For example, the first interlayer insulating layer 140 may be in contact with both sidewalls, in the first horizontal direction DR1, of the separation layer 110. The first interlayer insulating layer 140 may be in contact with both sidewalls, in the first horizontal direction DR1, of each of the dummy nanosheets DNW. For example, the top surface of the first interlayer insulating layer 140 may be formed on the same plane as the top surface of the capping pattern 123, but example embodiments are not limited thereto. Alternatively, in some example embodiments, the first interlayer insulating layer 140 may cover the top surface of the capping pattern 123.

The first interlayer insulating layer 140 may include at least one of, for example, silicon oxide, silicon nitride, silicon oxynitride, and a low-k material. The low-k material may include, for example, fluorinated tetraethyl orthosilicate (FTEOS), hydrogen silsesquioxane (HSQ), bis-benzocyclootene (BCB), tetramethyl orthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoam (such as polypropylene oxide), carbon doped silicon oxide (CDO), organosilicate glass (OSG), SILK, amorphous fluorinated carbon, silica aerogel, silica xerogel, mesoporous silica, and a combination thereof, but example embodiments are not limited thereto.

The gate contact CB may be connected to the gate electrode G, e.g. by penetrating the capping pattern 123 in the vertical direction DR3. For example, the top surface of the gate contact CB may be formed on the same plane as the top surface of the first interlayer insulating layer 140 and the capping pattern 123, but example embodiments are not limited thereto. FIGS. 2 and 3 illustrate that the gate contact CB is formed as a single-layer film, but example embodiments are not limited thereto. Alternatively, the gate contact CB may be formed as a multilayer film. The gate contact CB may include a conductive material such as aluminum (Al), copper (Cu), tungsten (W) and cobalt (Co).

The etch stopper layer 150 may be disposed on the top surface of the first interlayer insulating layer 140 and the capping pattern 123. The etch stopper layer 150 may be conformally formed. FIGS. 2 and 3 illustrate that the etch stopper layer 150 is formed as a single-layer film, but example embodiments are not limited thereto. Alternatively, the etch stopper layer 150 may be formed as a multilayer film. The etch stopper layer 150 may include at least one of, for example, aluminum oxide, aluminum nitride, hafnium oxide, zirconium oxide, silicon oxide, silicon nitride, silicon oxynitride, and a low-k material.

The second interlayer insulating layer 160 may be disposed on the etch stopper layer 150. The second interlayer insulating layer 160 may include at least one of, for example, silicon oxide, silicon nitride, silicon oxynitride, and a low-k material. The via V may penetrate the second interlayer insulating layer 160 and the etch stopper layer 150 in the vertical direction DR3 and may thus be connected to the gate contact CB. FIGS. 2 and 3 illustrate that the via V is formed as a single-layer film, but example embodiments are not limited thereto. Alternatively, the via V may be formed as a multilayer film. The via V may include a conductive material.

In a structure where the plurality of upper nanosheets UNW are stacked on the plurality of lower nanosheets BNW, a threshold voltage of various transistors included in the semiconductor device may be controlled in various manners by forming the conductive layer 131, which are disposed on the surfaces of the plurality of upper nanosheets UNW, so as not to be disposed on the surfaces of the plurality of lower nanosheets BNW. For example, a threshold voltage of various transistors included in the semiconductor device may be determined and varied by inclusion of the conductive layer 131. For example, two different transistors included in the semiconductor device may be structurally the same except for the conducive layer 131, which may lead to a different threshold voltage of the two different transistors.

A method of fabricating a semiconductor device according to various example embodiments will hereinafter be described with reference to FIGS. 2 through 35.

FIGS. 5 through 35 are cross-sectional views illustrating intermediate steps of a method of fabricating a semiconductor device according to various example embodiments.

Figure 5:
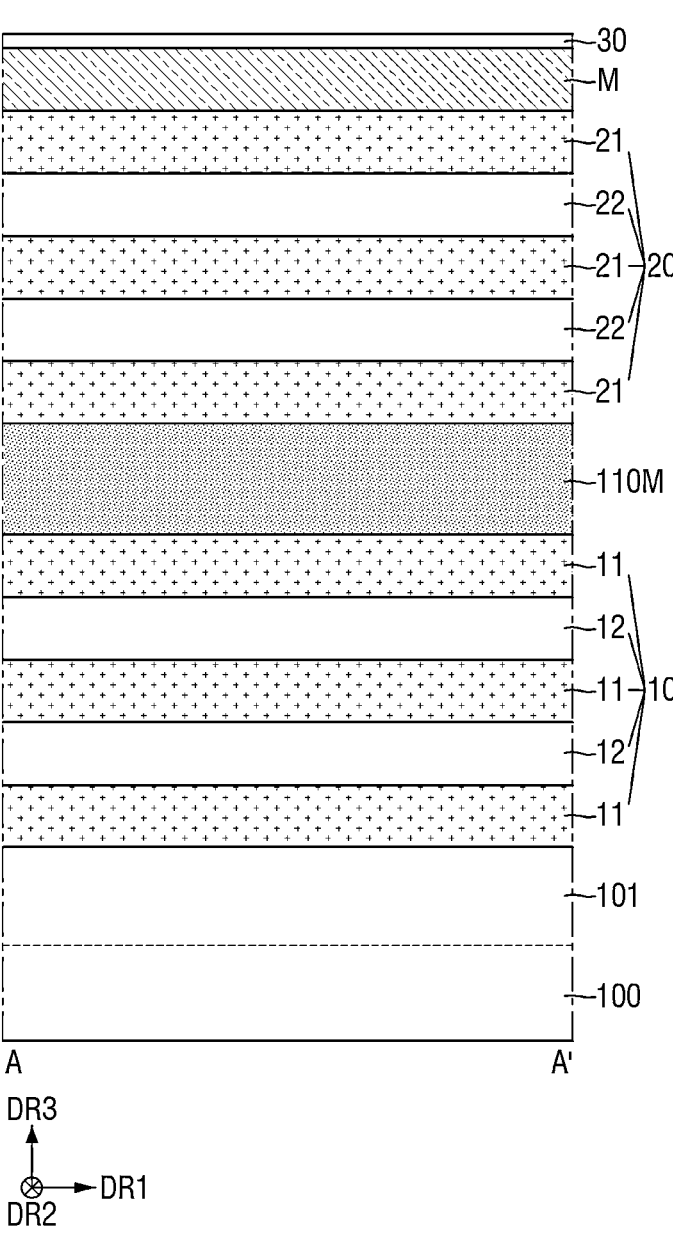
Figure 6:
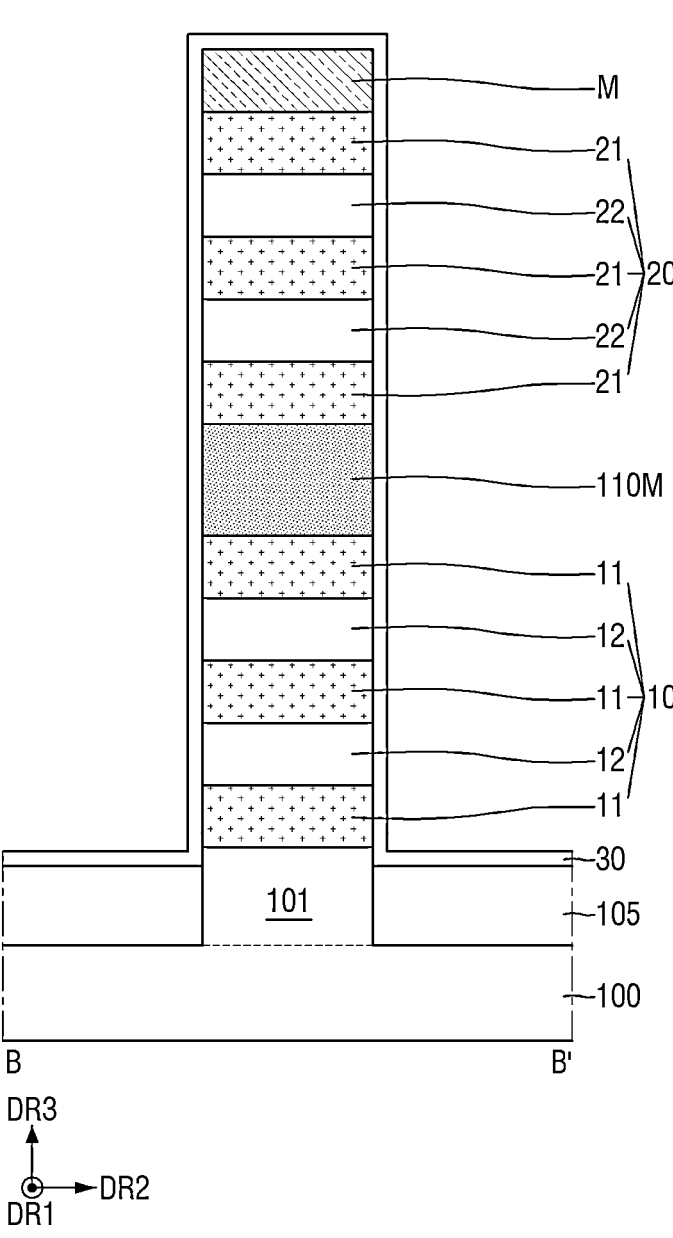

Referring to FIGS. 5 and 6, a first stack structure 10, a separation material layer 110M, and a second stack structure 20 may be sequentially stacked on a substrate 100, e.g. formed with a process such as one or more of an atomic layer deposition (ALD) process or a chemical vapor deposition (CVD) process.

For example, the first stack structure 10 may be formed on the substrate 100. The first stack structure 10 may include first semiconductor layers 11 and second semiconductor layers 12, which are alternately stacked on the substrate 100. For example, the first semiconductor layers 11 may be formed at the lowermost and uppermost parts of the first stack structure 10, but example embodiments are not limited thereto. Alternatively, in some example embodiments, the second semiconductor layers 12 may be formed at the uppermost parts of the first stack structure 10. The first semiconductor layers 11 may include, for example, SiGe such as poly or single-crystal SiGe, and may be doped or undoped. The second semiconductor layers 12 may include, for example, Si such as poly or single-crystal Si, and may be doped or undoped.

Thereafter, the separation material layer 110M may be formed on the first stack structure 10. The separation material layer 110M may include an insulating material. The separation material layer 110M may include at least one of, for example, SiN, SiOCN, SiBCN, SiCN, SiON, and a combination thereof.

Thereafter, the second stack structure 20 may be formed on the separation material layer 110M. The second stack structure 20 may include third semiconductor layers 21 and fourth semiconductor layers 22, which are alternately stacked on the separation material layer 110M. For example, the third semiconductor layers 21 may be formed at the lowermost and uppermost parts of the second stack structure 20, but example embodiments are not limited thereto. Alternatively, in some example embodiments, the fourth semiconductor layers 22 may be formed at the uppermost parts of the second stack structure 20. The third semiconductor layers 21 may include, for example, SiGe such as poly or single-crystal SiGe, and may be doped or undoped. The fourth semiconductor layers 22 may include, for example, Si such as poly or single-crystal, and may be doped or undoped.

Thereafter, the mask pattern M may be formed on the second stack structure 20. The mask pattern M may include at least one of, for example, SiN, SiOCN, SiBCN, SiCN, SiON, and a combination thereof, but example embodiments are not limited thereto. Thereafter, parts of the second stack structure 20, the separation material layer 110M, the first stack structure 10, and the substrate 100 may be etched using the mask pattern M as a mask. As a result, an active pattern 101 may be defined on the substrate 100.

Thereafter, a field insulating layer 105 may be formed on the substrate 100 to surround the sidewalls of the active pattern 101, e.g. with a process such as a shallow-trench isolation (ST) process. Thereafter, a pad oxide layer 30 may be formed to cover the field insulating layer 105, the active pattern 101, the first stack structure 10, the separation material layer 110M, the second stack structure 20, and the mask pattern M. For example, the pad oxide layer 30 may be conformally formed e.g. with a process such as a thermal oxidation process and/or a CVD process. The pad oxide layer 30 may include, for example, $SiO_2$.

Figure 7:
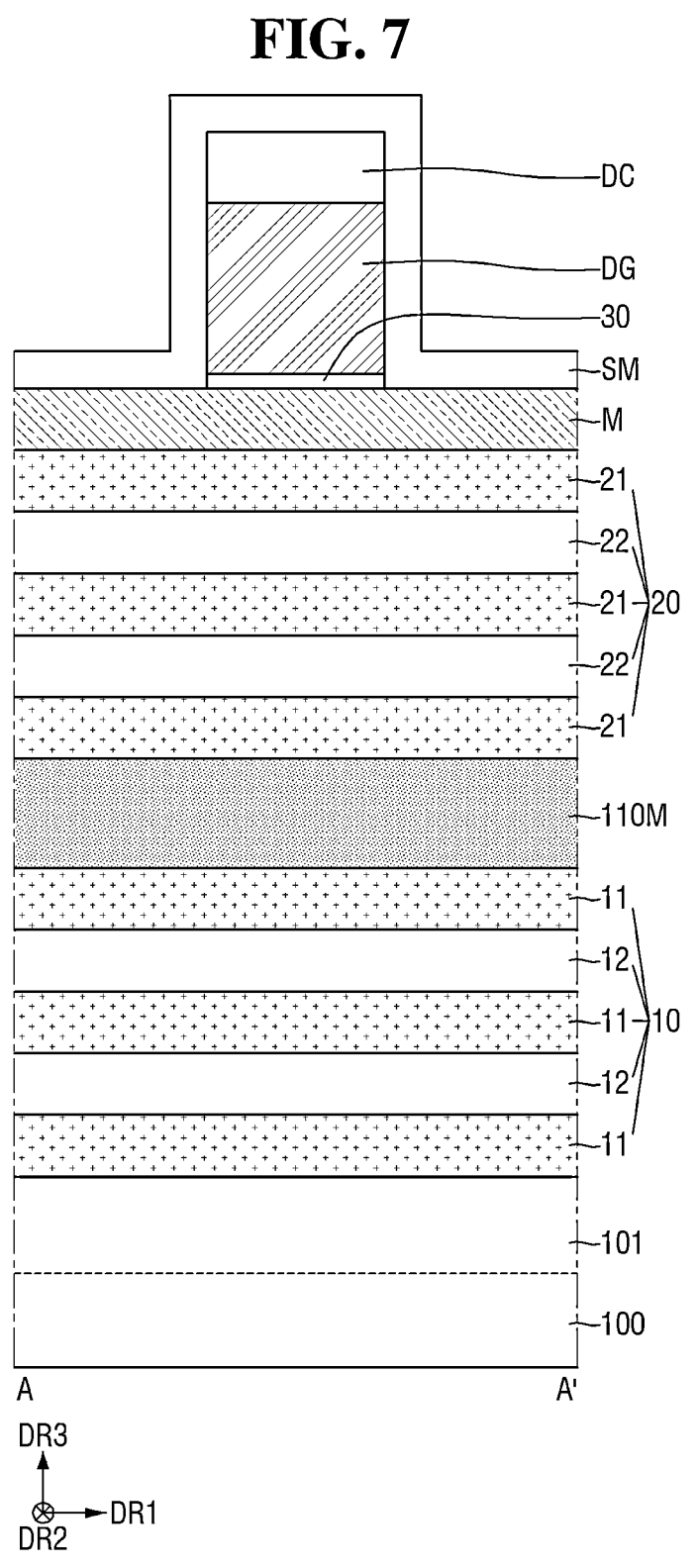
Figure 8:
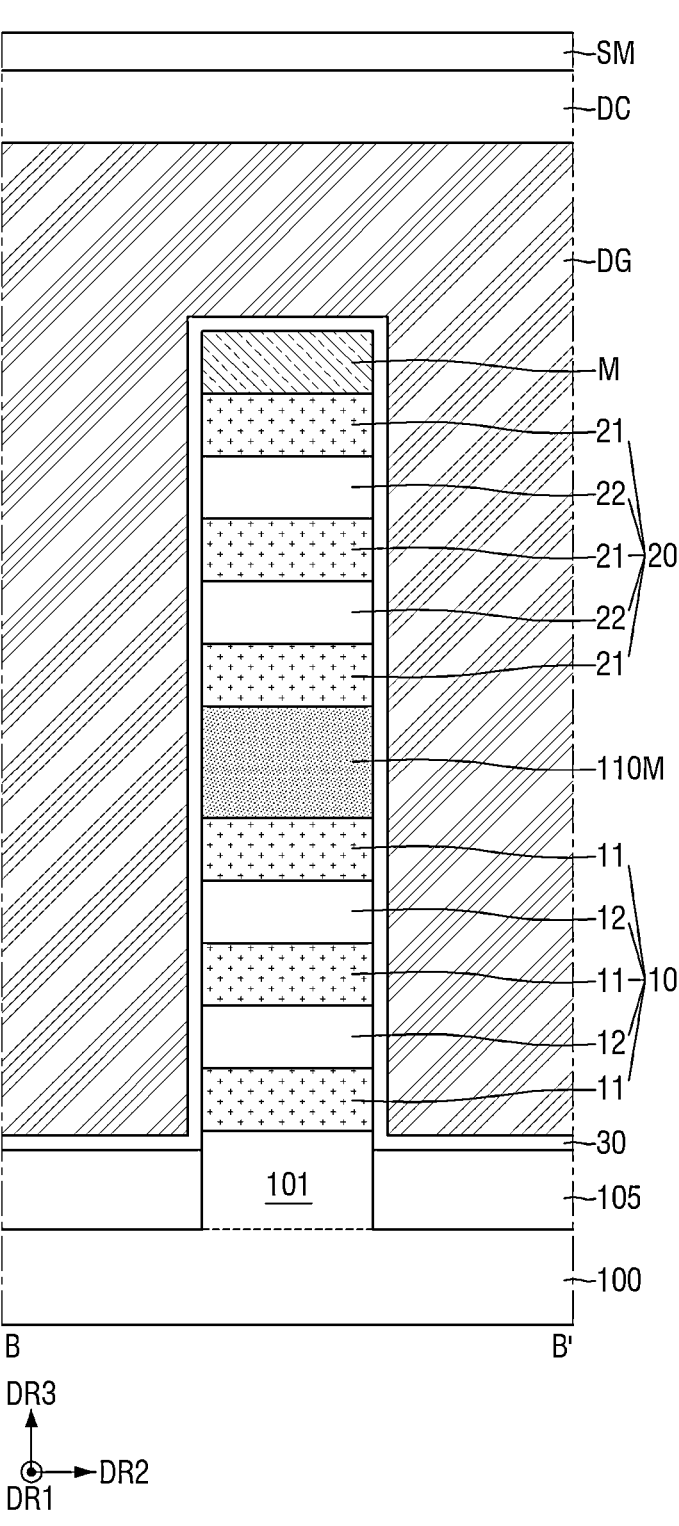

Referring to FIGS. 7 and 8, a dummy gate DG, which extends in a second horizontal direction DR2 on the field insulating layer 105, the first stack structure 10, the separation material layer 110M, and the second stack structure 20, may be formed. Also, a dummy capping pattern DC may be formed on the dummy gate DG. For example, the pad oxide layer 30 except for part overlapping with the dummy gate DG in a vertical direction DR3 may be removed. Thereafter, a spacer material layer SM may be formed, e.g. with a CVD process, to cover the sidewalls of the dummy gate DG, the sidewalls and the top surface of the dummy capping pattern DC, and the top surface of the mask pattern M.

Although not specifically illustrated, the spacer material layer SM may also be formed on the top surface of the field insulating layer 105, the sidewalls of the first stack structure 10, the sidewalls of the separation material layer 110M, the sidewalls of the second stack structure 20, and the sidewalls of the mask pattern M. For example, the spacer material layer SM may be conformally formed, e.g. with a CVD process. The spacer material layer SM may include at least one of, for example, SiN, SiOCN, SiBCN, SiCN, SiON, and a combination thereof.

Figure 9:
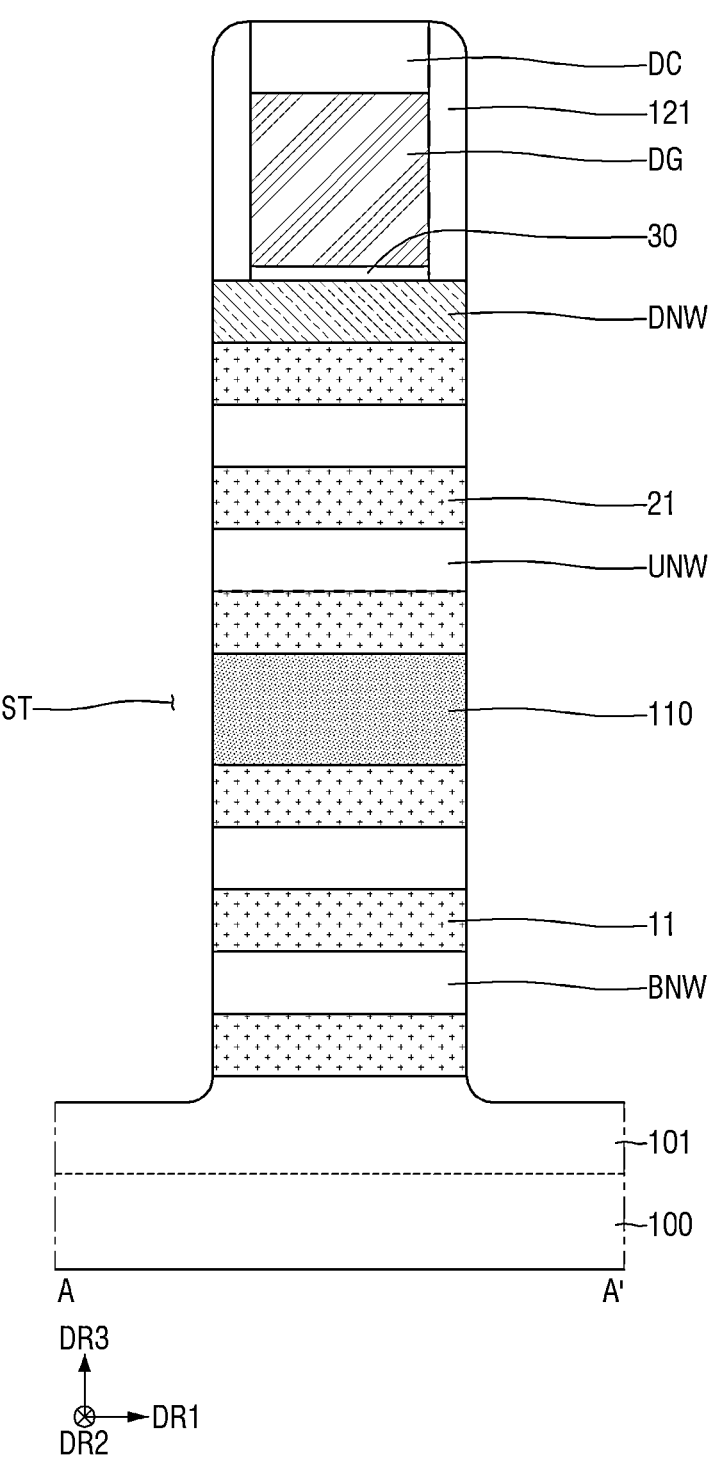

Referring to FIG. 9, source/drain trenches ST may be formed by etching the first stack structure 10, the separation material layer 110M, the second stack structure 20, and the spacer material layer SM using the dummy capping pattern DC and the dummy gate DG as a mask. For example, the source/drain trenches ST may extend into the active pattern 101.

During the formation of the source/drain trenches ST, part of the dummy capping pattern DC and the spacer material layer SM on the dummy capping pattern DC may be removed. Then, the spacer material layer SM remained on the dummy gate DG and on the sidewalls of the dummy capping pattern DC may be defined as gate spacers 121.

The second semiconductor layers 12 remained below the dummy gate DG after the formation of the source/drain trenches ST may be defined as a plurality of lower nanosheets BNW, and the fourth semiconductor layers 22 remained below the dummy gate DG after the formation of the source/drain trenches ST may be defined as a plurality of upper nanosheets UNW. Alternatively or additionally, the separation material layer 110M remained after the formation of the source/drain trenches ST may be defined as the separation layer 110, and the mask pattern M remained after the formation of the source/drain trenches ST may be defined as a dummy nanosheet DNW.

Figure 10:
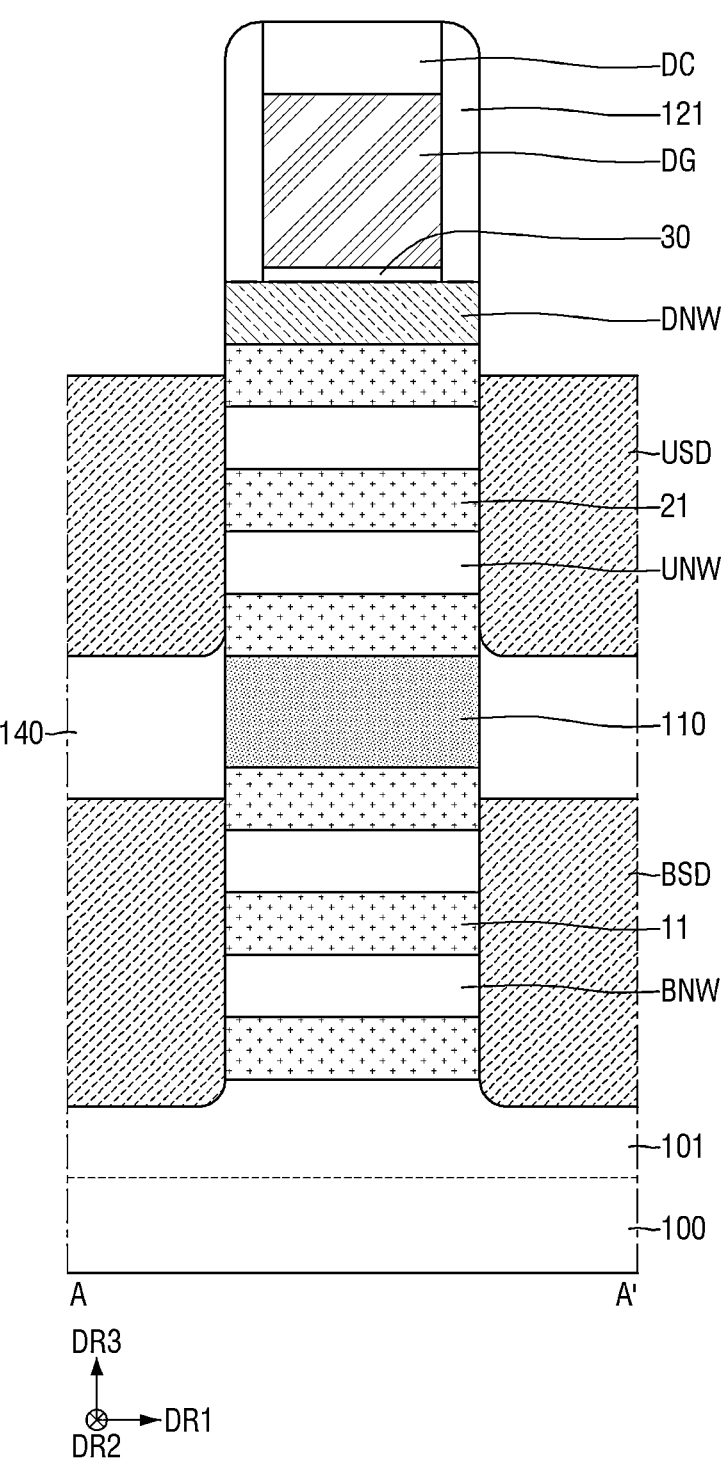

Referring to FIG. 10, lower source/drain regions BSD may be formed on the sidewalls, in a first horizontal direction DR1, of each of the plurality of lower nanosheets BNW, in the source/drain trenches ST. In some example embodiments, impurities may be included in-situ and/or injected after forming the lower source drain regions BSD. Thereafter, part of a first interlayer insulating layer 140 may be formed to cover the lower source/drain regions BSD. For example, the sidewalls, in the first horizontal direction DR1, of each of the plurality of upper nanosheets UNW may be exposed on the first interlayer insulating layer 140. Thereafter, upper source/drain regions USD may be formed on the sidewalls, in the first horizontal direction DR1, of each of the plurality of upper nanosheets UNW, in the source/drain trenches ST. In some example embodiments, impurities may be included in-situ and/or injected after forming the upper source drain/regions USD.

Figure 11:
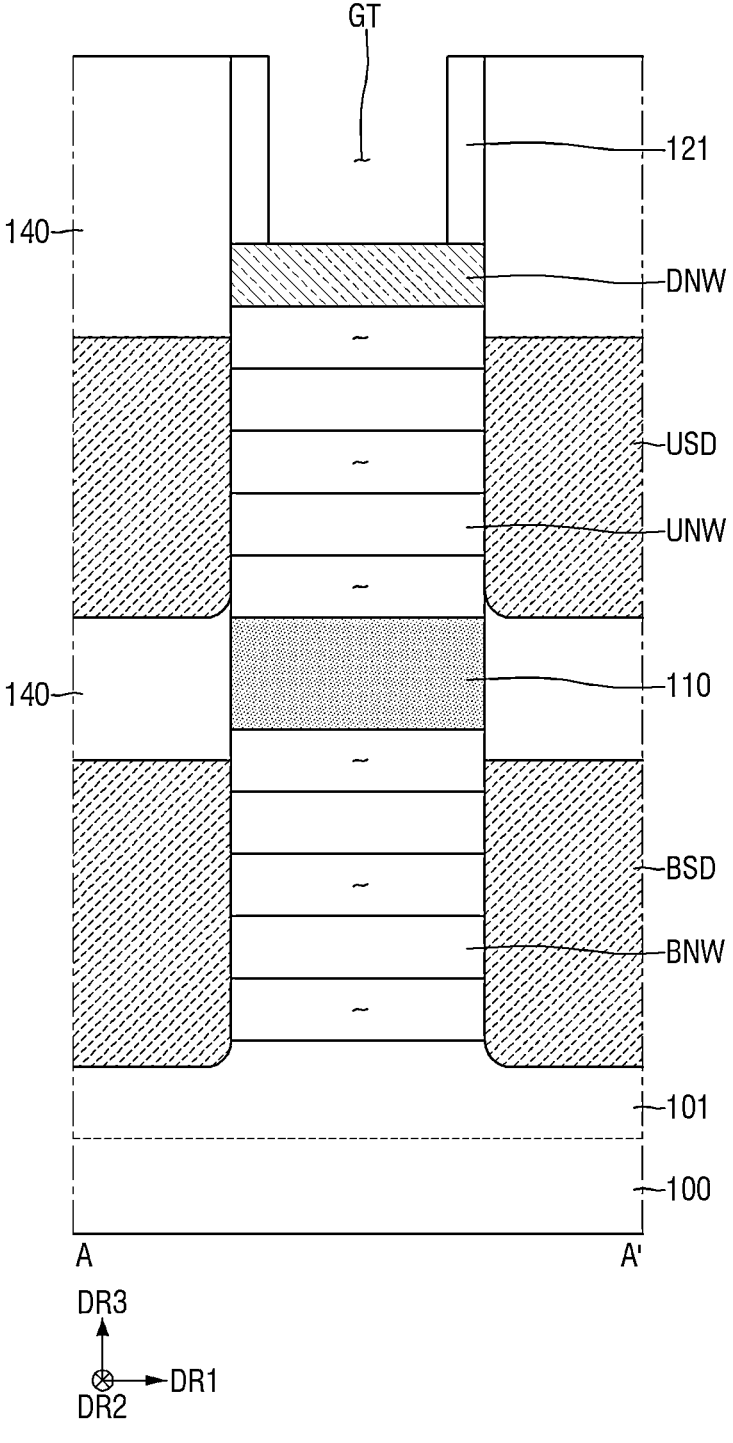
Figure 12:
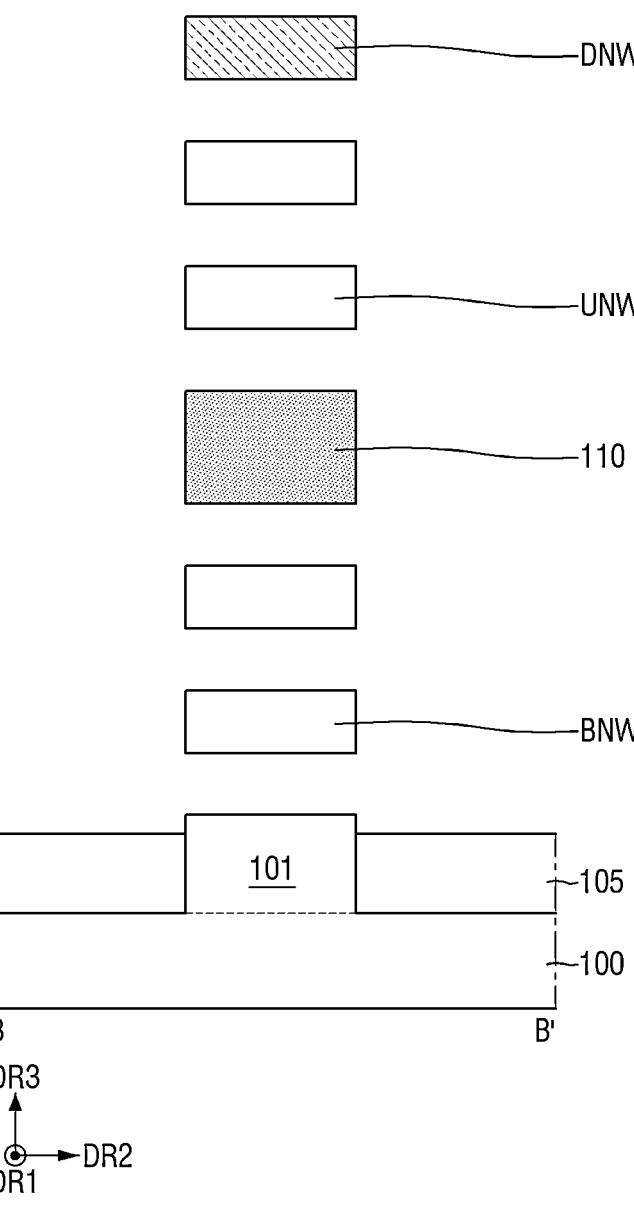

Referring to FIGS. 11 and 12, the first interlayer insulating layer 140 may be additionally formed to cover the upper source/drain regions USD. The first interlayer insulating layer 140 may cover the sidewalls of each of the gate spacers 121 and the top surface of the dummy capping pattern DC. Thereafter, the top surface of the dummy gate DG may be exposed by performing a planarization process. Thereafter, the dummy gate DG, the pad oxide layer 30, the first semiconductor layers 11, and the third semiconductor layers 21 may be removed. The region from which the dummy gate DG is removed may be defined as gate trench GT.

Figure 13:
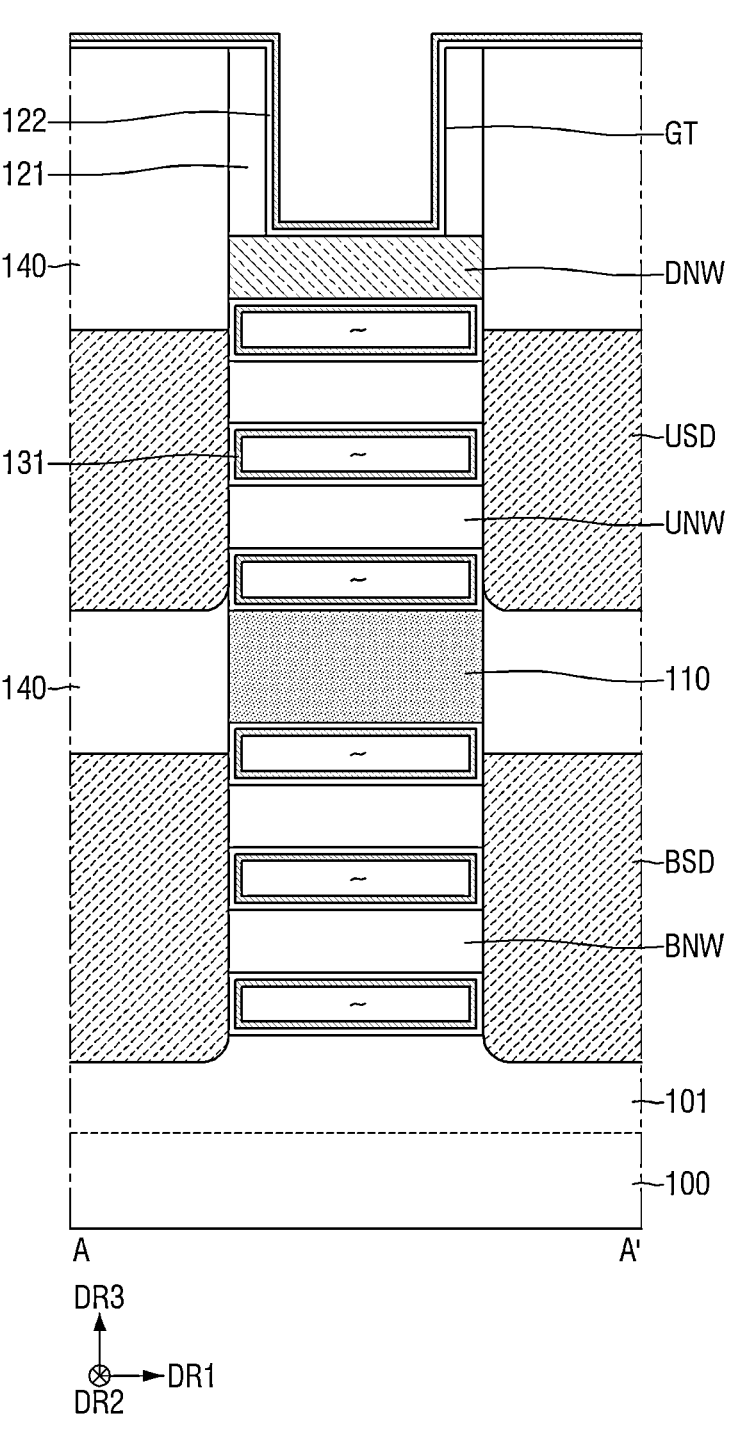
Figure 14:
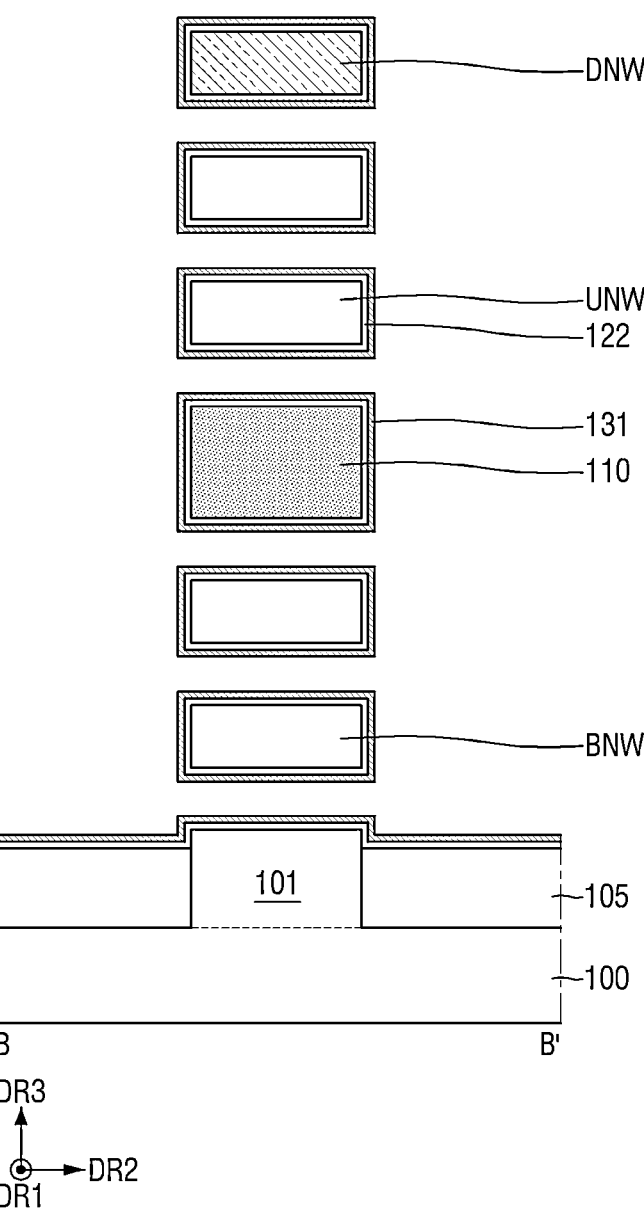

Referring to FIGS. 13 and 14, a gate insulating layer 122 and then a first conductive layer 131 may be formed in the regions from which the first semiconductor layers 11 are removed, in the regions from which the third semiconductor layers 21 are removed, and in the gate trench GT. For example, the gate insulating layer 122 and the first conductive layer 131 may be conformally formed, e.g. with a CVD process. For example, the gate insulating layer 122 and the first conductive layer 131 may be formed even on the top surface of the first interlayer insulating layer 140.

Figure 15:
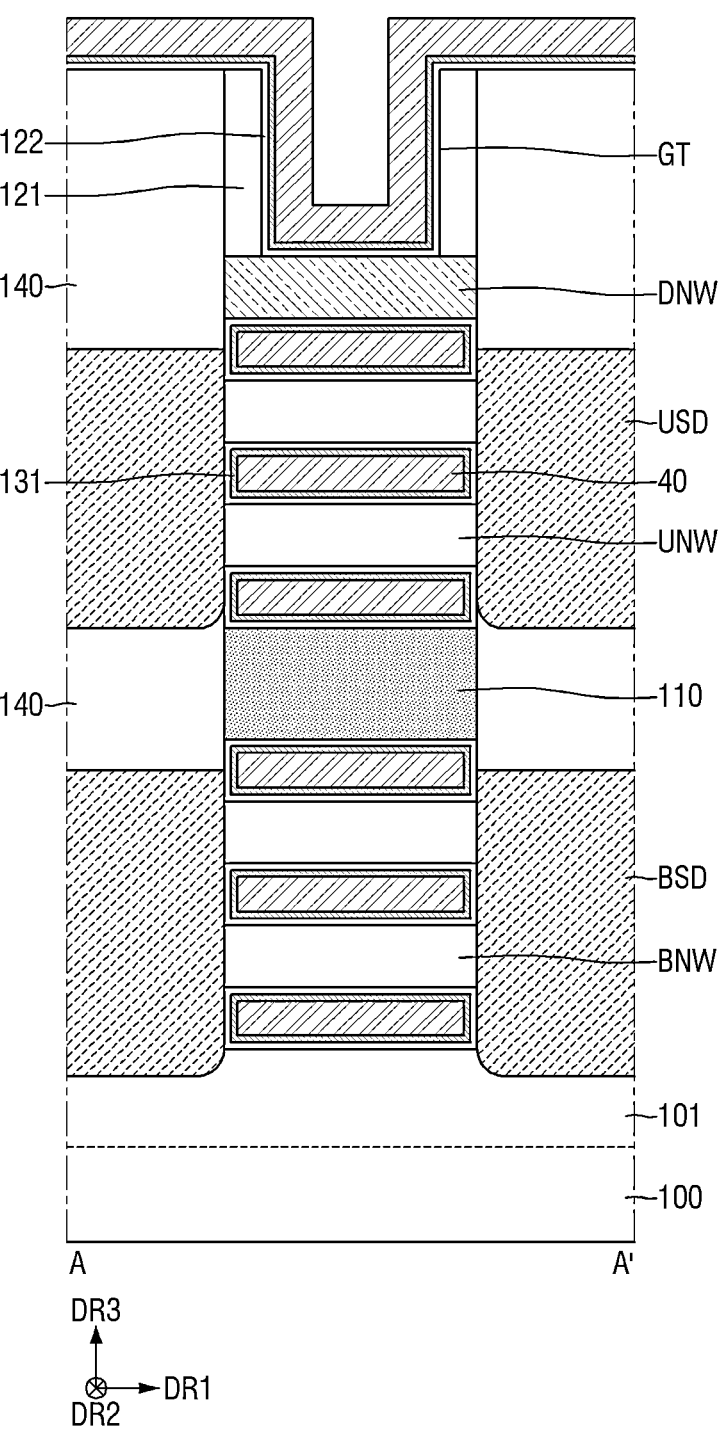
Figure 16:
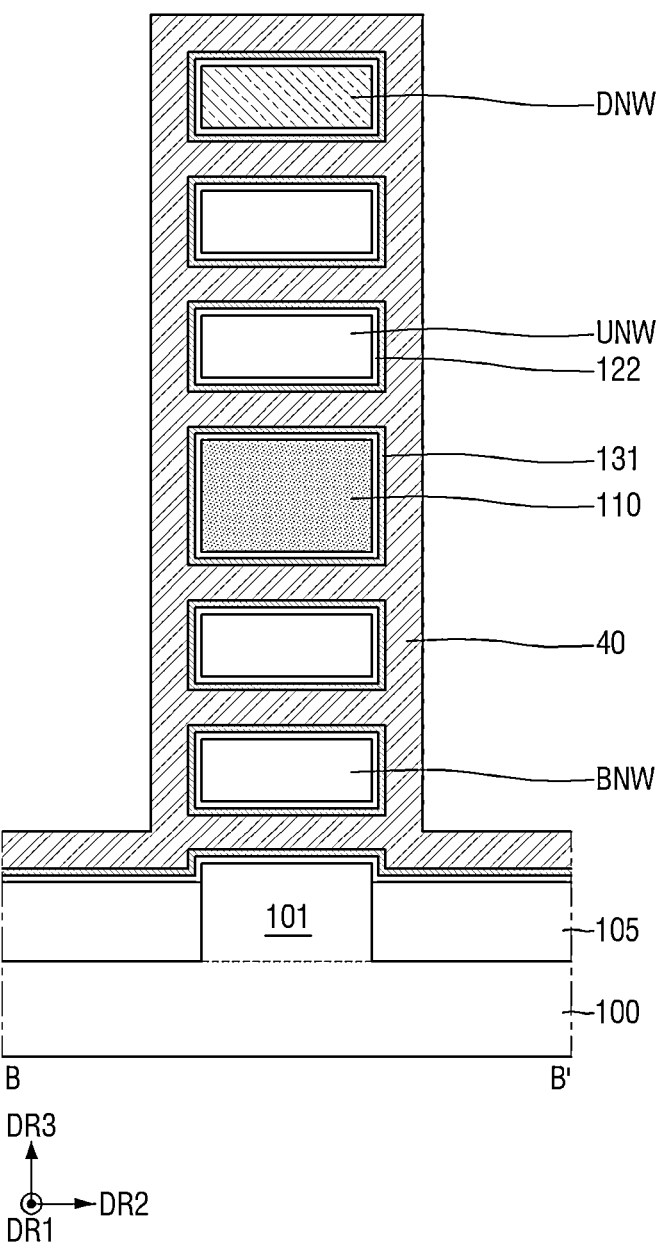

Referring to FIGS. 15 and 16, a first sacrificial layer 40 may be formed on the first conductive layer 131. For example, the first sacrificial layer 40 may be conformally formed. The first sacrificial layer 40 may cover the plurality of lower nanosheets BNW, the separation layer 110, the plurality of upper nanosheets UNW, and the dummy nanosheet DNW. For example, the first sacrificial layer 40 may be formed even on the top surface of the first interlayer insulating layer 140. The first sacrificial layer 40 may include, for example, $Al_2O_3$, but example embodiments are not limited thereto.

Figure 17:
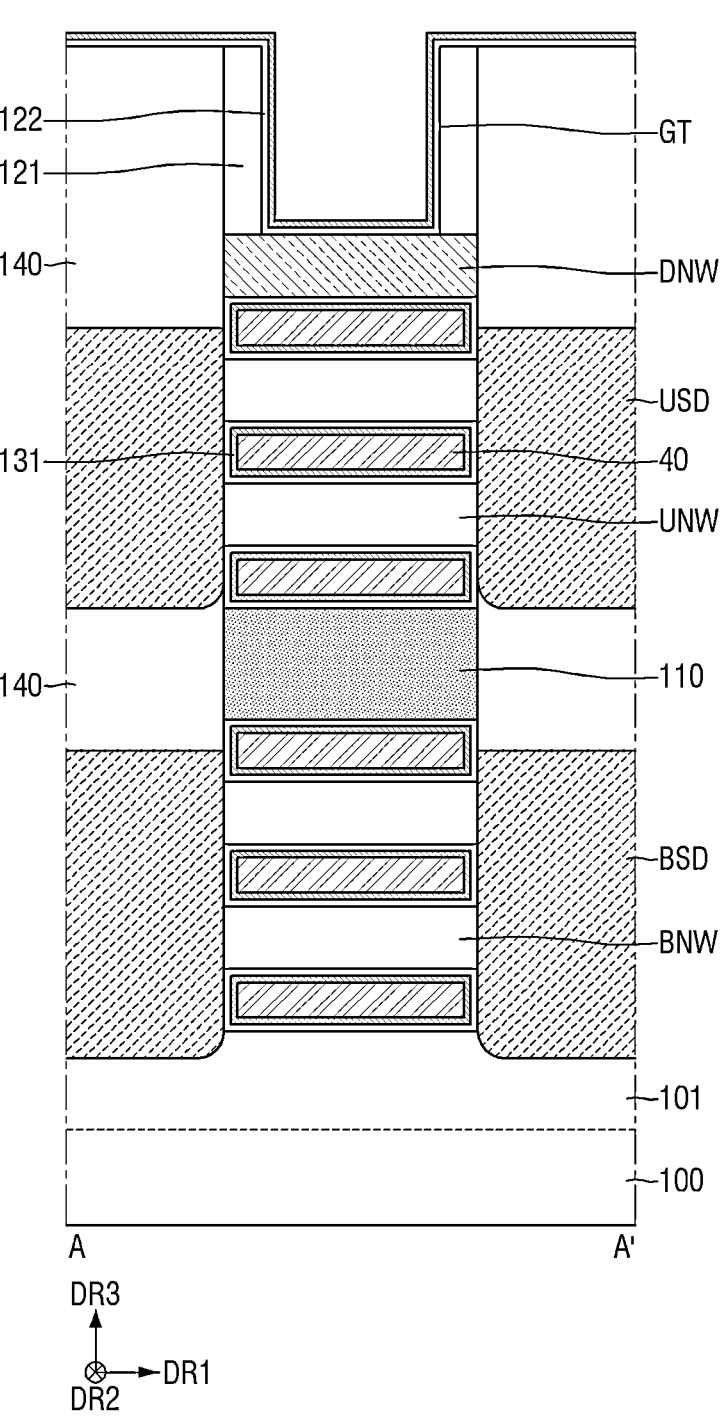
Figure 18:
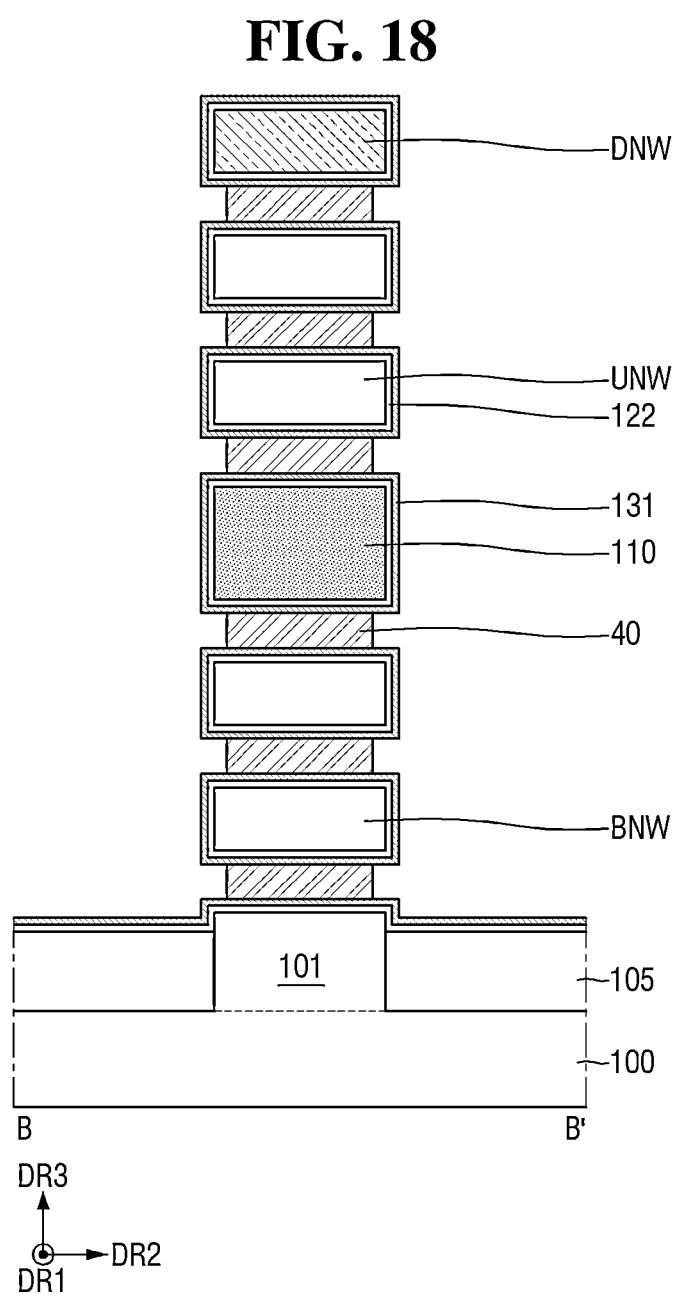

Referring to FIGS. 17 and 18, parts of the first sacrificial layer 40 may be etched. For example, parts of the first sacrificial layer 40 may be etched by an etch-back process. As a result, the first sacrificial layer 40 may be removed from the top surface of the first interlayer insulating layer 140, the top surface of the field insulating layer 105, and the inside of the gate trench GT. Also, the first sacrificial layer 40 may be removed from the sidewalls of each of the plurality of lower nanosheets BNW, the separation layer 110, each of the plurality of upper nanosheets UNW, and the dummy nanosheet DNW. Accordingly, parts of the first conductive layer 131 may be exposed.

Alternatively or additionally, as a result of the etching of the first sacrificial layer 40, the sidewalls of the first sacrificial layer 40 may be partially removed from between the active pattern 101, the plurality of lower nanosheets BNW, the separation layer 110, the plurality of upper nanosheets UNW, and the dummy nanosheet DNW. Accordingly, the sidewalls, in the second horizontal direction DR2, of the first sacrificial layer 40 may be recessed from the sidewalls, in the second horizontal direction DR2, of each of the plurality of lower nanosheets BNW, the separation layer 110, the plurality of upper nanosheets UNW, and the dummy nanosheet DNW.

Figure 19:
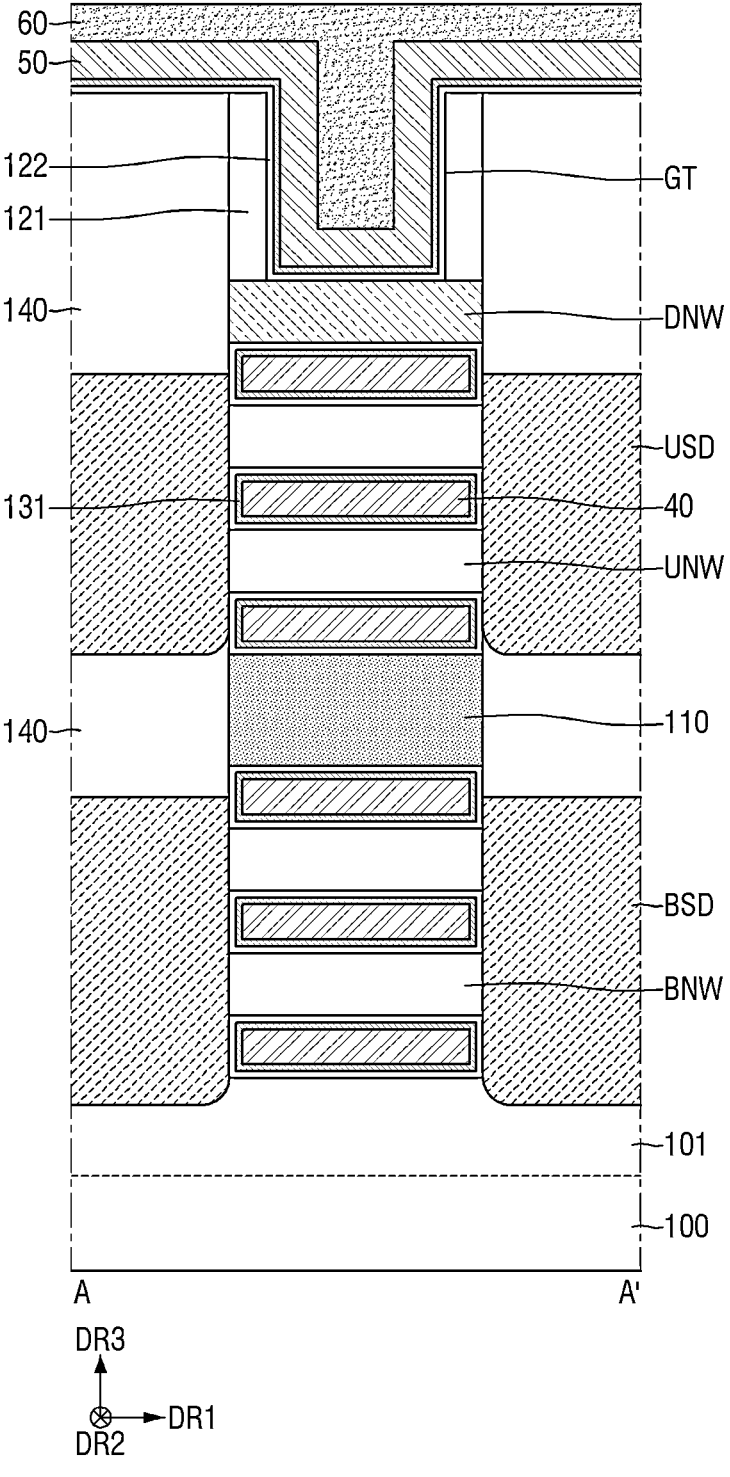
Figure 20:
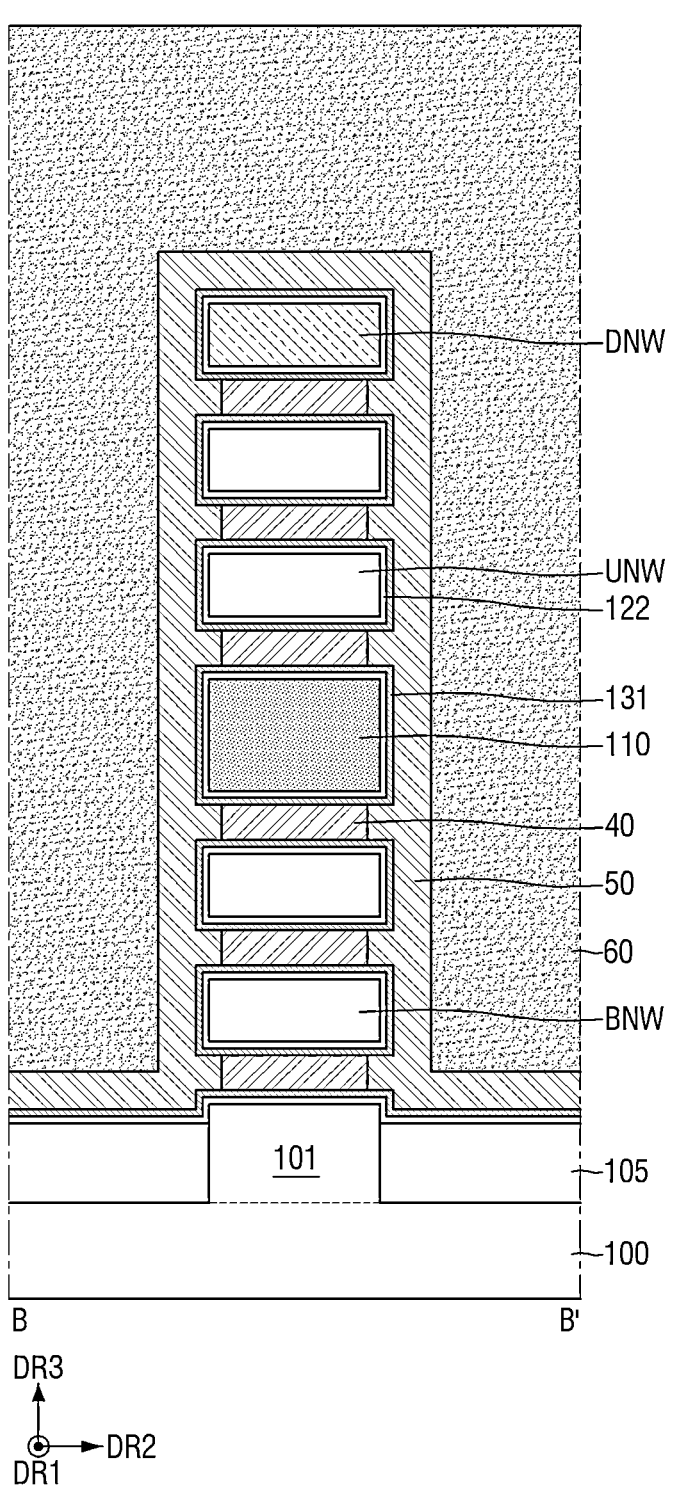

Referring to FIGS. 19 and 20, a second sacrificial layer 50 may be formed on the sidewalls of each of the first conductive layer 131 and the sidewalls of the first sacrificial layer 40. For example, the second sacrificial layer 50 may be conformally formed. The second sacrificial layer 50 may cover the plurality of lower nanosheets BNW, the separation layer 110, the plurality of upper nanosheets UNW, and the dummy nanosheet DNW. For example, the second sacrificial layer 50 may be formed even on the top surface of the first interlayer insulating layer 140. The second sacrificial layer 50 may include, for example, TiN, but example embodiments are not limited thereto.

Thereafter, a third sacrificial layer 60 may be formed on the second sacrificial layer 50. For example, the third sacrificial layer 60 may fill the gate trench GT. For example, the third sacrificial layer 60 may be formed even on the top surface of the first interlayer insulating layer 140. The third sacrificial layer 60 may include one of, for example, SOH (Spin on hard mask), but example embodiments are not limited thereto.

Figure 21:
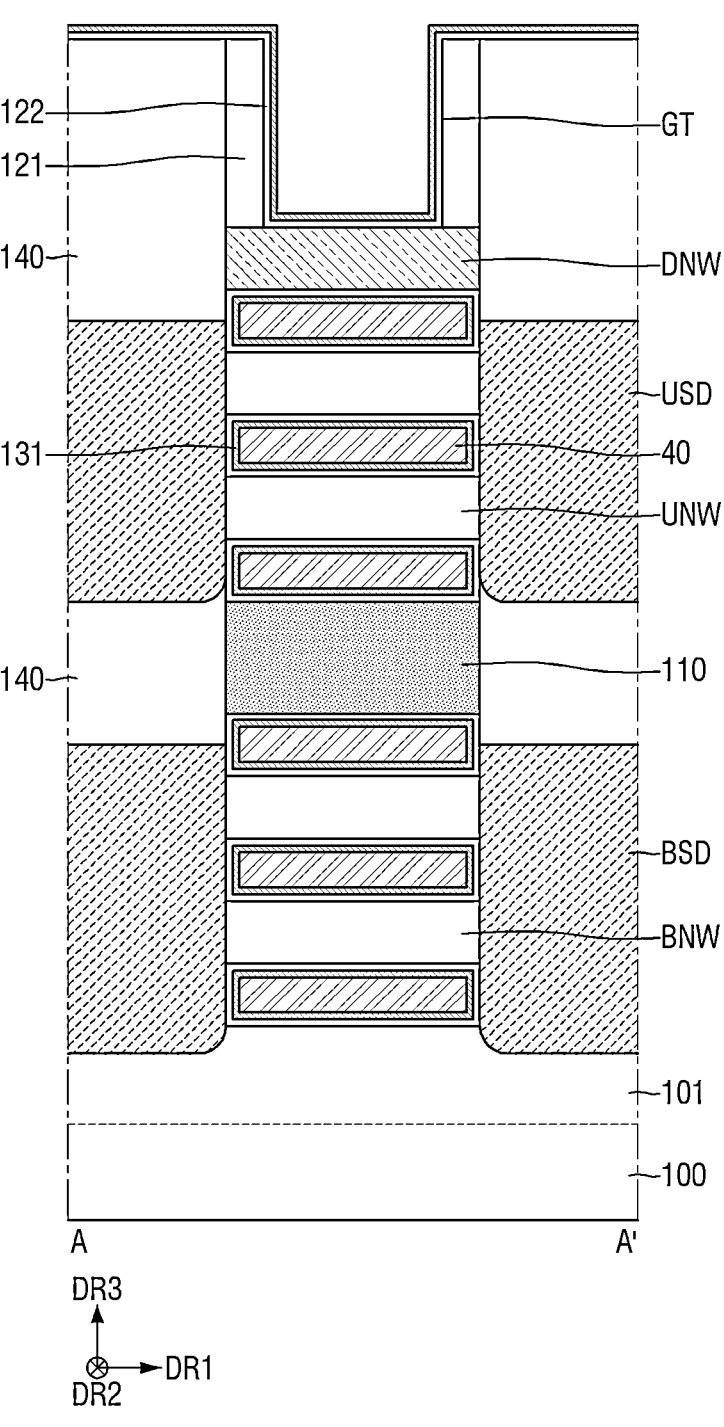
Figure 22:
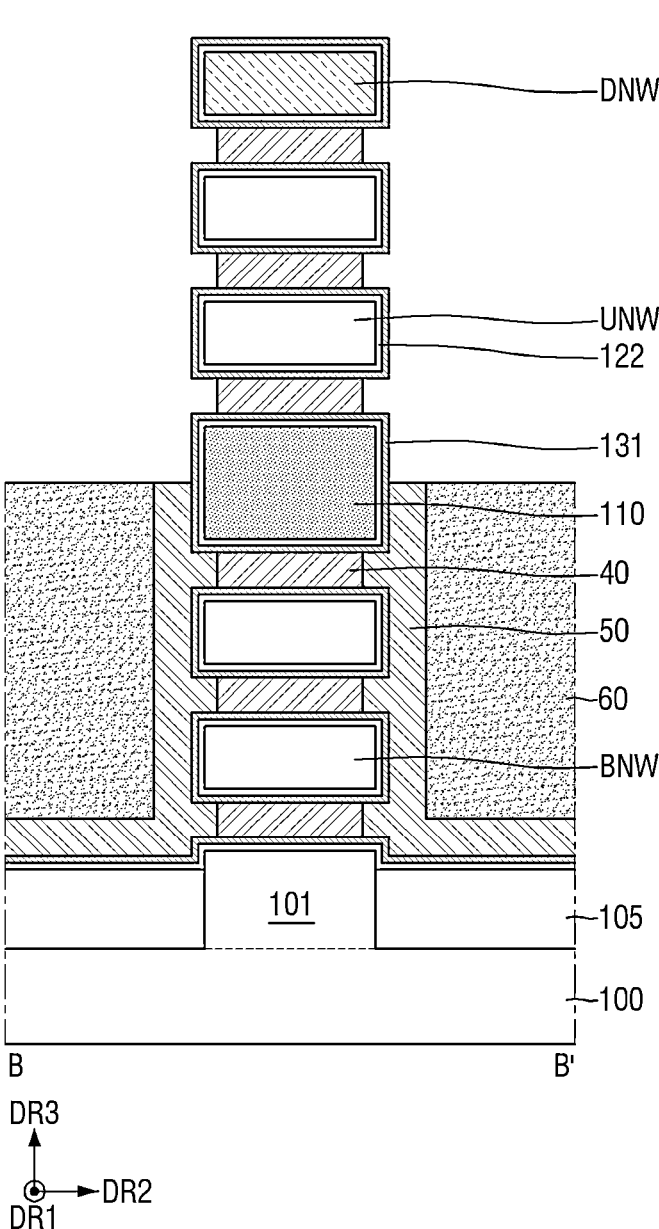

Referring to FIGS. 21 and 22, part of the third sacrificial layer 60 may be etched, e.g. etched with a wet etching process and/or a dry etching process. For example, the top surface of the third sacrificial layer 60 may be formed between the bottom surface and the top surface of the separation layer 110. Thereafter, part of the second sacrificial layer 50 may be etched. For example, the top surface of the second sacrificial layer 50 may be formed between the bottom surface and the top surface of the separation layer 110. The third sacrificial layer 60 and the second sacrificial layer 50 may be etched away from the inside of the gate trench GT.

After the etching of the third sacrificial layer 60 and the second sacrificial layer 50, a first conductive layer 131 surrounding the plurality of upper nanosheets UNW and the dummy nanosheet DNW, part of a first conductive layer 131 surrounding the top of the separation layer 110, and parts of the sidewalls, in the second horizontal direction DR2, of the first sacrificial layer 40 between the separation layer 110, the plurality of upper nanosheets UNW, and the dummy nanosheet DNW may be exposed.

Figure 23:
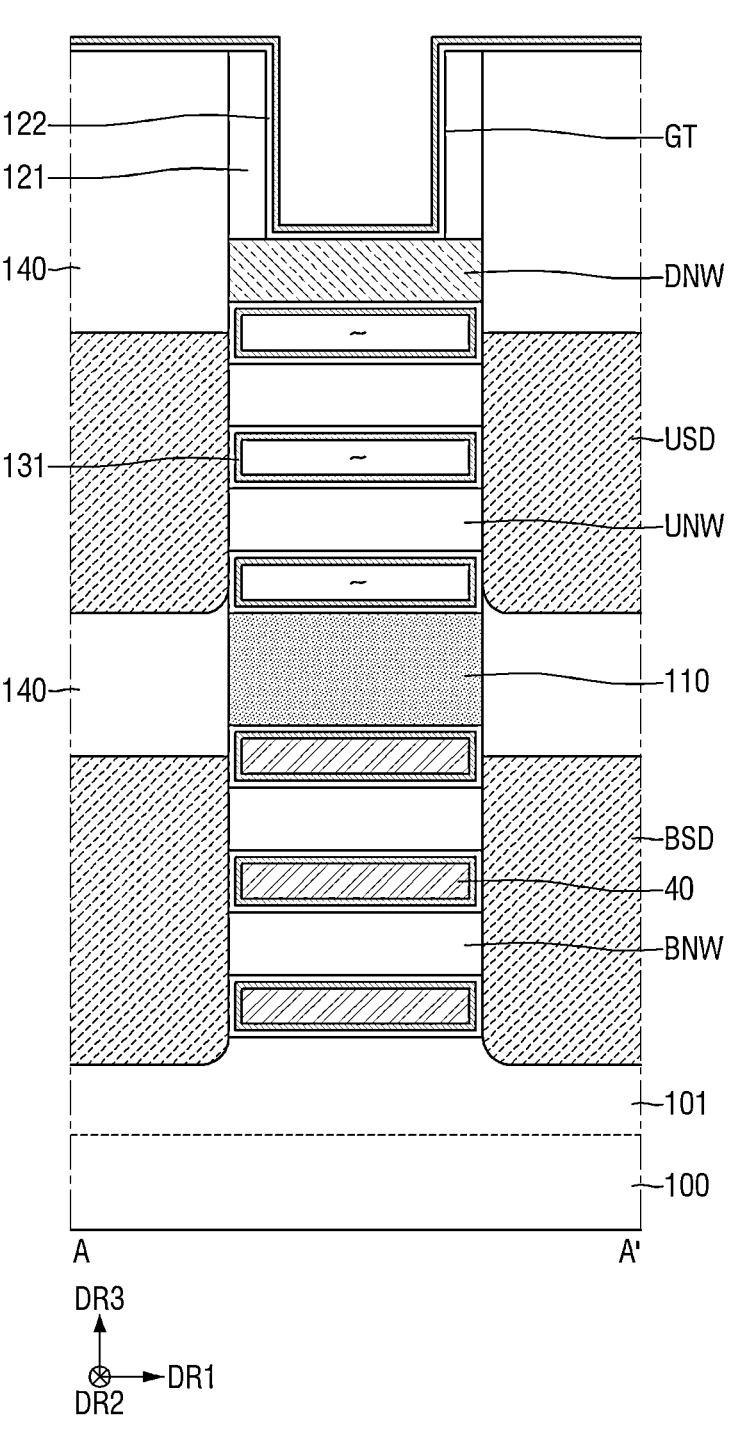
Figure 24:
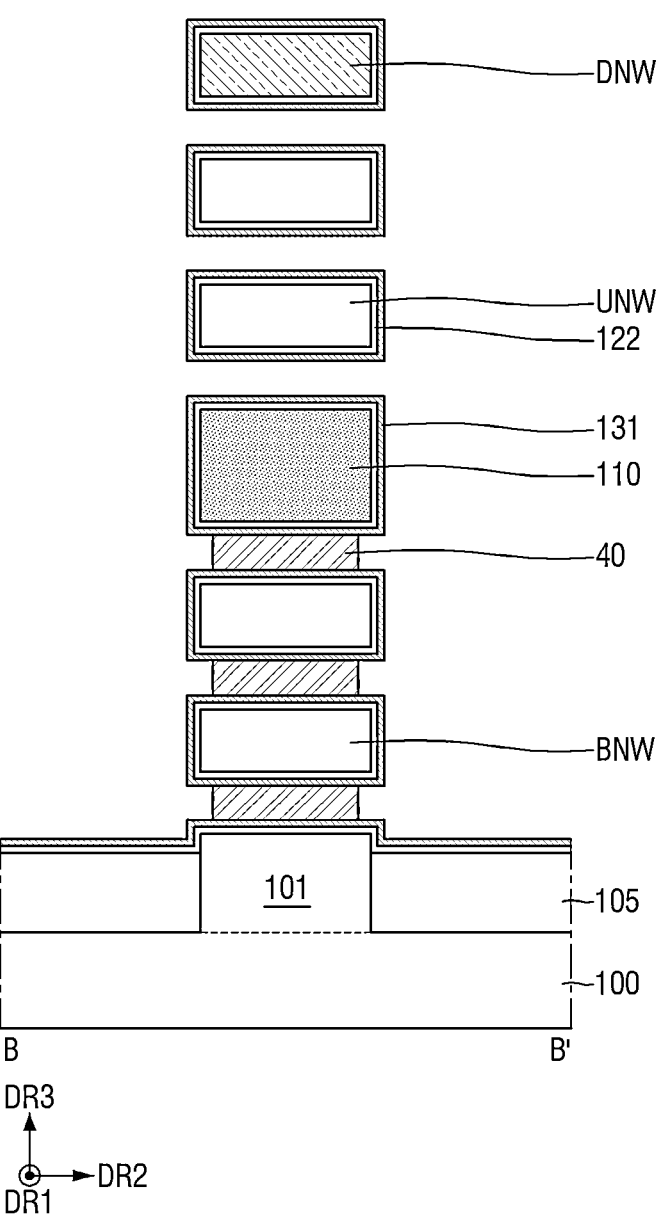

Referring to FIGS. 23 and 24, parts of the first sacrificial layer 40 between the separation layer 110, the plurality of upper nanosheets UNW, and the dummy nanosheet DNW may be etched. For example, the parts of the first sacrificial layer 40 between the separation layer 110, the plurality of upper nanosheets UNW, and the dummy nanosheet DNW may be etched by a wet etching process. Thereafter, the third sacrificial layer 60 and the second sacrificial layer 50 may be sequentially etched. As a result, the first sacrificial layer 40 may be exposed between the active pattern 101, the plurality of lower nanosheets BNW, and the separation layer 110.

Figure 25:
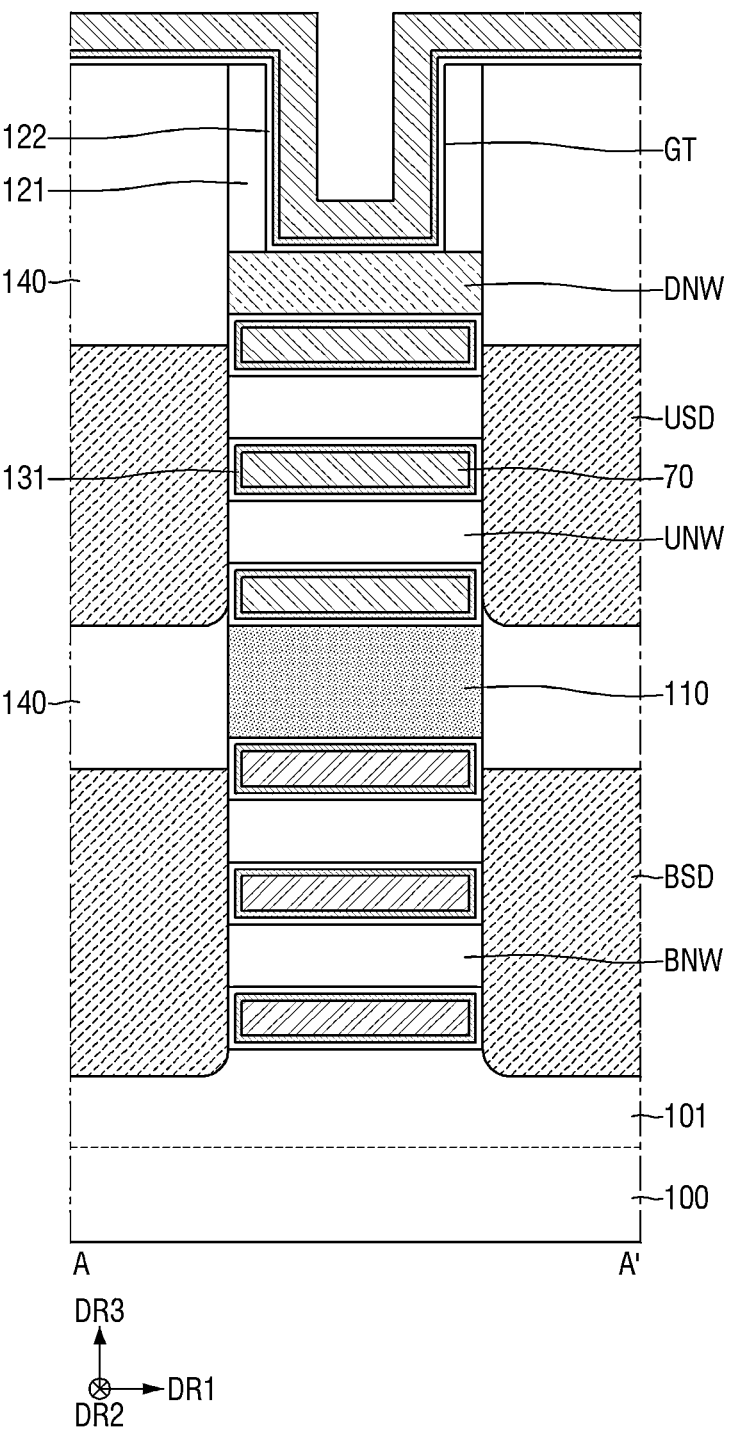
Figure 26:
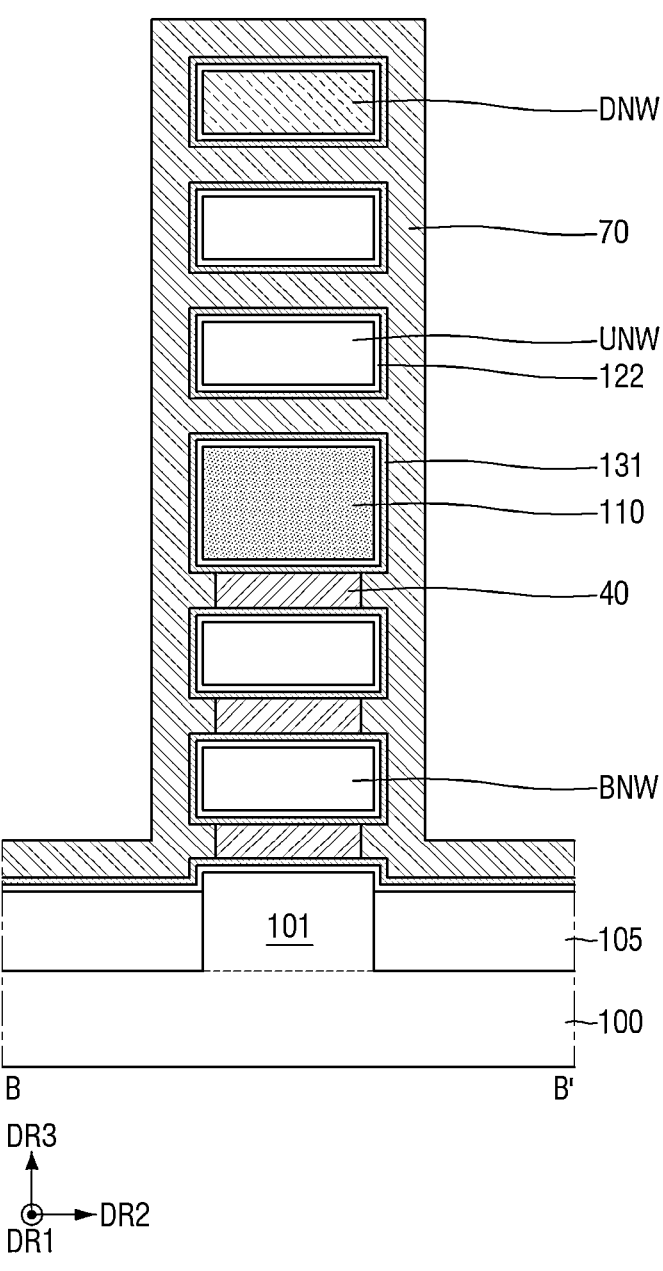

Referring to FIGS. 25 and 26, a fourth sacrificial layer 70 may be formed on the sidewalls, in the second horizontal direction DR2, of each of the first conductive layer 131 and the sidewalls, in the second horizontal direction DR2, of the first sacrificial layer 40. For example, the fourth sacrificial layer 70 may be conformally formed. The fourth sacrificial layer 70 may cover the plurality of lower nanosheets BNW, the separation layer 110, the plurality of upper nanosheets UNW, and the dummy nanosheet DNW. For example, the fourth sacrificial layer 70 may be formed even on the top surface of the first interlayer insulating layer 140. The fourth sacrificial layer 70 may include, for example, TiN, but example embodiments are not limited thereto.

Figure 27:
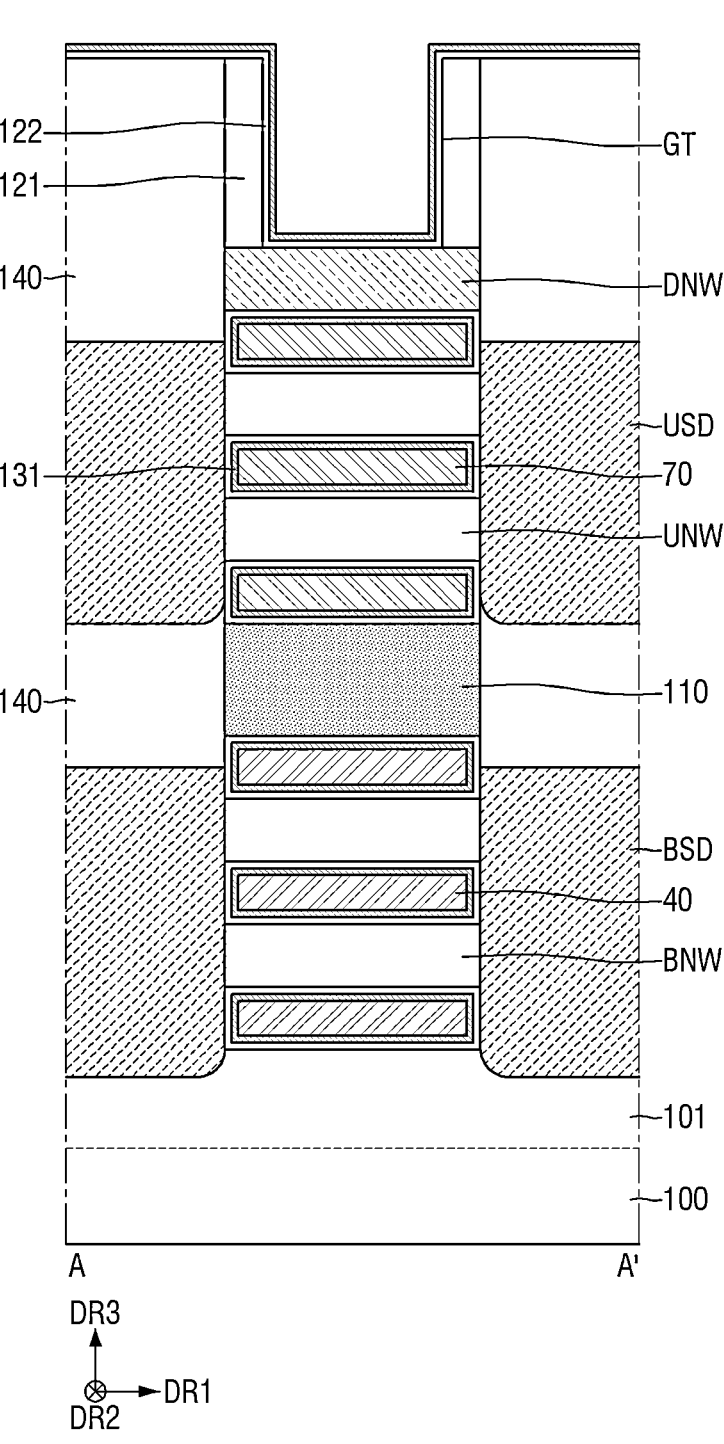
Figure 28:
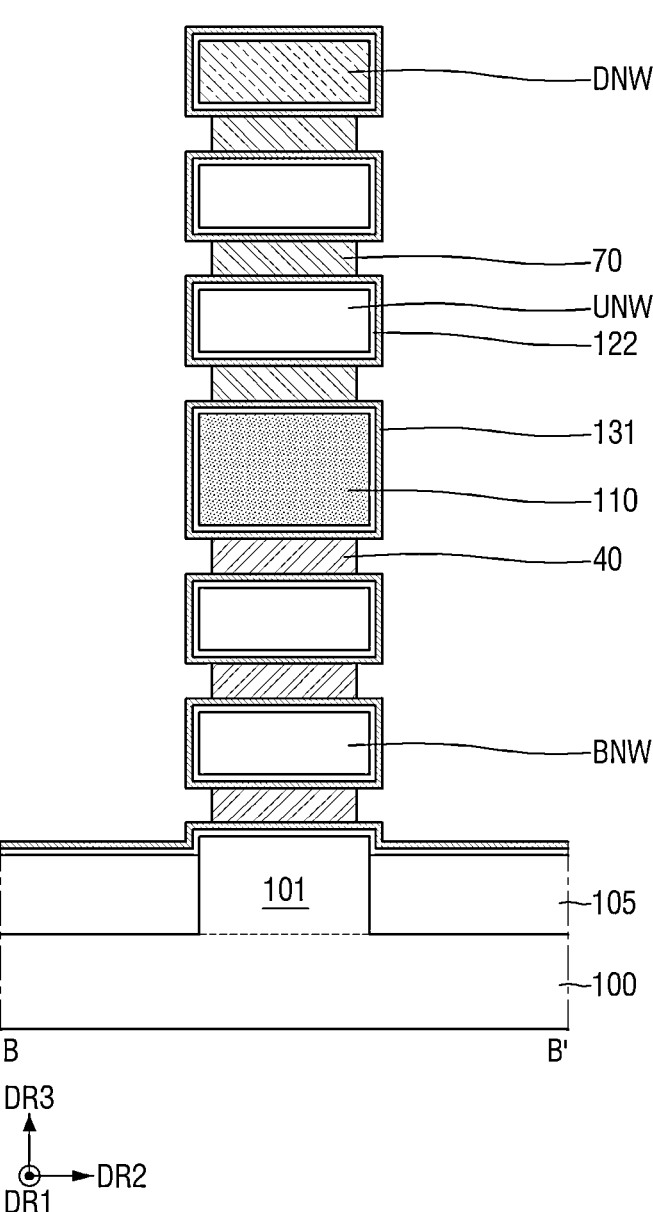

Referring to FIGS. 27 and 28, parts of the fourth sacrificial layer 70 may be etched. For example, parts of the fourth sacrificial layer 70 may be etched by an etch-back process. As a result, the fourth sacrificial layer 70 may be removed from the top surface of the first interlayer insulating layer 140, the top surface of the field insulating layer 105, and the inside of the gate trench GT. Alternatively or additionally, the fourth sacrificial layer 70 may be removed from the sidewalls of each of the plurality of lower nanosheets BNW, the separation layer 110, the plurality of upper nanosheets UNW, and the dummy nanosheet DNW. Accordingly, parts of the first conductive layer 131 and the sidewalls, in the second horizontal direction DR2, of the first sacrificial layer 40 may be exposed.

Alternatively or additionally, as a result of the etching of the fourth sacrificial layer 70, parts of the sidewalls of the fourth sacrificial layer 70 may be removed from between the separation layer 110, the plurality of upper nanosheets UNW, and the dummy nanosheet DNW. Accordingly, the sidewalls, in the second horizontal direction DR2, of the fourth sacrificial layer 70 may be recessed from the sidewalls, in the second horizontal direction DR2, of each of the separation layer 110, the plurality of upper nanosheets UNW, and the dummy nanosheet DNW.

Figure 29:
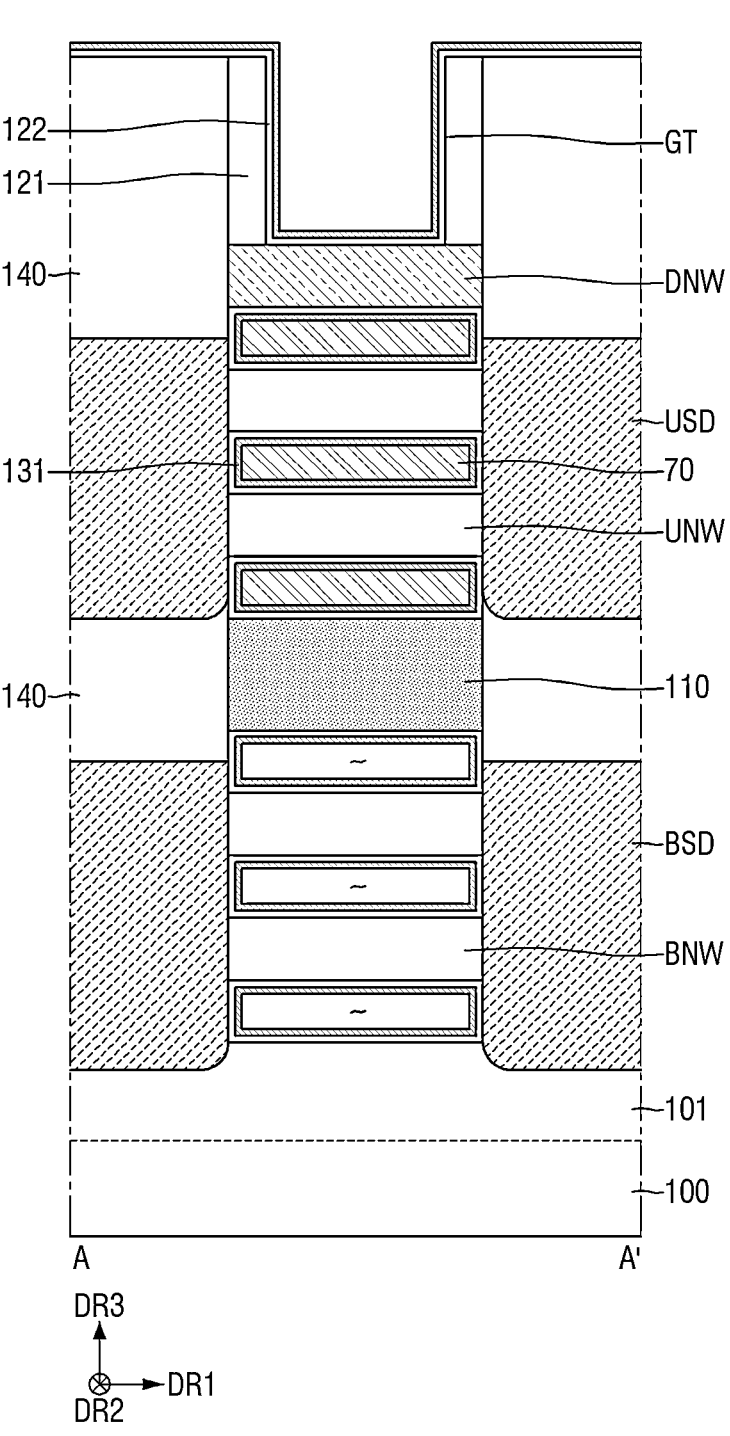
Figure 30:
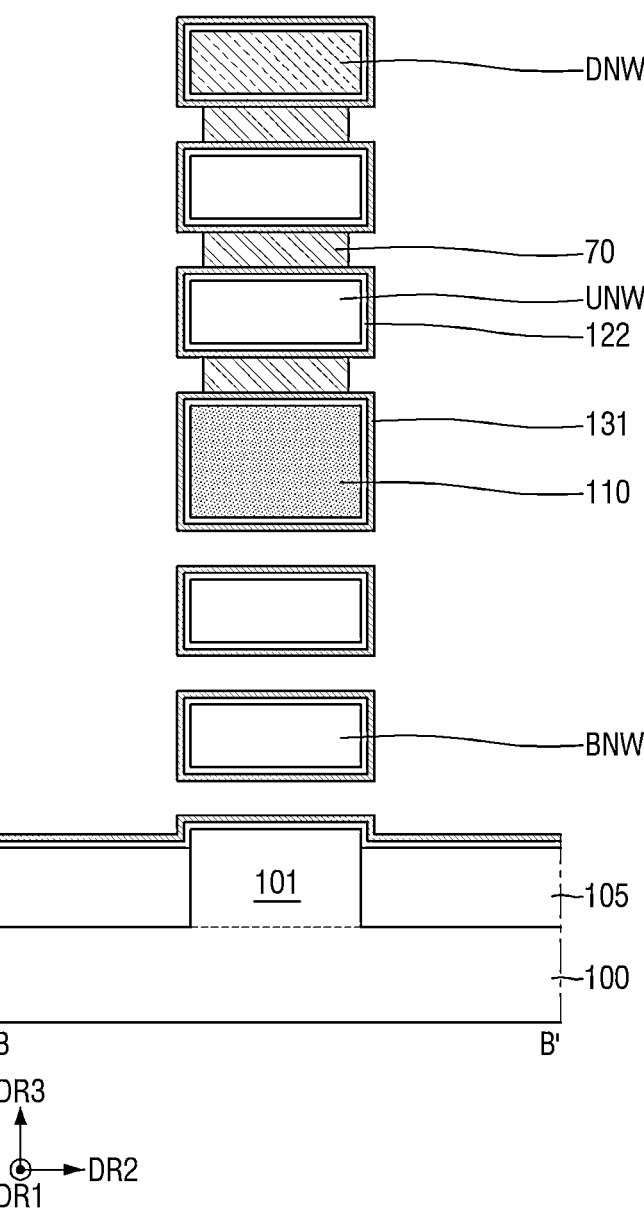

Referring to FIGS. 29 and 30, the first sacrificial layer 40 may be etched. For example, the first sacrificial layer 40 may be etched by a wet etching process. As a result, a first conductive layer 131 surrounding the plurality of lower nanosheets BNW may be completely exposed.

Figure 31:
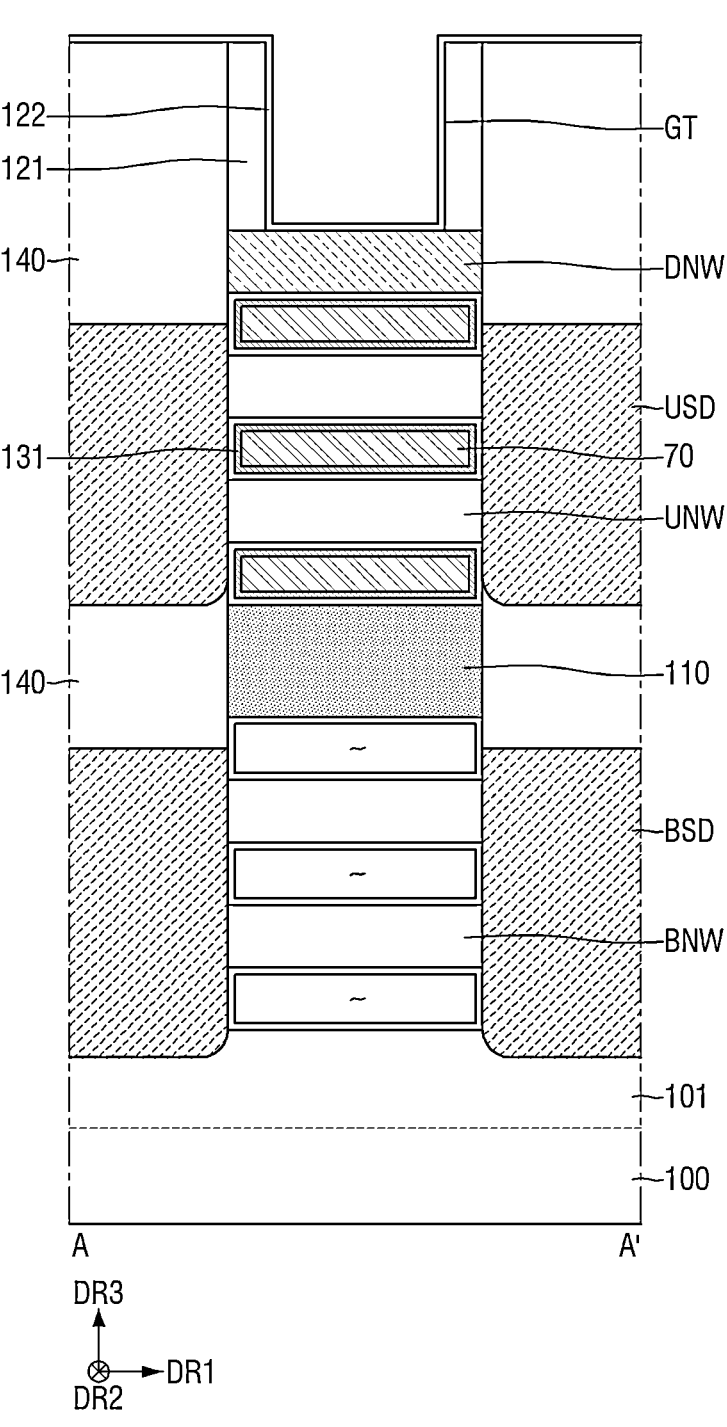
Figure 32:
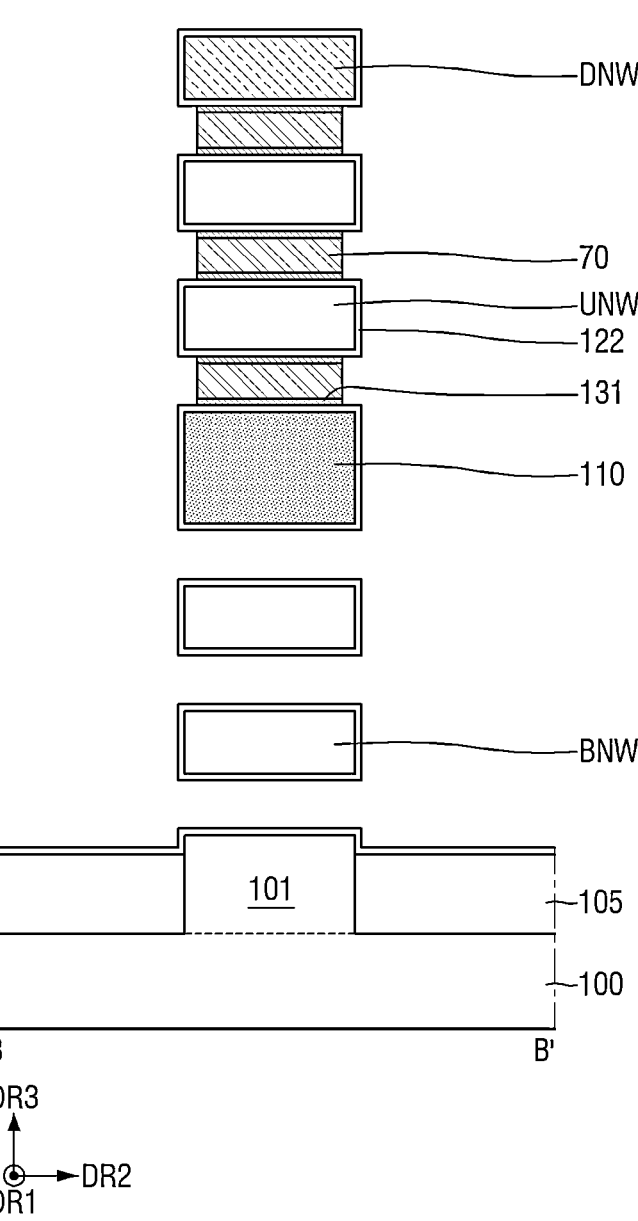

Referring to FIGS. 31 and 32, all the first conductive layer 131 except for those in contact with the fourth sacrificial layer 70 may be etched. For example, all the first conductive layer 131 except for those formed between the fourth sacrificial layer 70 and the gate insulating layer 122 may be etched. For example, the first conductive layer 131 may be etched by a wet etching process. As a result, the first conductive layer 131 may be formed only on the top surface of the separation layer 110, the top surface and the bottom surface of the plurality of upper nanosheets UNW, and the bottom surface of the dummy nanosheet DNW. The first conductive layer 131 may affect a threshold voltage of the corresponding MBCFET™.

Figure 33:
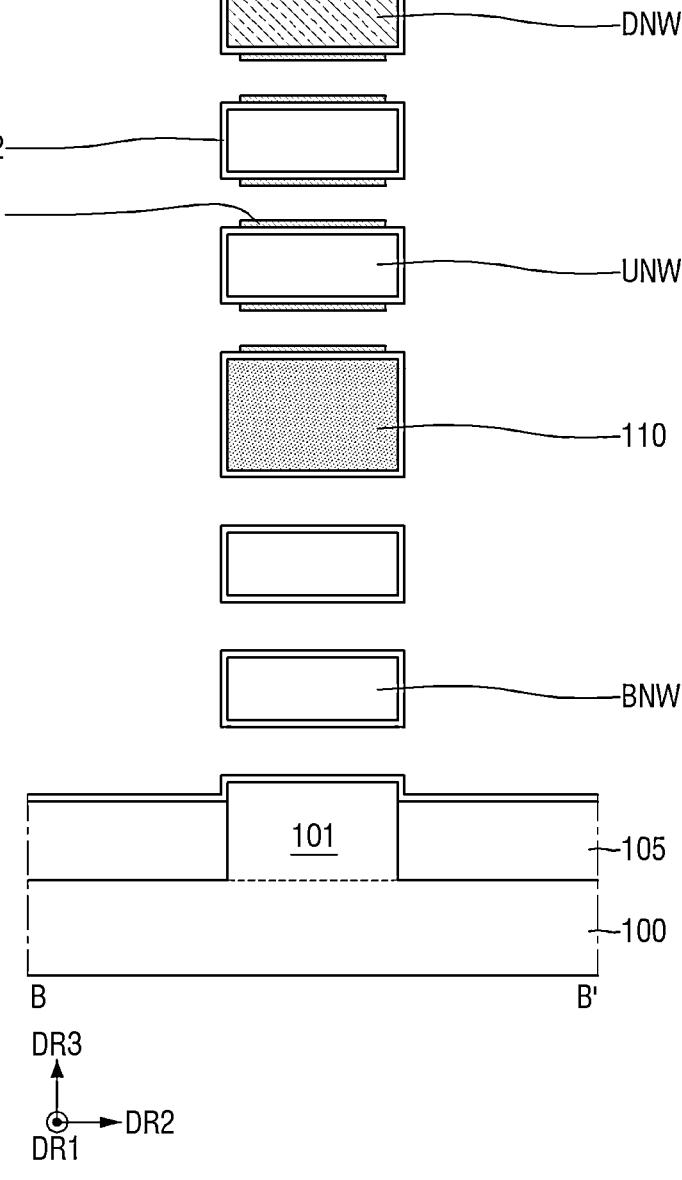

Referring to FIG. 33, the fourth sacrificial layer 70 may be etched. For example, the fourth sacrificial layer 70 may be etched, e.g. by a dry and/or a wet etching process. As a result, the first conductive layer 131 may be exposed.

Figure 34:
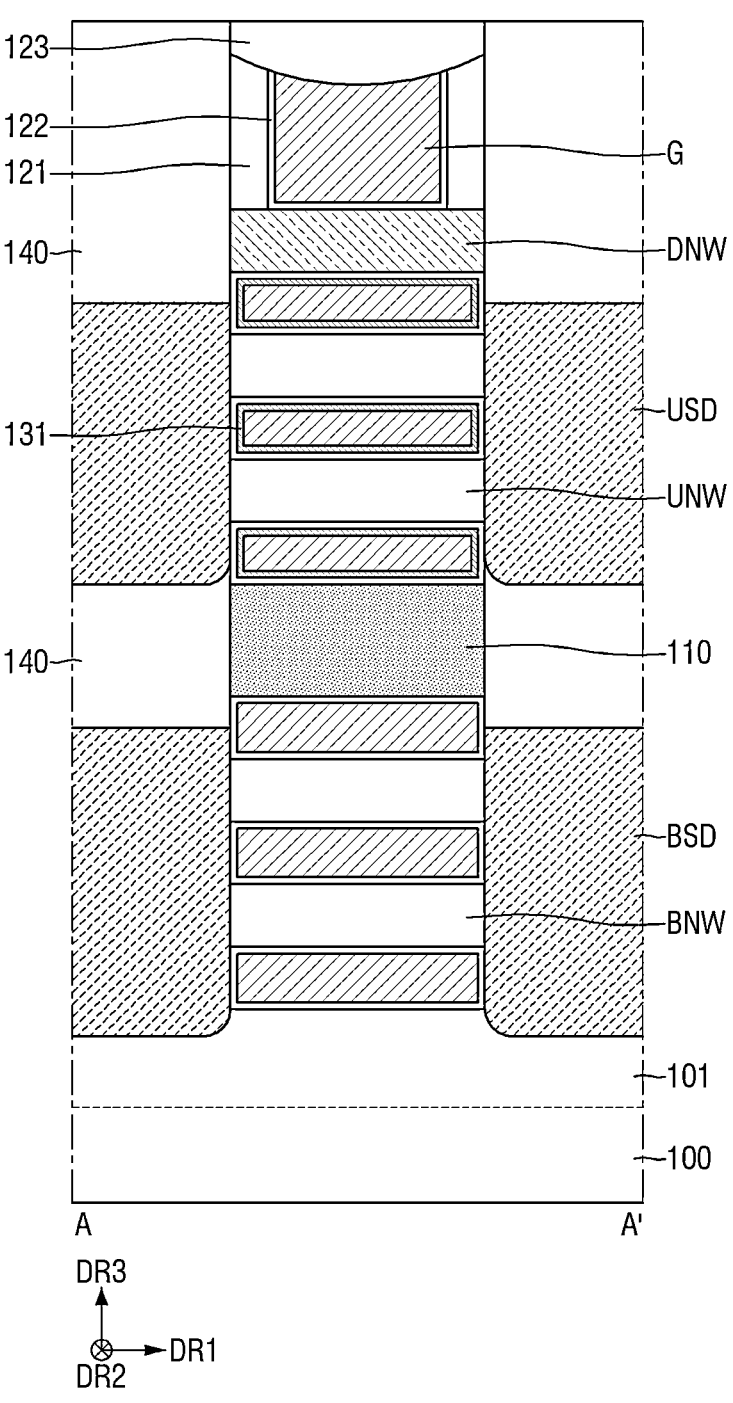
Figure 35:
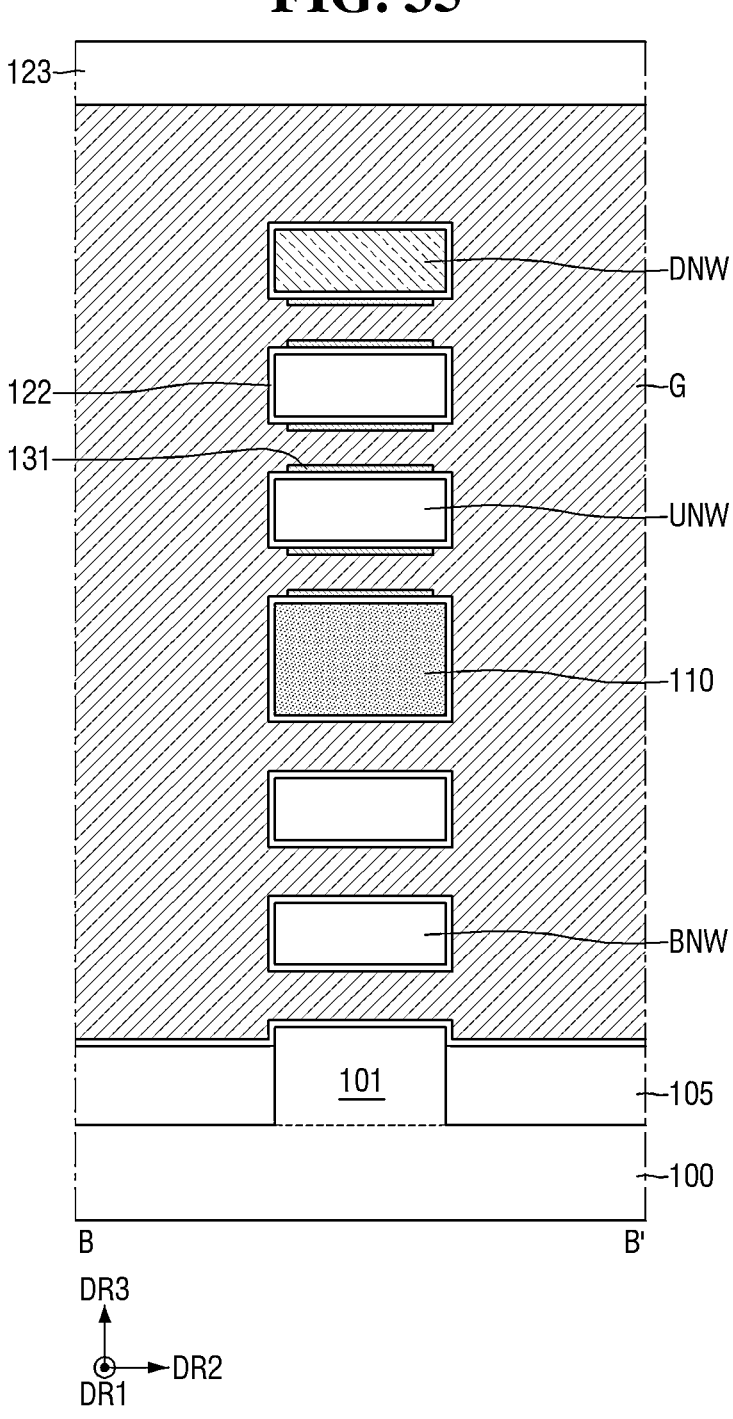

Referring to FIGS. 34 and 35, a gate electrode G may be formed on the gate insulating layer 122 and the first conductive layer 131. The gate electrode G may surround the plurality of lower nanosheets BNW, the separation layer 110, the plurality of upper nanosheets UNW, and the dummy nanosheet DNW. The gate electrode G may fill the inside of the gate trench GT. Thereafter, upper parts of the gate spacers 121, upper parts of the gate insulating layer 122, and an upper part of the gate electrode G may be etched. Thereafter, a capping pattern 123 may be formed on the gate spacers 121, the gate insulating layer 122, and the gate electrode G.

Referring back to FIGS. 2 and 3, a gate contact CB, which penetrates the capping pattern 123 in the vertical direction DR3 and is thus connected to the gate electrode G, may be formed. Thereafter, an etch stopper layer 150 and a second interlayer insulating layer 160 may be sequentially formed on the first interlayer insulating layer 140. Thereafter, a via V, which penetrates the second interlayer insulating layer 160 and the etch stopper layer 150 in the vertical direction DR3 and is thus connected to the gate contact CB, may be formed. In this manner, the semiconductor device of FIGS. 2 and 3 may be obtained.

A semiconductor device according to various example embodiments will hereinafter be described with reference to FIGS. 36 and 37. The semiconductor device of FIGS. 36 and 37 will hereinafter be described, focusing mainly on the differences with the semiconductor device of FIGS. 1 through 3.

Figure 36:
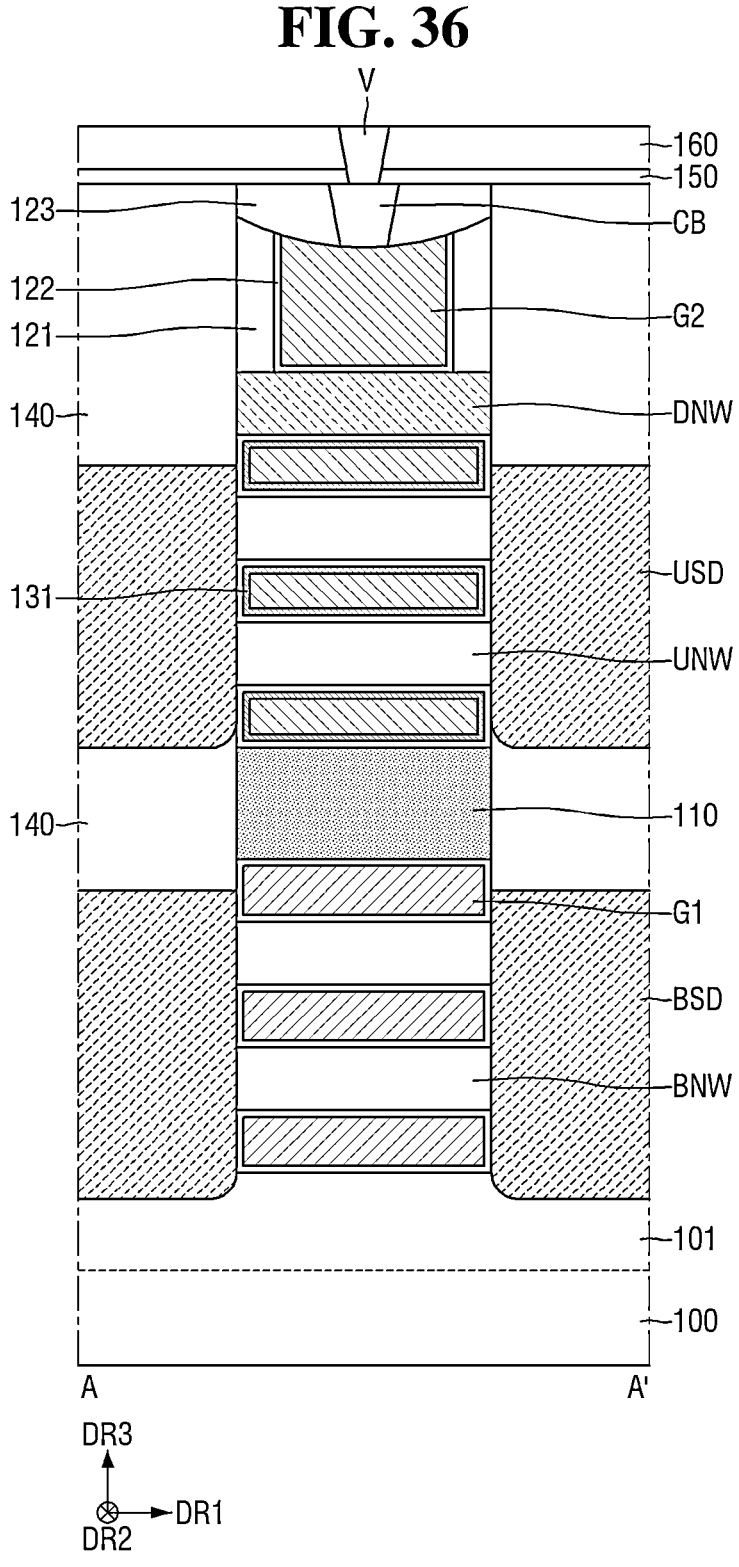
Figure 37:
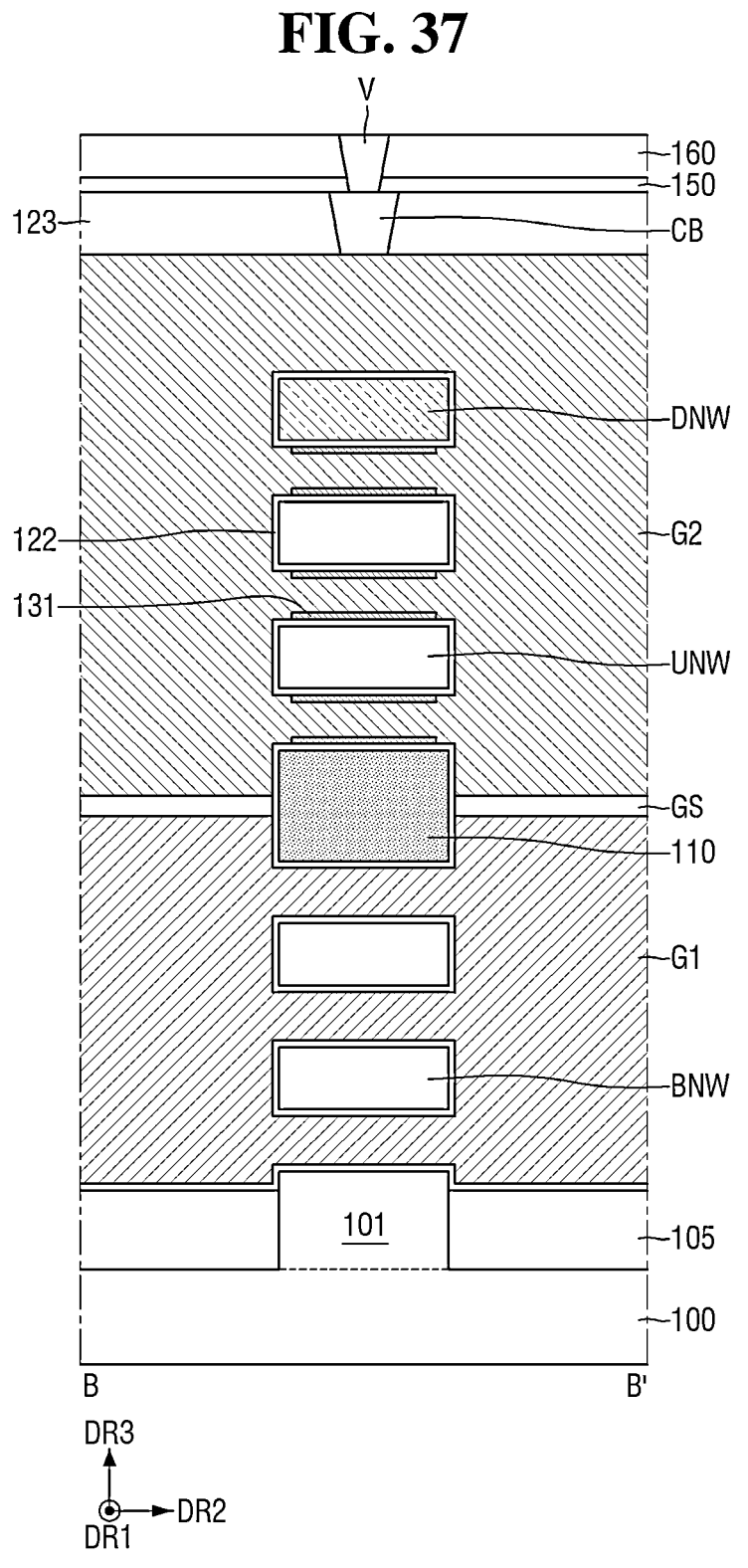

FIGS. 36 and 37 are cross-sectional views of a semiconductor device according to various example embodiments.

Referring to FIGS. 36 and 37, the semiconductor device may include first and second gate electrodes G1 and G2, which are spaced apart from each other in a vertical direction DR3.

For example, the first gate electrode G1 may surround a plurality of lower nanosheets BNW and a lower part of a separation layer 110. The second gate electrode G2 may be disposed on the first gate electrode G1. The second gate electrode G2 may be spaced apart from the first gate electrode G1 in the vertical direction DR3. The second gate electrode G2 may surround an upper part of the separation layer 110, a plurality of upper nanosheets UNW, and a dummy nanosheet DNW.

A gate separation layer GS may be disposed between the first and second gate electrodes G1 and G2. The gate separation layer GS may separate the first and second gate electrodes G1 and G2. The gate separation layer GS may include, for example, a conductive material, but example embodiments are not limited thereto. Alternatively or additionally, in some example embodiments, the gate separation layer GS may include an insulating material.

A semiconductor device according to various example embodiments will hereinafter be described with reference to FIGS. 38 and 39. The semiconductor device of FIGS. 38 and 39 will hereinafter be described, focusing mainly on the differences with the semiconductor device of FIGS. 1 through 3.

Figure 38:
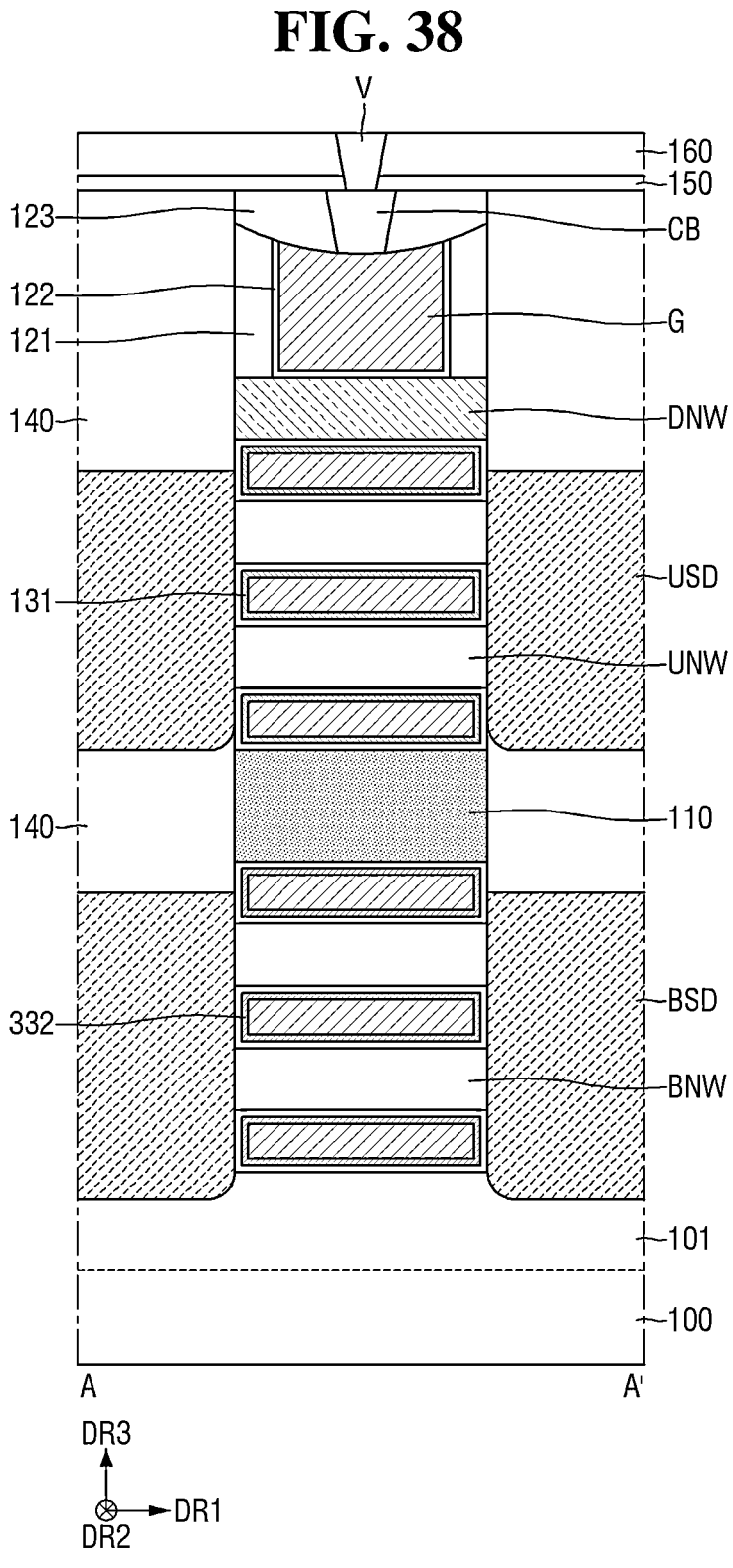
Figure 39:
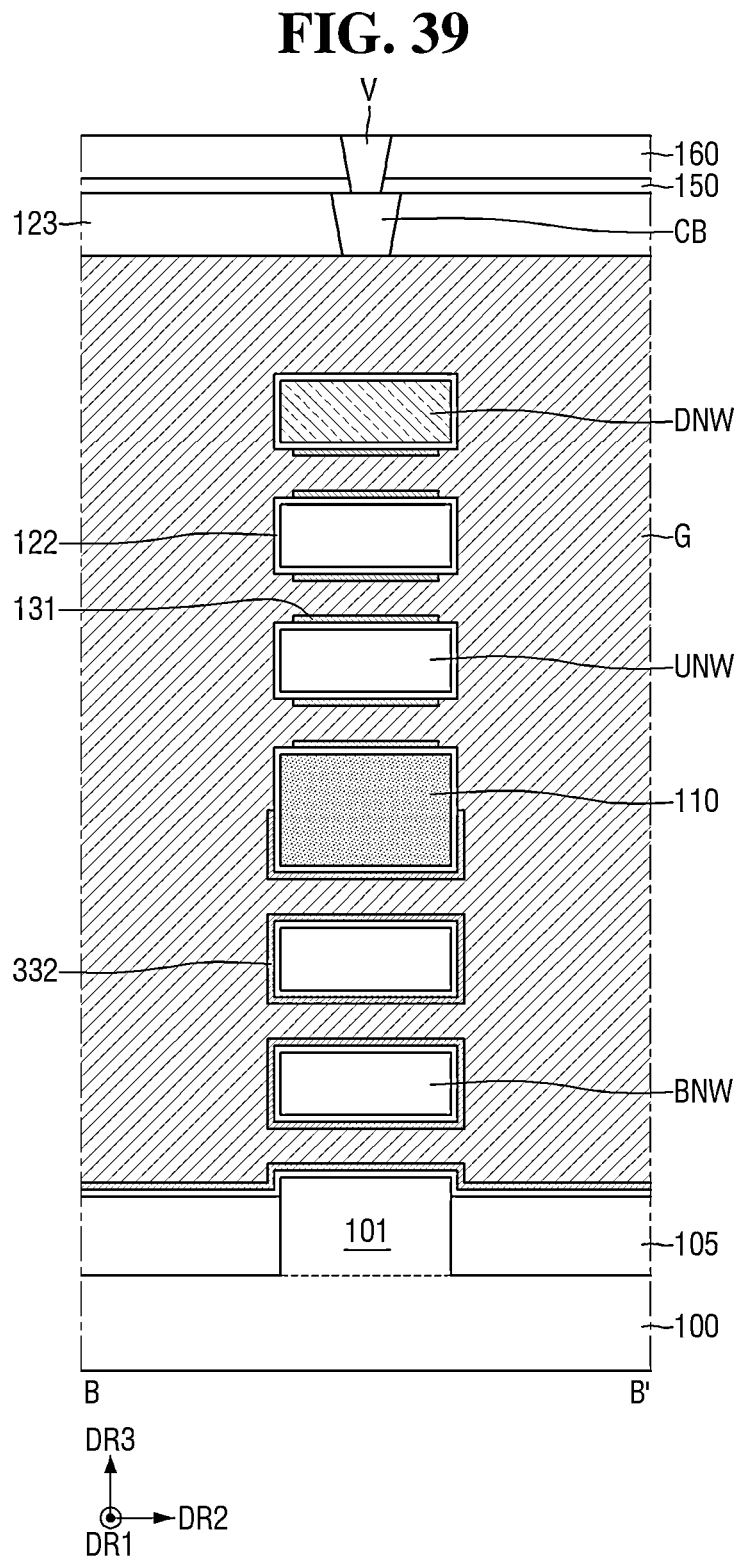

FIGS. 38 and 39 are cross-sectional views of a semiconductor device according to various example embodiments.

Referring to FIGS. 38 and 39, the semiconductor device may include a second conductive layer 332, which surround a plurality of lower nanosheets BNW.

For example, the second conductive layer 332 may be disposed between a gate electrode G and the plurality of lower nanosheets BNW. The second conductive layer 332 may be disposed between the gate electrode G and the bottom surface and lower parts of the sidewalls, in a second horizontal direction DR2, of a separation layer 110. For example, the second conductive layer 332 may not be disposed between the gate electrode G and the top surface and upper parts of the sidewalls, in the second horizontal direction DR2, of the separation layer 110. The second conductive layer 332 may not be disposed between the gate electrode G and a plurality of upper nanosheets UNW. The second conductive layer 332 may not be disposed between the gate electrode G and a dummy nanosheet DNW.

For example, the second conductive layer 332 may include a different material from a first conductive layer 131. The second conductive layer 332 may include at least one of, for example, TiN, TiON, TiAlN, TiAlC, and W.

A semiconductor device according to various example embodiments will hereinafter be described with reference to FIGS. 40 through 42. The semiconductor device of FIGS. 40 through 42 will hereinafter be described, focusing mainly on the differences with the semiconductor device of FIGS. 1 through 3.

Figure 40:
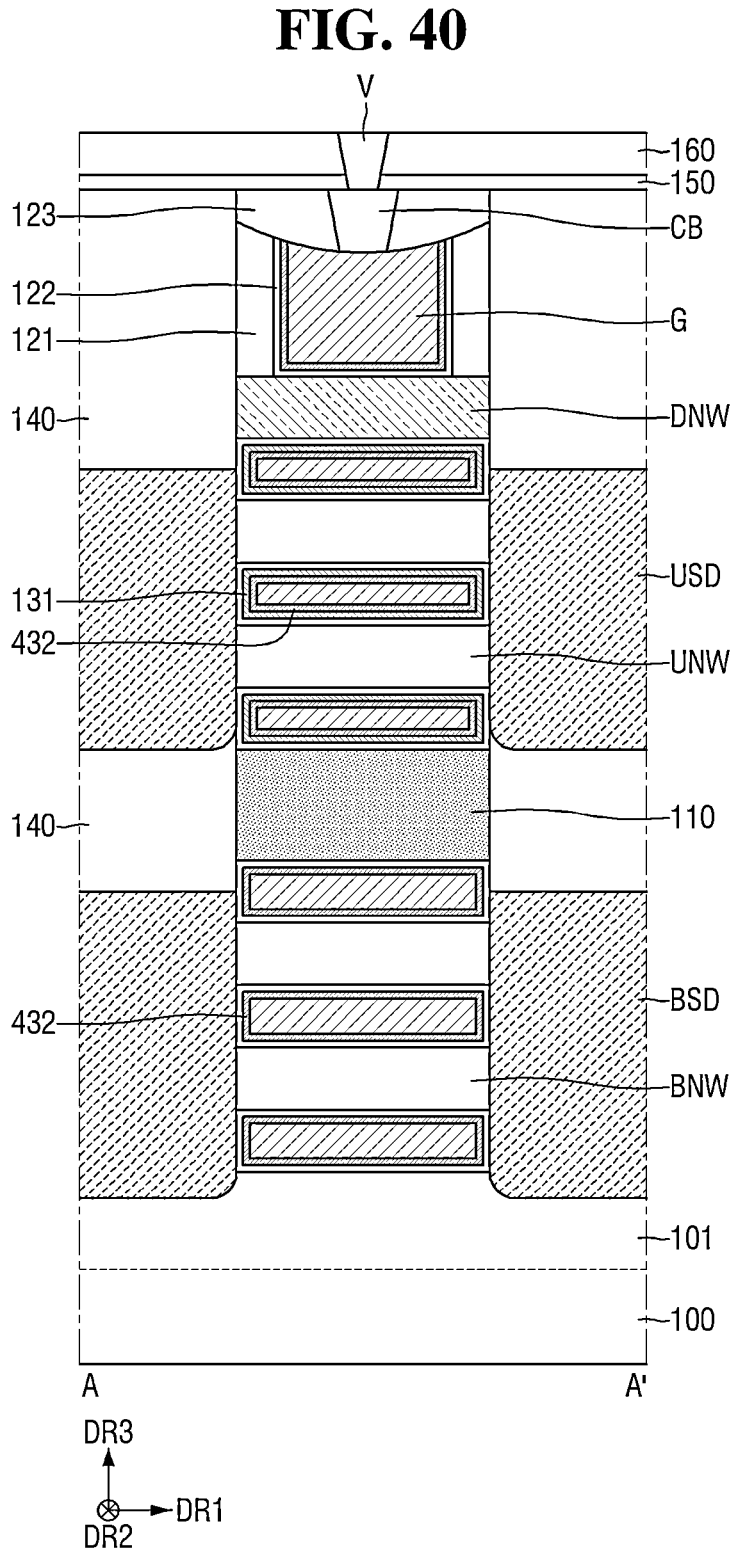
Figure 41:
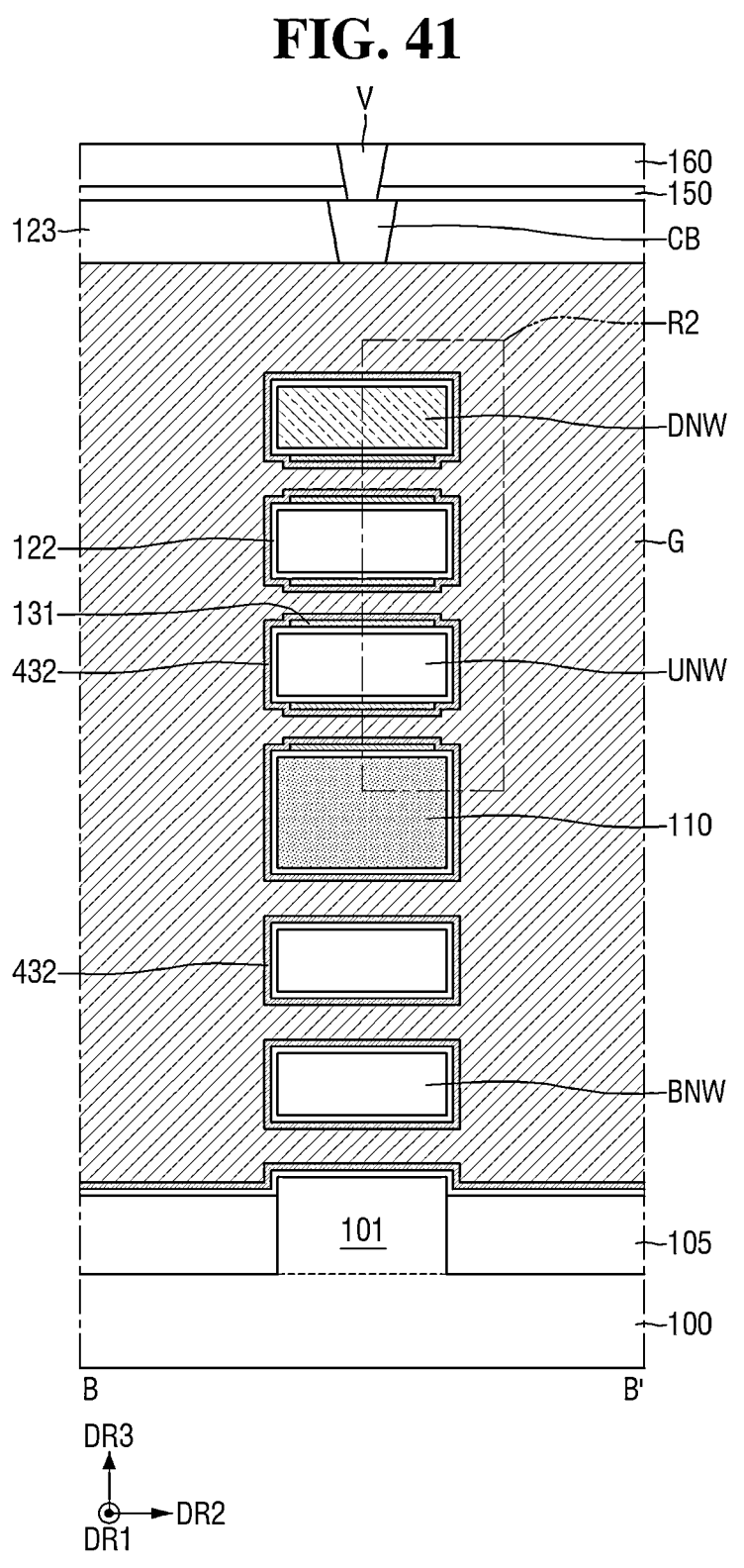

FIGS. 40 and 41 are cross-sectional views of a semiconductor device according to various example embodiments. FIG. 42 is an enlarged cross-sectional view of a region R2 of FIG. 41.

Figure 42:
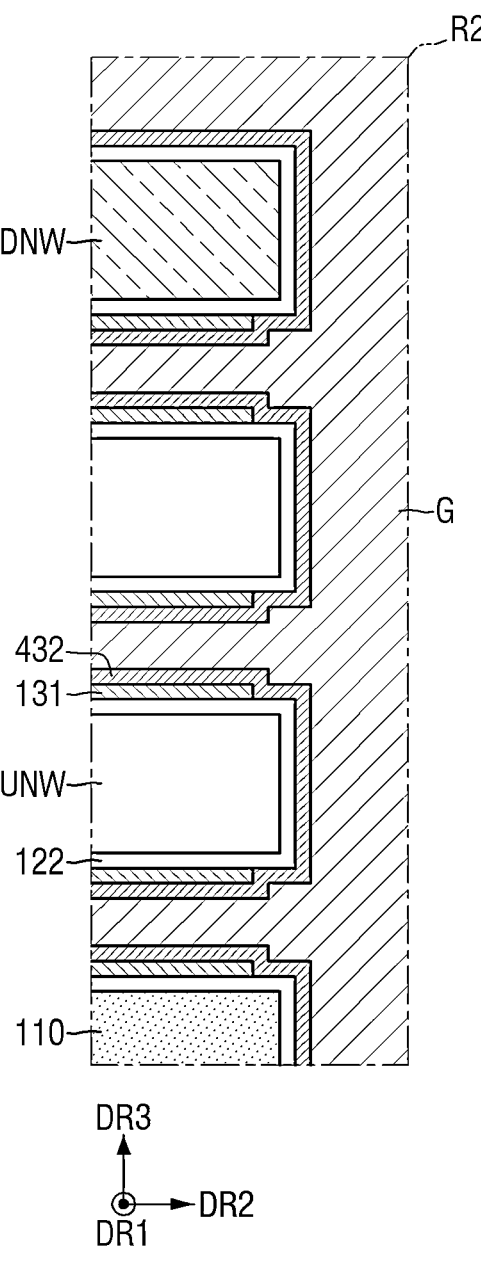
FIG. 42 is an enlarged cross-sectional view of a region R2 of FIG. 41.

Referring to FIGS. 40 through 42, the semiconductor device may include a second conductive layer 432, which surround a plurality of lower nanosheets BNW, a separation layer 110, a plurality of upper nanosheets UNW, and a dummy nanosheet DNW.

For example, the second conductive layer 432 may be disposed between a field insulating layer 105 and a gate electrode G. The second conductive layer 432 may be disposed between the gate electrode G and the plurality of lower nanosheets BNW. The second conductive layer 432 may be disposed between the gate electrode G and the bottom surface and the sidewalls, in a second horizontal direction DR2, of a separation layer 110. The second conductive layer 432 may be disposed between the gate electrode G and the sidewalls, in the second direction DR2, of each of the plurality of upper nanosheets UNW. The second conductive layer 432 may be disposed between the gate electrode G and the top surface and the sidewalls, in the second horizontal direction DR2, of the dummy nanosheet DNW. The second conductive layer 432 may be disposed between the gate electrode G and a first conductive layer 131.

In some example embodiments, the second conductive layer 432 may include the same material as the first conductive layer 131. The second conductive layer 432 may include at least one of, for example, LaO, $Al_2O_3$, ZrO, TiN, TiON, TiAlN, TiAlC, and W.

Alternatively or additionally, in some example embodiments, the second conductive layer 432 may include a different material from the first conductive layer 131. In this case, the first conductive layer 131 may include at least one of, for example, LaO, $Al_2O_3$, and ZrO, and the second conductive layer 432 may include at least one of, for example, TiN, TiON, TiAlN, TiAlC, and W.

A semiconductor device according to various example embodiments will hereinafter be described with reference to FIGS. 43 through 45. The semiconductor device of FIGS. 43 through 45 will hereinafter be described, focusing mainly on the differences with the semiconductor device of FIGS. 1 through 3.

Figure 43:
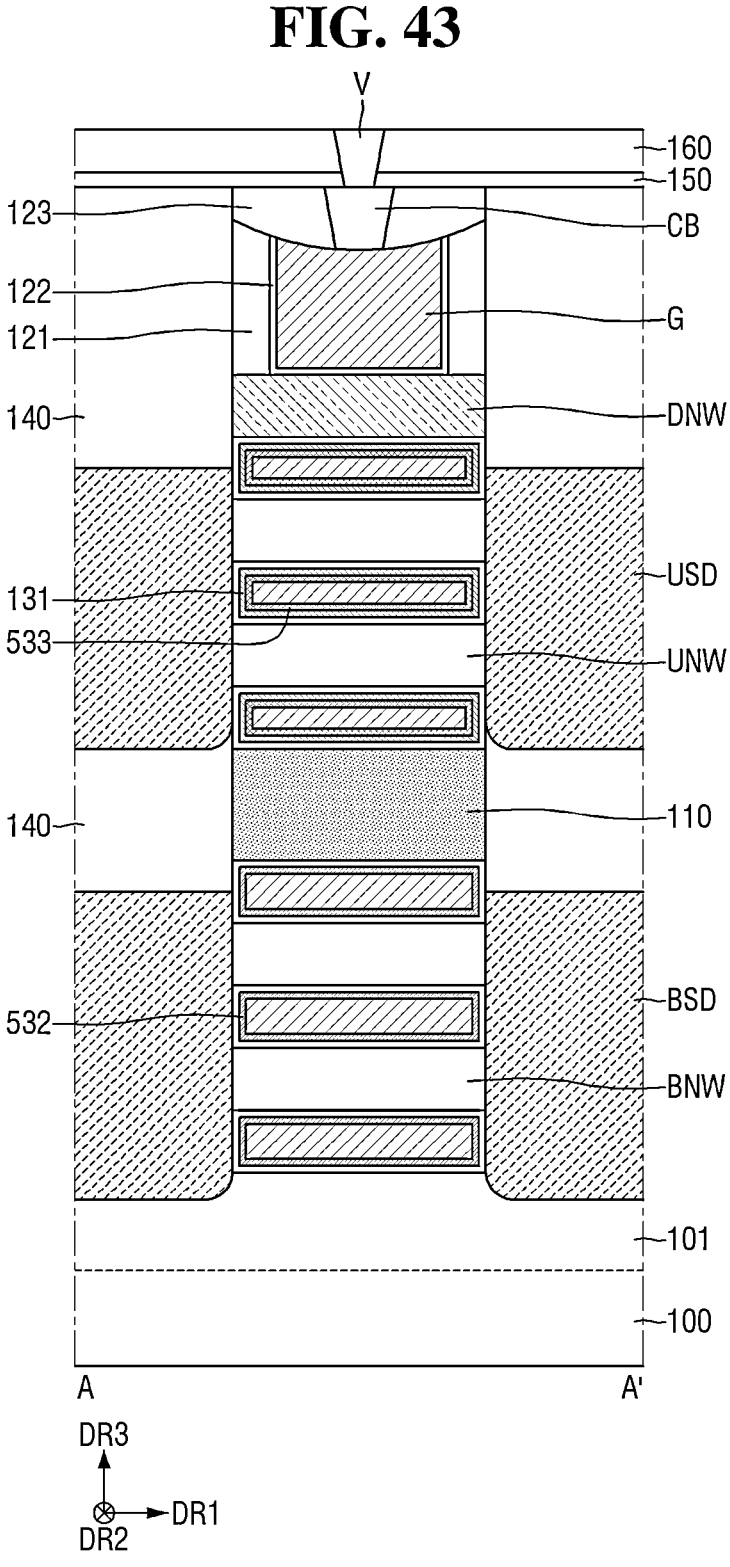
FIGS. 43 and 44 are cross-sectional views of a semiconductor device according to various example embodiments.
Figure 44:
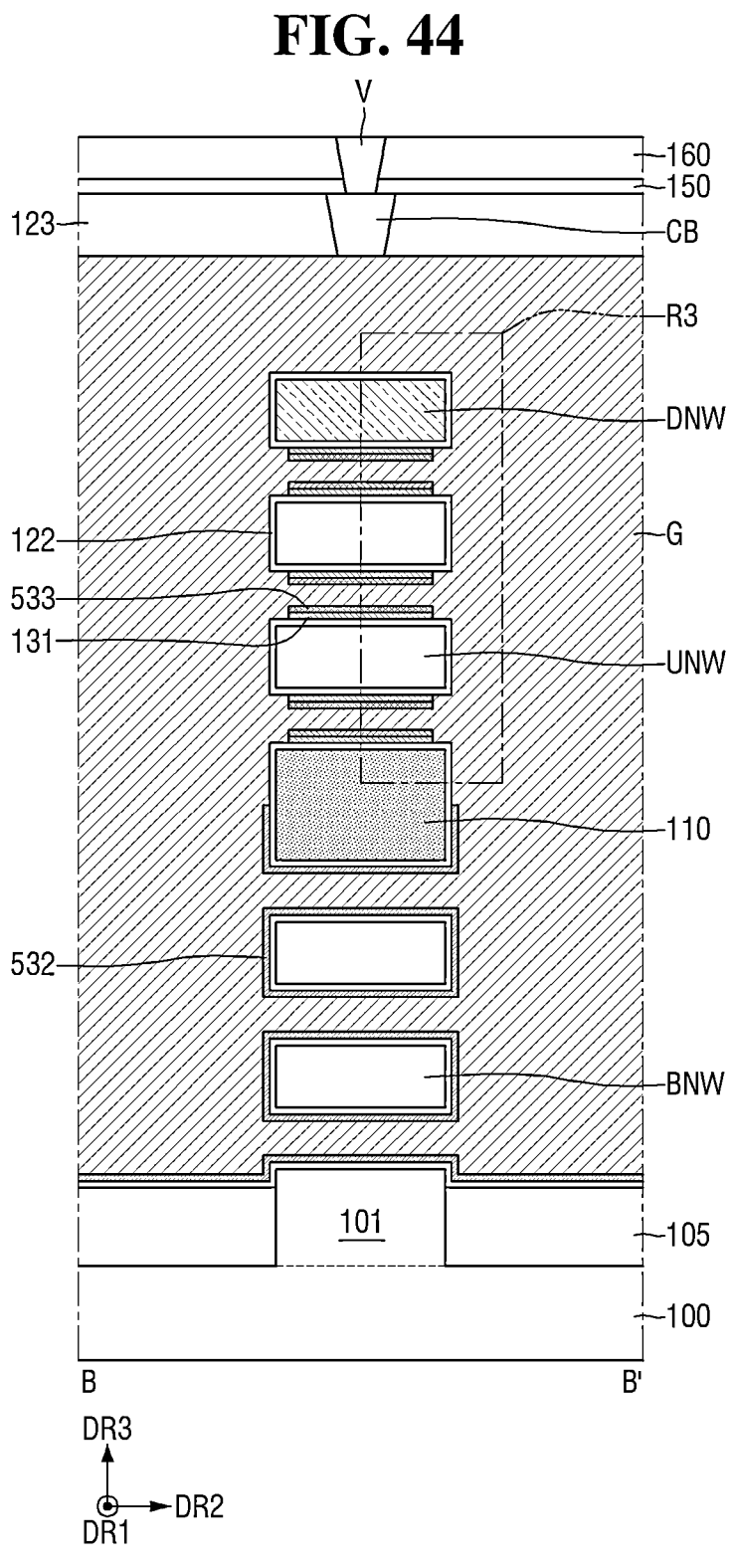

FIGS. 43 and 44 are cross-sectional views of a semiconductor device according to various example embodiments. FIG. 45 is an enlarged cross-sectional view of a region R3 of FIG. 44.

Figure 45:
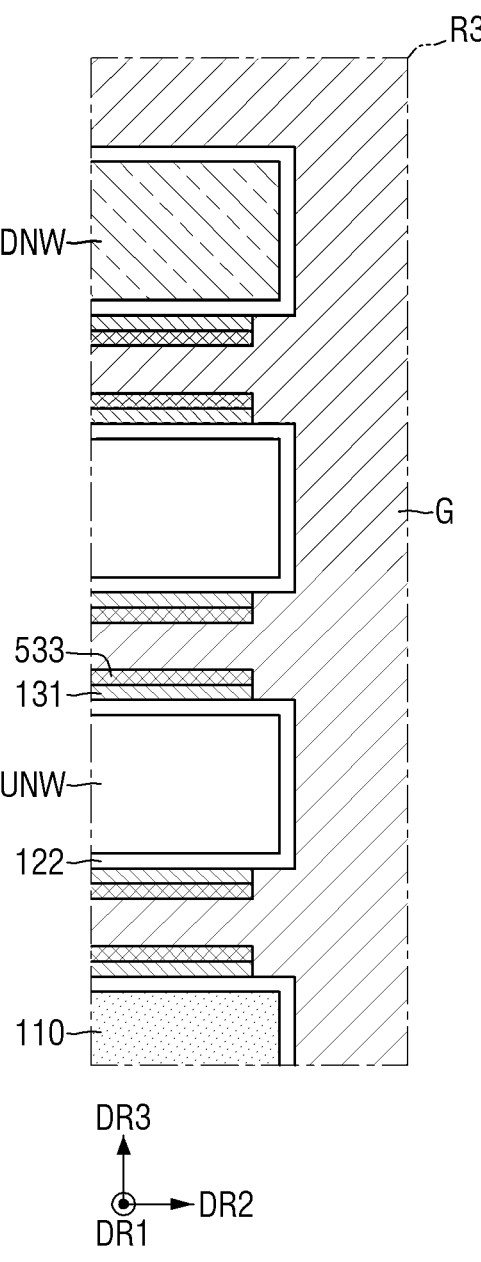
FIG. 45 is an enlarged cross-sectional view of a region R3 of FIG. 44.

Referring to FIGS. 43 through 45, the semiconductor device may include a second conductive layer 432, which surround a plurality of lower nanosheets BNW, and a third conductive layer 533, which are disposed on a first conductive layer 131.

For example, the second conductive layer 532 may be disposed between a field insulating layer 105 and a gate electrode G. The second conductive layer 532 may be disposed between the gate electrode G and the plurality of lower nanosheets BNW. The second conductive layer 532 may be disposed between the gate electrode G and the bottom surface and lower parts of the sidewalls, in a second horizontal direction DR2, of a separation layer 110. For example, the second conductive layer 532 may not be disposed between the gate electrode G and the top surface and upper parts of the sidewalls, in the second horizontal direction DR2, of the separation layer 110. The second conductive layer 532 may not be disposed between the gate electrode and a plurality of upper nanosheets UNW. The second conductive layer 532 may not be disposed between the gate electrode G and a dummy nanosheet DNW.

For example, the second conductive layer 432 may include a different material from the first conductive layer 131. The second conductive layer 432 may include at least one of, for example, TiN, TiON, TiAlN, TiAlC, and W.

For example, the third conductive layer 533 may be disposed between the gate electrode G and the first conductive layer 131. For example, the third conductive layer 533 may not be disposed between the gate electrode G and the plurality of lower nanosheets BNW. The third conductive layer 533 may not be disposed between the gate electrode G and the bottom surface and the sidewalls, in the second horizontal direction DR2, of the separation layer 110. The third conductive layer 533 may not be disposed between the gate electrode G and the sidewalls, in the second horizontal direction DR2, of each of the plurality of upper nanosheets UNW. The third conductive layer 533 may not be disposed between the gate electrode G and the top surface and the sidewalls, in the second horizontal direction DR2, of the dummy nanosheet DNW.

For example, the width, as measured in the second horizontal direction DR2, of the third conductive layer 533 may be less than the width, in the second horizontal direction DR2, of the plurality of upper nanosheets UNW. For example, both sidewalls, in the second horizontal direction DR2, of each of the third conductive layer 533 may be recessed from, e.g. may not be flush with, both sidewalls, in the second horizontal direction DR2, of each of the plurality of upper nanosheets UNW into the middle of the plurality of upper nanosheets UNW. For example, a gate insulating layer 122 may be in contact with the gate electrode G, on both sidewalls, in the second direction DR2, of each of the third conductive layer 533. The third conductive layer 533 may be in contact with the first conductive layer 131.

For example, the third conductive layer 533 may include a different material from the first conductive layer 131. In this case, the first conductive layer 131 may include at least one of, for example, LaO, $Al_2O_3$, and ZrO, and the third conductive layer 533 may include at least one of, for example, TiN, TiON, TiAlN, TiAlC, and W.

A semiconductor device according to various example embodiments will hereinafter be described with reference to FIGS. 46 through 48. The semiconductor device of FIGS. 46 through 48 will hereinafter be described, focusing mainly on the differences with the semiconductor device of FIGS. 1 through 3.

Figure 46:
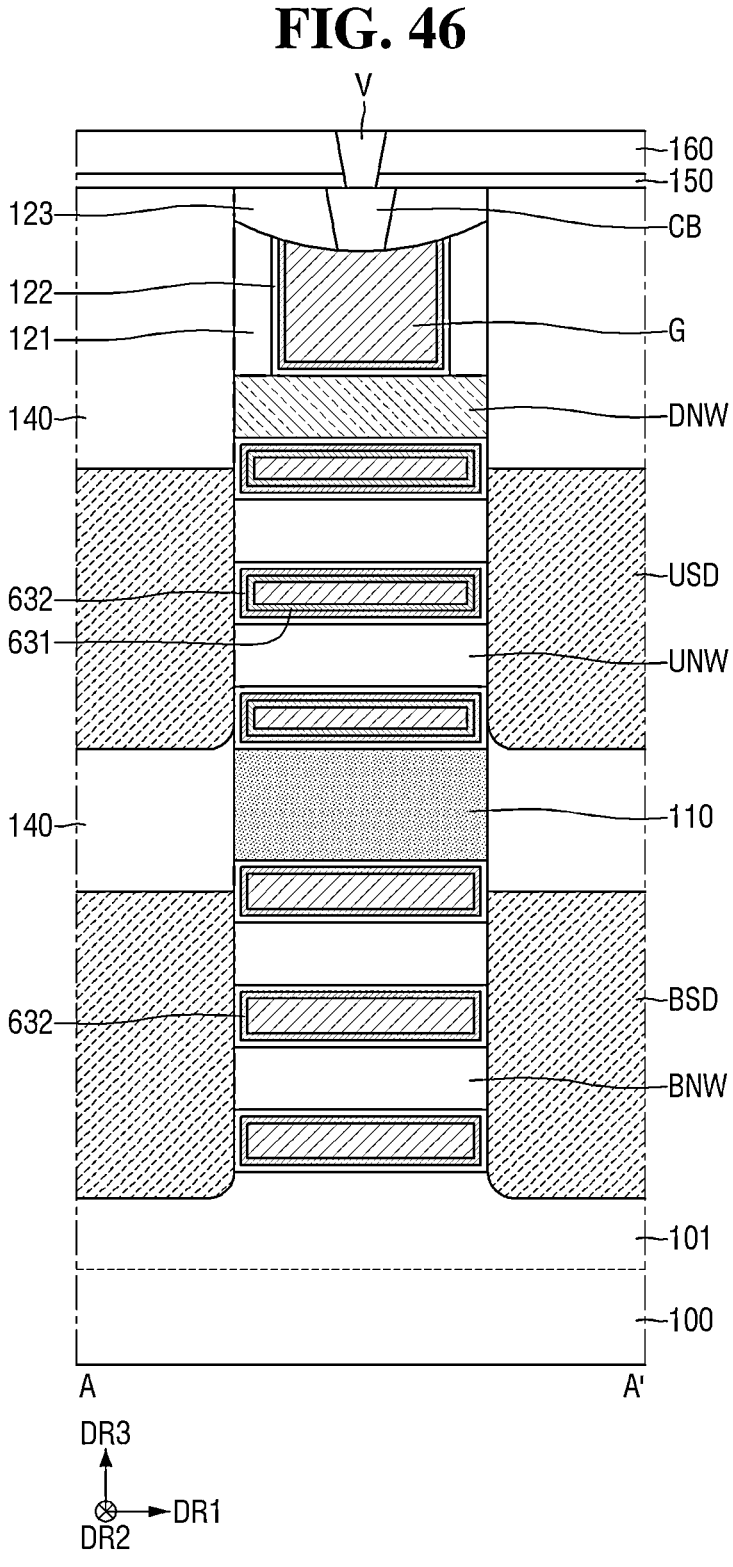
FIGS. 46 and 47 are cross-sectional views of a semiconductor device according to various example embodiments.
Figure 47:
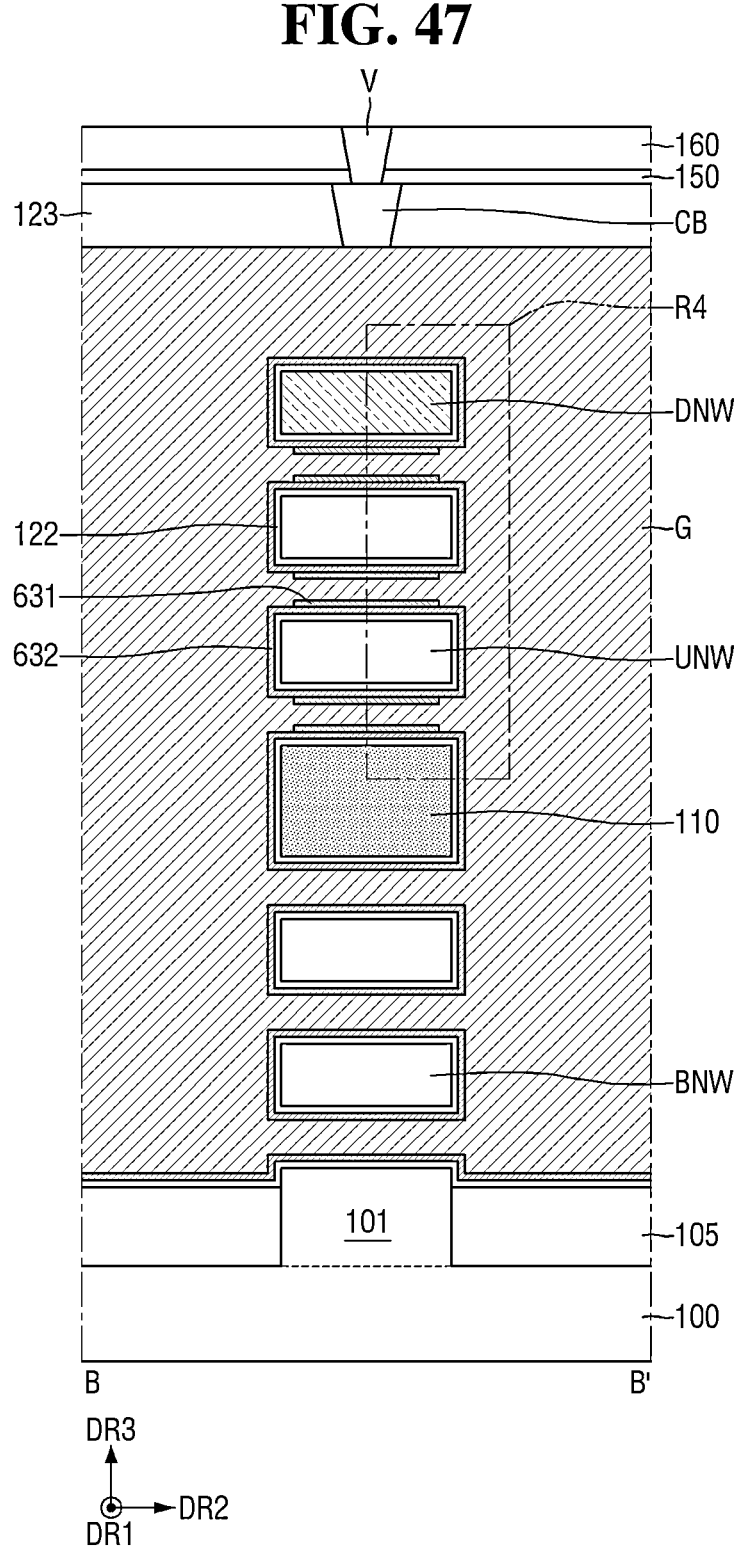

FIGS. 46 and 47 are cross-sectional views of a semiconductor device according to various example embodiments. FIG. 48 is an enlarged cross-sectional view of a region R4 of FIG. 47.

Figure 48:
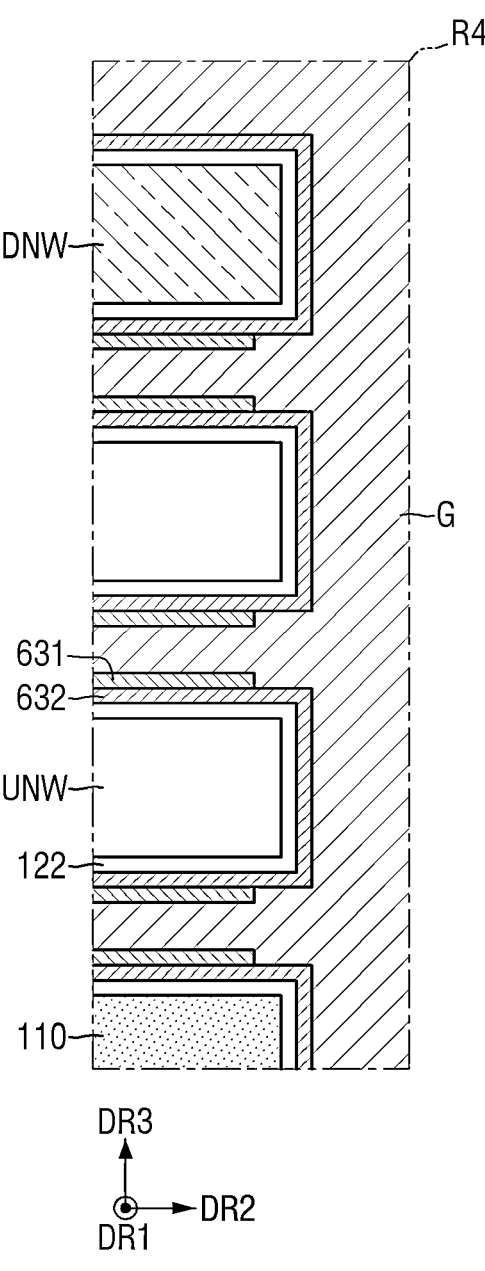
FIG. 48 is an enlarged cross-sectional view of a region R4 of FIG. 47.

Referring to FIGS. 46 through 48, the semiconductor device may include a second conductive layer 632, which surround a plurality of lower nanosheets BNW, a separation layer 110, a plurality of upper nanosheets UNW, and a dummy nanosheet DNW.

For example, the second conductive layer 632 may be disposed between a gate electrode G, a field insulating layer 105, the plurality of lower nanosheets BNW, the separation layer 110, the plurality of upper nanosheets UNW, and the dummy nanosheet DNW. A first conductive layer 631 may be disposed on the second conductive layer 632, on the top surface of the separation layer 110. For example, the second conductive layer 632 may be disposed between a gate insulating layer 122 and the first conductive layer 631, on the top surface of the separation layer 110. The first conductive layer 631 may be disposed on the second conductive layer 632, on the top surface and the bottom surface of the plurality of upper nanosheets UNW. That is, the second conductive layer 632 may be disposed between the gate insulating layer 122 and the first conductive layer 631, on the top surface and the bottom surface of the plurality of upper nanosheets UNW. The first conductive layer 631 may be disposed on the second conductive layer 632, on the bottom surface of the dummy nanosheet DNW. For example, the second conductive layer 632 may be disposed between the gate insulating layer 122 and the first conductive layer 631, on the bottom surface of the dummy nanosheet DNW.

For example, the first conductive layer 631 may include the same material as their counterpart of any one of previous example embodiments. The second conductive layer 632 may include a different material from the first conductive layer 631. The second conductive layer 632 may include at least one of, for example, TiN, TION, TiAlN, TiAlC, and W.

A semiconductor device according to various example embodiments will hereinafter be described with reference to FIGS. 49 through 51. The semiconductor device of FIGS. 49 through 51 will hereinafter be described, focusing mainly on the differences with the semiconductor device of FIGS. 1 through 3.

Figure 49:
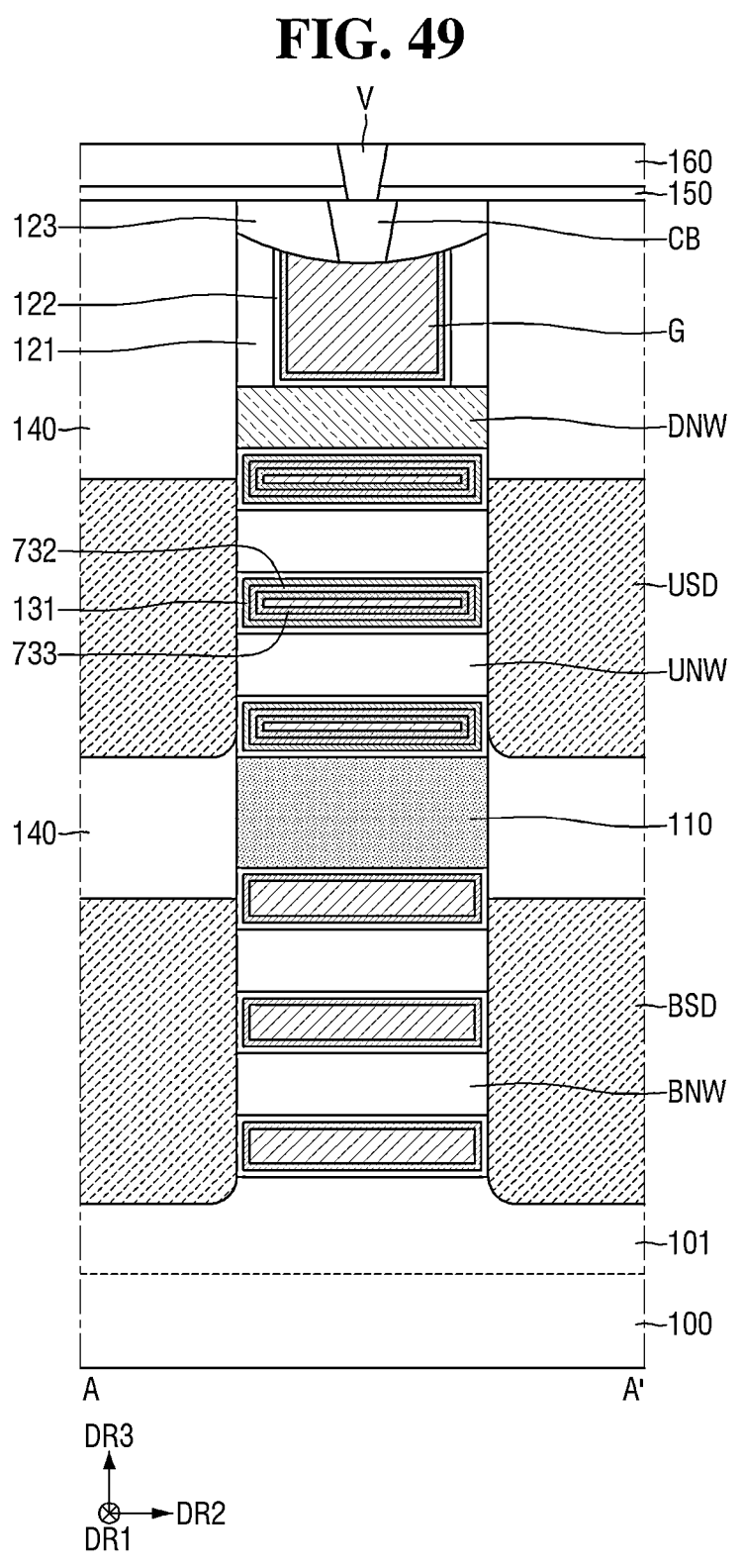
Figure 50:
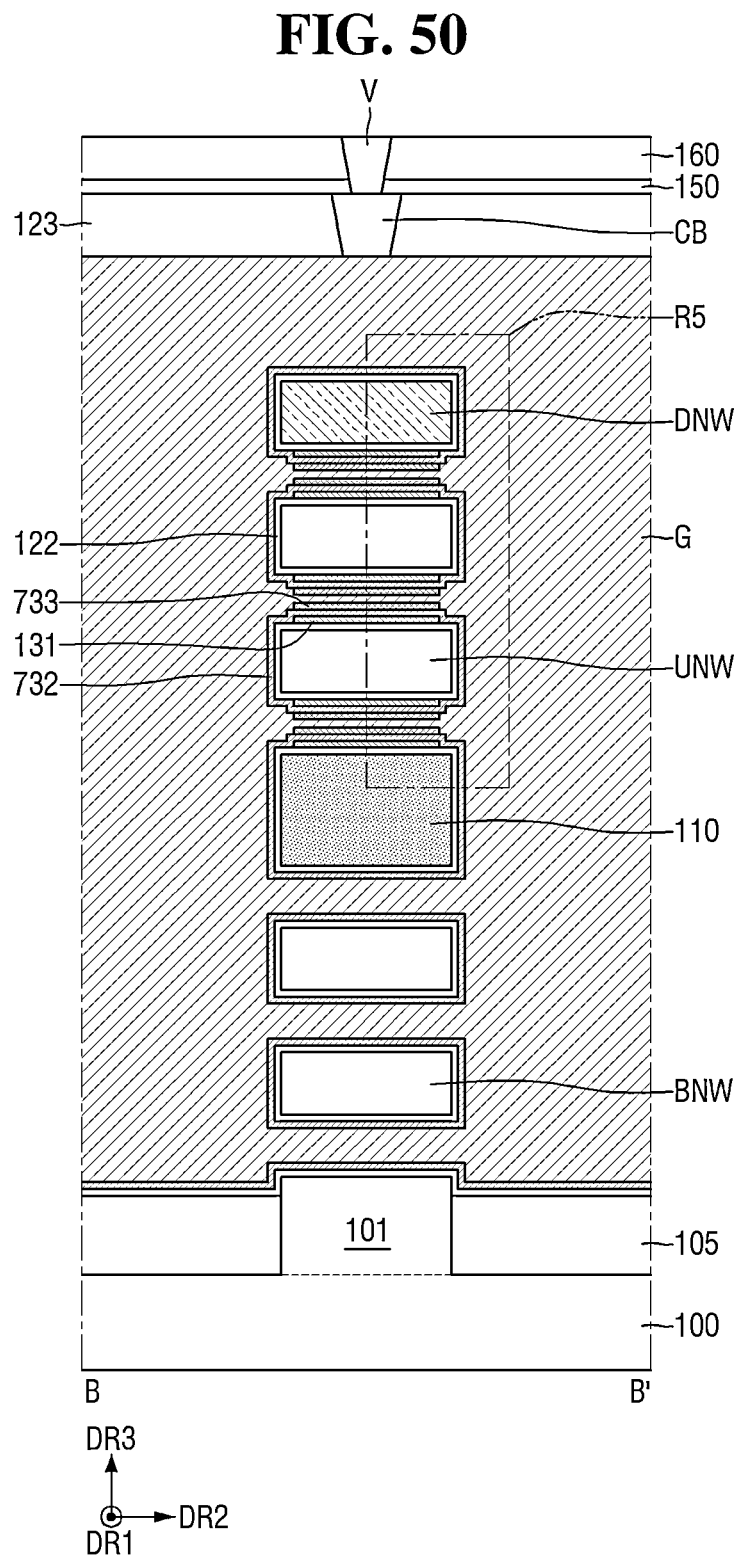

FIGS. 49 and 50 are cross-sectional views of a semiconductor device according to various example embodiments. FIG. 51 is an enlarged cross-sectional view of a region R5 of FIG. 50.

Figure 51:
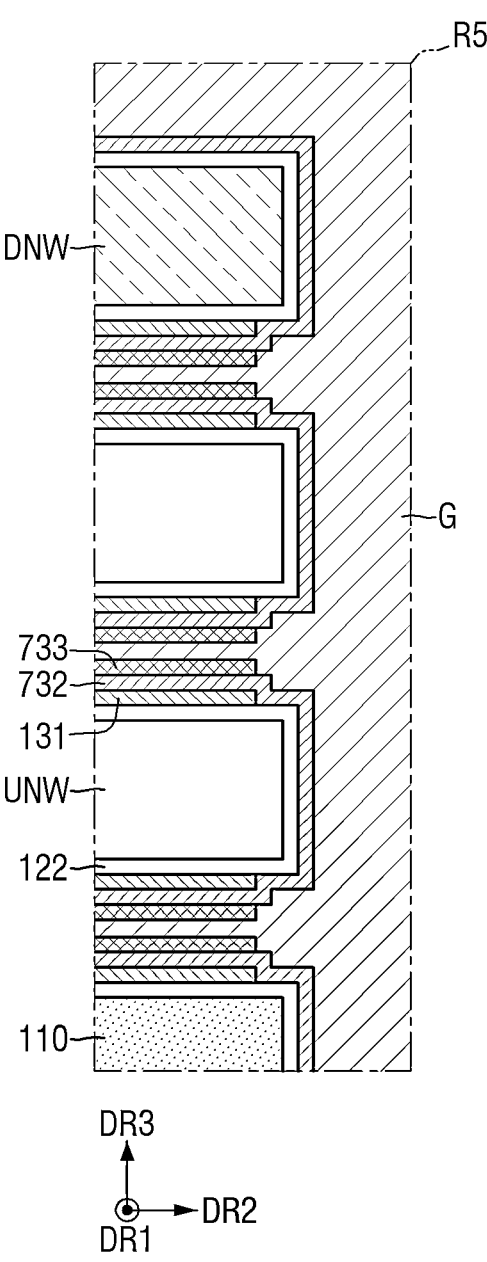
FIG. 51 is an enlarged cross-sectional view of a region R5 of FIG. 50.

Referring to FIGS. 49 through 51, the semiconductor device may include a second conductive layer 732, which surround a plurality of nanosheets BNW, a separation layer 110, a plurality of upper nanosheets UNW, and a dummy nanosheet DNW, and a third conductive layer 733, which are disposed on the second conductive layer 732.

For example, the second conductive layer 732 may be disposed between a field insulating layer 105 and a gate electrode G. The second conductive layer 732 may be disposed between the gate electrode G and the plurality of lower nanosheets BNW. The second conductive layer 732 may be disposed between the gate electrode G and the bottom surface and the sidewalls, in a second horizontal direction DR2, of the separation layer 110. The second conductive layer 732 may be disposed between the gate electrode G and the sidewalls, in the second horizontal direction DR2, of each of the plurality of upper nanosheets UNW. The second conductive layer 732 may be disposed between the gate electrode G and the top surface and the sidewalls, in the second horizontal direction DR2, of the dummy nanosheet DNW. The second conductive layer 732 may be disposed between the gate electrode G and a first conductive layer 131.

For example, the second conductive layer 732 may include a different material from the first conductive layer 131. The second conductive layer 732 may include at least one of, for example, TiN, TION, TiAlN, TiAlC, and W.

For example, the third conductive layer 733 may be disposed between the gate electrode G and the second conductive layer 732, on the top surface of the separation layer 110. That is, the second conductive layer 732 may be disposed between the first conductive layer 131 and the third conductive layer 733, on the top surface of the separation layer 110. The third conductive layer 733 may be disposed between the gate electrode G and the second conductive layer 732, on the top surface and the bottom surface of the plurality of upper nanosheets UNW. That is, the second conductive layer 732 may be disposed between the first conductive layer 131 and the third conductive layer 733, on the top surface and the bottom surface of the plurality of upper nanosheets UNW. The third conductive layer 733 may be disposed between the gate electrode G and the second conductive layer 732, on the bottom surface of the dummy nanosheet DNW. That is, the second conductive layer 732 may be disposed between the first conductive layer 131 and the third conductive layer 733, on the bottom surface of the dummy nanosheet DNW.

For example, the third conductive layer 733 may not be disposed between the gate electrode G and the plurality of lower nanosheets BNW. The third conductive layer 733 may not be disposed between the gate electrode G and the bottom surface and the sidewalls, in the second horizontal direction DR2, of the separation layer 110. The third conductive layer 733 may not be disposed between the gate electrode G and the sidewalls, in the second horizontal direction DR2, of each of the plurality of upper nanosheets UNW. The third conductive layer 733 may not be disposed between the gate electrode G and the top surface and the sidewalls, in the second horizontal direction DR2, of the dummy nanosheet DNW.

For example, the width, as measured in the second horizontal direction DR2, of the third conductive layer 733 may be less than the width, in the second horizontal direction DR2, of the plurality of upper nanosheets UNW. For example, both sidewalls, in the second horizontal direction DR2, of each of the third conductive layer 733 may be recessed from both sidewalls, in the second horizontal direction DR2, of each of the plurality of upper nanosheets UNW into the middle of the plurality of upper nanosheets UNW. For example, the second conductive layer 732 may be in contact with the gate electrode G, on both sidewalls, in the second direction DR2, of each of the third conductive layer 733. The third conductive layer 733 may be in contact with the second conductive layer 732.

For example, the third conductive layer 733 may include a different material from the first conductive layer 131. In this case, the first conductive layer 131 may include at least one of, for example, LaO, $Al_2O_3$, and ZrO, and the third conductive layer 733 may include at least one of, for example, TiN, TION, TiAlN, TiAlC, and W.

A semiconductor device according to various example embodiments will hereinafter be described with reference to FIGS. 52 and 53. The semiconductor device of FIGS. 52 and 53 will hereinafter be described, focusing mainly on the differences with the semiconductor device of FIGS. 1 through 3.

Figure 52:
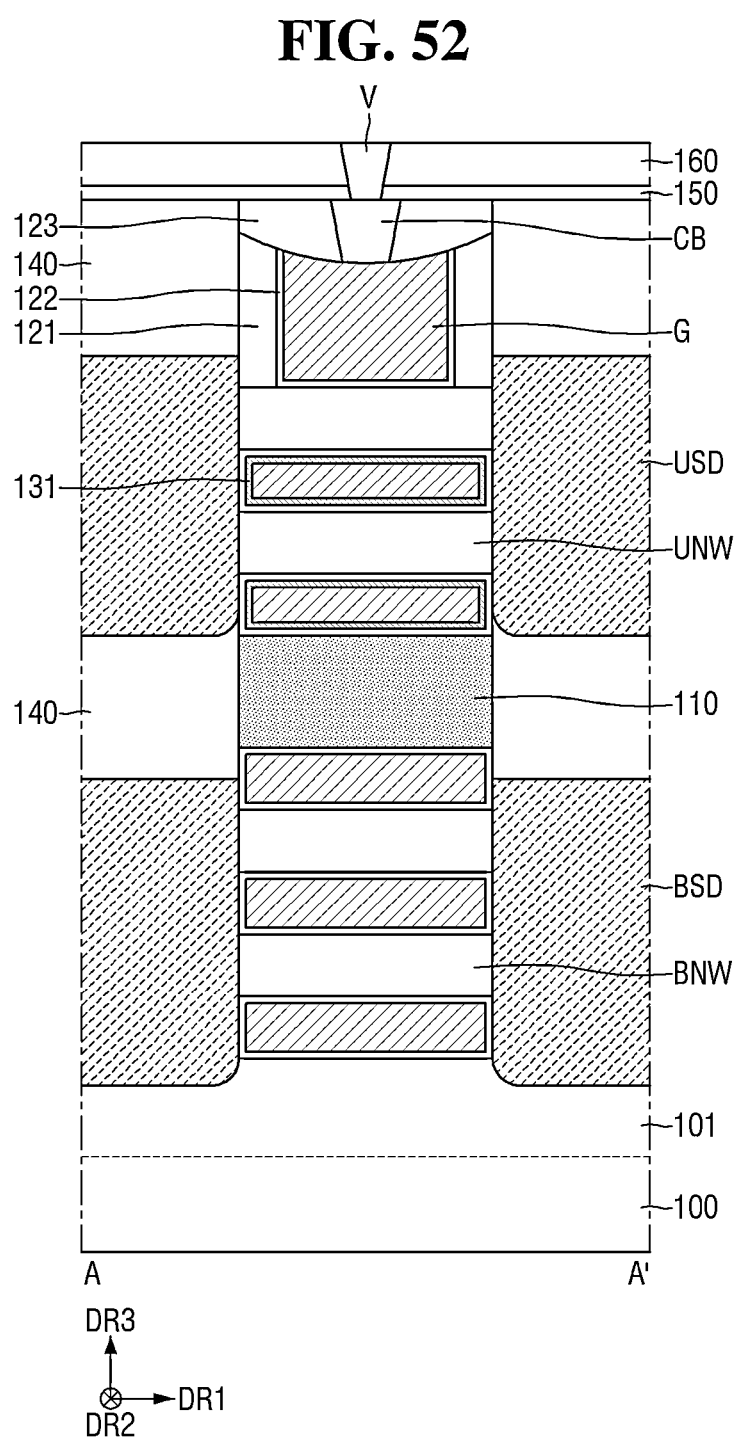
Figure 53:
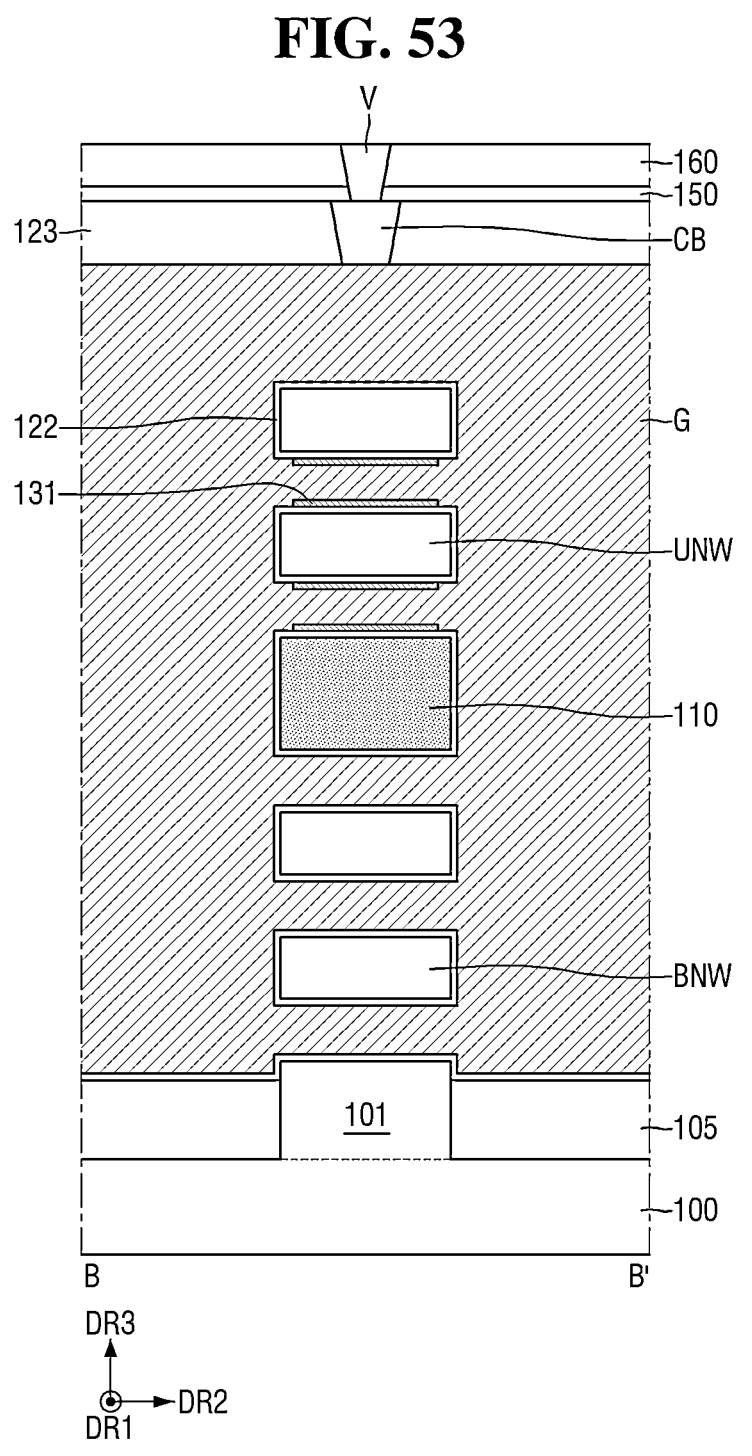

FIGS. 52 and 53 are cross-sectional views of a semiconductor device according to various example embodiments.

Referring to FIGS. 52 and 53, a dummy nanosheet (DNW of FIGS. 2 and 3) may not be disposed on a plurality of upper nanosheets UNW.

For example, gate spacers 121 may be in contact with the top surface of an uppermost upper nanosheet UNW. A first conductive layer 131 may be disposed between a gate electrode G and the top surface of a separation layer 110. The first conductive layer 131 may be disposed between the gate electrode G and the top surface and the bottom surface of the plurality of upper nanosheets UNW. However, the first conductive layer 131 may not be disposed on the top surface of the uppermost upper nanosheet UNW.

Various example embodiments have been described above with reference to the accompanying drawings, but example embodiments are not limited thereto and may be implemented in various different forms. It will be understood that the example embodiments may be implemented in other specific forms without changing the technical spirit and/or the gist of inventive concepts. Therefore, it should be understood that various example embodiments set forth herein are illustrative in all respects and not limiting. Furthermore example embodiments are not necessarily mutually exclusive with one another. For example, some example embodiments may include one or more features described with reference to one or more drawings, and may also include one or more other features described with reference to one or more other drawings.

What is claimed is:

1. A semiconductor device comprising:
an active pattern extending in a first horizontal direction on a substrate;
a plurality of lower nanosheets stacked on the active pattern to be spaced apart from one another in a vertical direction;
a separation layer on the plurality of lower nanosheets;
a plurality of upper nanosheets stacked on the separation layer to be spaced apart from one another in the vertical direction;
a gate electrode on the active pattern and extending in a second horizontal direction, which is different from the first horizontal direction, the gate electrode surrounding each of the plurality of lower nanosheets, the separation layer, and the plurality of upper nanosheets; and
a first conductive layer between the gate electrode and each of a top surface of and a bottom surface of the plurality of upper nanosheets, the first conductive layer is not between the gate electrode and sidewalls in the second horizontal direction of the plurality of upper nanosheets.

2. The semiconductor device of claim 1, wherein the first conductive layer is not between the gate electrode and the plurality of lower nanosheets.

3. The semiconductor device of claim 1, further comprising:
a dummy nanosheet spaced apart from the plurality of upper nanosheets in the vertical direction and surrounded by the gate electrode, the dummy nanosheet including an insulating material.

4. The semiconductor device of claim 3, wherein the first conductive layer is between the gate electrode and a bottom surface of the dummy nanosheet, the first conductive layer is not between the gate electrode and a top surface of the dummy nanosheet.

5. The semiconductor device of claim 1, wherein the first conductive layer is between the gate electrode and a top surface of the separation layer.

6. The semiconductor device of claim 1, wherein a width, in the second horizontal direction, of the first conductive layer is less than a width, in the second horizontal direction, of the plurality of upper nanosheets.

7. The semiconductor device of claim 1, wherein the gate electrode includes a lower gate electrode surrounding the plurality of lower nanosheets on the active pattern, and an upper gate electrode spaced apart from the lower gate electrode in the vertical direction and surrounding the plurality of upper nanosheets.

8. The semiconductor device of claim 1, further comprising:
a second conductive layer between the gate electrode and the plurality of lower nanosheets, the second conductive layer not between the gate electrode and the plurality of upper nanosheets.

9. The semiconductor device of claim 8, further comprising:
a third conductive layer between the gate electrode and the first conductive layer, the third conductive layer not between the gate electrode and the sidewalls in the second horizontal direction of each of the plurality of upper nanosheets.

10. The semiconductor device of claim 1, further comprising:
a second conductive layer between the gate electrode and the plurality of lower nanosheets and between the gate electrode and the plurality of upper nanosheets,
wherein the first conductive layer is between the plurality of upper nanosheets and the second conductive layer.

11. The semiconductor device of claim 1, further comprising:
a gate insulating layer between the gate electrode and each of the plurality of lower nanosheets, the separation layer, and the plurality of upper nanosheets,
wherein the first conductive layer is between the gate electrode and the gate insulating layer.

12. The semiconductor device of claim 11, wherein the gate insulating layer between the gate electrode and the plurality of lower nanosheets is in contact with the gate electrode.

13. A semiconductor device comprising:
an active pattern on a substrate and extending in a first horizontal direction;
a plurality of lower nanosheets stacked on the active pattern to be spaced apart from one another in a vertical direction;
a separation layer on the plurality of lower nanosheets;
a plurality of upper nanosheets stacked on the separation layer to be spaced apart from one another in the vertical direction;
a dummy nanosheet spaced apart from the plurality of upper nanosheets in the vertical direction, the dummy nanosheet including an insulating material;
a gate electrode on the active pattern and extending in a second horizontal direction, which is different from the first horizontal direction, the gate electrode surrounding each of the plurality of lower nanosheets, the separation layer, the plurality of upper nanosheets, and the dummy nanosheet; and
a first conductive layer disposed between the gate electrode and each of a top surface and a bottom surface of the plurality of upper nanosheets, the first conductive layer not between the gate electrode and the plurality of lower nanosheets.

14. The semiconductor device of claim 13, wherein sidewalls of the dummy nanosheet in the second horizontal direction are aligned in the vertical direction with sidewalls of the plurality of upper nanosheets in the second horizontal direction.

15. The semiconductor device of claim 13, wherein the first conductive layer is between the gate electrode and a bottom surface of the dummy nanosheet, the first conductive layer is not between the gate electrode and a top surface of the dummy nanosheet.

16. The semiconductor device of claim 13, wherein a width, in the second horizontal direction, of the first conductive layer is less than a width, in the second horizontal direction, of the plurality of upper nanosheets.

17. The semiconductor device of claim 13, further comprising:

a second conductive layer between the gate electrode and the plurality of lower nanosheets, the second conductive layer not between the gate electrode and the plurality of upper nanosheets.

18. The semiconductor device of claim 13, further comprising:

a second conductive layer between the gate electrode and the plurality of lower nanosheets, between the gate electrode and sidewalls in the second horizontal direction of the plurality of upper nanosheets, and between the gate electrode and the first conductive layer.

19. The semiconductor device of claim 18, further comprising:

a third conductive layer between the gate electrode and the second conductive layer on each of the top surface and the bottom surface of the plurality of upper nanosheets, the third conductive layer not between the gate electrode and the sidewalls in the second horizontal direction of the plurality of upper nanosheets.

20. A semiconductor device comprising:

an active pattern extending in a first horizontal direction on a substrate;

a plurality of lower nanosheets stacked on the active pattern to be spaced apart from one another in a vertical direction;

a separation layer on the plurality of lower nanosheets;

a plurality of upper nanosheets stacked on the separation layer to be spaced apart from one another in the vertical direction;

a dummy nanosheet spaced apart from the plurality of upper nanosheets in the vertical direction, the dummy nanosheet includes an insulating material;

a gate insulating layer along surfaces of the plurality of lower nanosheets, the separation layer, the plurality of upper nanosheets, and the dummy nanosheet;

a gate electrode on the active pattern and extending in a second horizontal direction, which is different from the first horizontal direction, the gate electrode surrounding the plurality of lower nanosheets, the separation layer, the plurality of upper nanosheets, and the dummy nanosheet; and a conductive layer between the gate electrode and the gate insulating layer, wherein the conductive layer is between the gate electrode and a top surface of the separation layer, between the gate electrode and each of a top surface and a bottom surface of the plurality of upper nanosheets, and between the gate electrode and a bottom surface of the dummy nanosheet, the conductive layer is not between the gate electrode and sidewalls in the second horizontal direction of the separation layer, between the gate electrode and sidewalls in the second horizontal direction of the plurality of upper nanosheets, between the gate electrode and each of a top surface and sidewalls in the second horizontal direction of the dummy nanosheet, between the gate electrode and a bottom surface of the separation layer, and between the gate electrode and the plurality of lower nanosheets, and a width, in the second horizontal direction, of the conductive layer is less than a width, in the second horizontal direction, of the plurality of upper nanosheets.

* * * * *